United States Patent
Balma et al.

(10) Patent No.: US 12,507,381 B2
(45) Date of Patent: Dec. 23, 2025

(54) PHOTONICS-BASED COOLING OF HEAT SOURCES

(71) Applicant: Maxwell Labs Inc., Saint Paul, MN (US)

(72) Inventors: Jacob A. Balma, Lino Lakes, MN (US); Alejandro Rodriguez-Wong, Princeton, NJ (US)

(73) Assignee: Maxwell Labs Inc., Saint Paul, MN (US)

( * ) Notice: Subject to any disclaimer, the term of this patent is extended or adjusted under 35 U.S.C. 154(b) by 0 days.

(21) Appl. No.: 19/215,037

(22) Filed: May 21, 2025

(65) Prior Publication Data

US 2025/0365900 A1    Nov. 27, 2025

Related U.S. Application Data

(60) Provisional application No. 63/783,448, filed on Apr. 4, 2025, provisional application No. 63/685,557, filed
(Continued)

(51) Int. Cl.
| | |
|---|---|
| H05K 7/00 | (2006.01) |
| F25B 23/00 | (2006.01) |
| H05K 7/20 | (2006.01) |

(52) U.S. Cl.
CPC ......... *H05K 7/20709* (2013.01); *F25B 23/00* (2013.01)

(58) Field of Classification Search
CPC ... H01S 3/0408; H05K 7/20709; F25B 23/00; F28F 13/18; F28F 2245/06; F28F 13/00
See application file for complete search history.

(56) References Cited

U.S. PATENT DOCUMENTS

| | | | | |
|---|---|---|---|---|
| 5,447,032 A | * | 9/1995 | Epstein | F25B 23/003 62/3.1 |
| 6,041,610 A | * | 3/2000 | Edwards | F25B 23/003 62/3.1 |

(Continued)

FOREIGN PATENT DOCUMENTS

| | | |
|---|---|---|
| KR | 10-2010-0039387 A | 4/2010 |
| KR | 10-2018-0126736 A | 11/2018 |

OTHER PUBLICATIONS

Cramer, Guy. Guy Cramer's LinkedIn Post. LinkedIn. Jun. 2025. 4 Pages [online], [retrieved on Jun. 29, 2025] Retrieved from the Internet <URL: https://www.linkedin.com/posts/guy-cramer-232a793a_laser-cooling-is-expected-to-yield-200-performance-activity-7338273935437742081-yGYx/?utm_source=shar%E2%80%A6>.
(Continued)

*Primary Examiner* — Travis Ruby
(74) *Attorney, Agent, or Firm* — Lee Sullivan Shea & Smith LLP

(57) ABSTRACT

A photonic cooling device for a heat source comprises a coupler and extractor layer. The coupler layer is configured to guide (i) first light into the extractor layer, (ii) second light into the extractor layer that is defined based on at least one heat-source characteristic to target a given region that corresponds to a hot spot region of the heat source, and (iii) third light away from the extractor layer, thereby cooling the heat source. The extractor layer comprises a fluorescent medium and is configured to (a) guide fourth light to the coupler layer responsive to the first light that is indicative of the at least one heat-source characteristic, (b) up-convert the second light via fluorescence at the given region of the extractor layer, and (c) based on the up-conversion, output the third light to the coupler layer, thereby extracting heat from the hot spot region of the heat source.

20 Claims, 27 Drawing Sheets

Related U.S. Application Data on Aug. 21, 2024, provisional application No. 63/650,148, filed on May 21, 2024.

(56) References Cited

U.S. PATENT DOCUMENTS

| | | | |
|---|---|---|---|
| 6,378,321 B1* | 4/2002 | Epstein | F25B 23/00 62/3.1 |
| 8,297,061 B2* | 10/2012 | Brandes | C09K 11/7771 62/3.1 |
| 8,636,406 B2 | 1/2014 | Hamann et al. | |
| 11,067,316 B2* | 7/2021 | Shenhav | F25B 23/003 |
| 11,199,343 B1* | 12/2021 | Chester | G02B 6/262 |
| 2004/0140298 A1* | 7/2004 | Widmann | H01L 21/67028 219/121.69 |
| 2014/0196868 A1* | 7/2014 | Clifford | F28D 20/026 165/53 |
| 2016/0141063 A1* | 5/2016 | Klennert | H01S 3/0408 62/3.1 |
| 2020/0059063 A1* | 2/2020 | Digonnet | H01S 3/06733 |
| 2020/0244038 A1* | 7/2020 | Osinski | H01S 5/347 |
| 2020/0395886 A1 | 12/2020 | Cramer | |
| 2021/0092335 A1 | 3/2021 | Cramer | |
| 2021/0172709 A1 | 6/2021 | Cramer | |
| 2022/0035078 A1 | 2/2022 | Cramer | |
| 2023/0024390 A1* | 1/2023 | Amalfi | H01L 23/34 |
| 2023/0200016 A1* | 6/2023 | Kreikemeier | F17C 3/085 62/49.1 |
| 2023/0221083 A1* | 7/2023 | Balma | F28F 3/02 165/185 |
| 2023/0274849 A1* | 8/2023 | Dragomir | G21K 1/067 |
| 2023/0337406 A1 | 10/2023 | Bawa et al. | |
| 2024/0183548 A1* | 6/2024 | Chen | F28F 13/18 |
| 2025/0020421 A1* | 1/2025 | Sutherland | F28F 13/00 |
| 2025/0129999 A1* | 4/2025 | Yu | F28F 13/18 |
| 2025/0172357 A1* | 5/2025 | Wiseman | B32B 27/08 |
| 2025/0189180 A1* | 6/2025 | Shenhav | H10F 77/334 |

OTHER PUBLICATIONS

Illustrated information—The Nobel Prize in Physics 1997. 6 Pages [online], [retrieved on Jul. 7, 2025] Retrieved from the Internet <URL: https://www.nobelprize.org/prizes/physics/1997/illustrated-information/#:~:text=Steven%20Chu%2C%20Claude%20Cohen%2DTannoudji%20and%20William%20D.&text=This%20year's%20Nobel%20Prize%20laureates, physical%20quantities%20with%20unprecedented%20precision>.

Physicists Cool Semiconductor by Laser Light. University of Copenhagen. Jan. 22, 2012. Pages [online], [retrieved on Jul. 7, 2025] Retrieved from the Internet <URL: https://phys.org/news/2012-01-physicists-cool-semiconductor-laser.html#google_vignette>.

Pei, Yu et al., "Low-Dimensional Heat Conduction in Surface Phonon Polariton Waveguide", Nature Communications, DOI: https://doi.org/10.1038/s41467-023-43736-8, Dec. 12, 2023, 8 pages.

Zhang, Jie et al., "Composition Design of High-Entropy Alloys with Deep Sets Learning", npj Computational Materials, DOI: https://doi.org/10.1038/s41524-022-00779-7, Apr. 28, 2022, 11 pages.

Sood, Aditya et al., "Bidirectional Phonon Emission in Two-Dimensional Heterostructures Triggered by Ultrafast Charge Transfer", Nature Nanotechnology, DOI: https://doi.org/10.1038/s41565-022-01253-7, Dec. 21, 2022, 10 pages.

Thompson, Dakotah et al., "Hundred-Fold Enhancement in Far-Field Radiative Heat Transfer Over the Blackbody Limit", Nature, vol. 216, DOI: https://doi.org/10.1038/s41586-018-0480-9, Sep. 13, 2018, 14 pages.

Divilov, Simon et al., "Disordered Enthalpy-Entropy Descriptor for High-Entropy Ceramics Discovery", Nature, vol. 625, Jan. 4, 2024, 19 pages.

Guo, Qiushi et al., "Hyperbolic Phonon-Polariton Electroluminescence in 2D Heterostructures", Nature, vol. 639, Mar. 27, 2025, 9 pages.

Kam, Amit et al., "Near-Field Photon Entanglement in Total Angular Momentum", Nature, DOI: https://doi.org/10.1038/s41586-025-08761-1, Apr. 2, 2025, 15 pages.

Shirakov, Avry et al., "Radiative and Non-Radiative Transitions of Excited Ti3+ Cations in Sapphire", Nature Research | Scientific Reports, DOI: https://doi.org/10.1038/s41598-019-55267-8, Dec. 11, 2019, 9 pages.

Lin, Shawn-Yu et al., "An In-situ and Direct Confirmation of Super-Planckian Thermal Radiation Emitted From a Metallic Photonic-Crystal at Optical Wavelengths", Nature Research | Scientific Reports, DOI: https://doi.org/10.1038/s41598-020-62063-2, Mar. 23, 2020, 7 pages.

Luan, Enxiao et al., "Towards a High-Density Photonic Tensor Core Enabled by Intensity-Modulated Microrings and Photonic Wire Bonding", Nature Portfolio | Scientific Reports, DOI: https://doi.org/10.1038/s41598-023-27724-y, Jan. 23, 2023, 17 pages.

Kumar, Dayanand et al., "Negative Photo Conductivity Triggered with Visible Light in Wide Bandgap Oxide-based Optoelectronic Crossbar Memristive Array for Photograph Sensing and Neuromorphic Computing Applications", npj | Unconventional Computing, DOI: https://doi.org/10.1038/s44335-024-00001-5, Jul. 25, 2024, 9 pages.

Schubert, Martin F. et al., "Inverse Design of Photonic Devices with Strict Foundry Fabrication Constraints", ACS Publications, DOI: https://doi.org/10.1021/acsphotonics.2c00313, Jun. 13, 2022, 10 pages.

Sheik-Bahae, Mansoor et al., "Laser Cooling of Solids", Laser & Photon. Rev. 3, No. 1-2, 67-84 (2009) / DOI 10.1002/lpor.200810038, Oct. 27, 2008, 18 pages.

Bhemarajam, J., "Spectroscopic and Optical Investigations on Er3+/Yb3+co-doped bismuth-boroleadlithium Glasses for Solid State Laser Applications", ElSevier | Optical Materials 122 (2021) 111657, DOI: https://doi.org/10.1016/j.optmat.2021.111657, Oct. 12, 2021, 10 pages.

Ibbotson, Lindsey A., "Optical Nano-Woodpiles: Large-Area Metallic Photonic Crystals and Metamaterials", Scientific Reports, DOI: 10.1038/srep08313, Feb. 9, 2015, 5 pages.

Hsieh, Mei-Li et al., "Super Planckian Thermal Radiation Emitted From a Nano-Filament of Photonic Crystal: A Direct Imaging Study", IEEE Photonics Journal, vol. 11, No. 6, DOI: 10.1109/JPHOT.2019.2948995, Dec. 2019, 9 pages.

Streit, Huayna Cerqueira et al., "Surface-Anchored MOF-Based Photonic Antennae", ChemPhysChem Articles, DOI: DOI: 10.1002/cphc.201200262, Jun. 14, 2012, 4 pages.

Paci, G. et al. "Exploring "Temperature-Aware" Design in Low-Power MPSoCs", International Journal of Embedded Systems, vol. 3, DOI: https://doi.org/10.1504/IJES.2007.016032, Dec. 3, 2007, 6 pages.

Ballato, John et al., "The Uniqueness of glass for Passive Thermal Management for Optical Fibers", Applied Glass Science, DOI: 10.1111/ijag.16543, Oct. 26, 2021, 14 pages.

Purohit, Suresh et al., "The Absorption Spectra of Some Lanthanide (III) Ions", Research and Reviews: Journal of Chemistry, vol. 2, Issue 2, Apr. 15, 2013, 3 pages.

Schmidt-Zweifel, Andrea Caroline, "Theoretical and Experimental Studies of the Emission of Electromagnetic Radiation by Superluminal Polarization Currents", UNM Digital Repository, Dec. 4, 2020, 332 pages.

Sha, Shi, "The Thermal-Constrained Real-Time Systems Design on Multi-Core Platforms—An Analytical Approach", FIU Digital Commons, DOI: 10.25148/etd.FIDC004089. Mar. 21, 2018, 154 pages.

Maniscalco, B et al., "Thin Film Thickness Measurements Using Scanning White Light Interferometry", Thin Solid Films, vol. 550, 2024, 8 pages.

Liu, Zuyang et al., "Comparison of Lumerical FDTD and Tidy3D for Three-Dimensional FDTD Simulations of Passive Silicon Photonic Components", Jun. 20, 2025, 17 pages.

Topper, Brian et al.," Optical Cooling of a Large Core Diameter Yb:SiO2 Fiber to 18K Below Ambient Temperature: A New World Record", The University of New Mexico [Poster], 2021, 1 page.

Gonzalez, Antonio et al., "Trends in Processor Architecture", 2018, 18 pages.

Kumar, Vijay et al., "Upconversion Nanoparticles (UCNPs) for Functional Applications", vol. 24, Springer, 2023, 495 pages.

(56) References Cited

OTHER PUBLICATIONS

Kozawa, Daichi et al., "Intrinsic Process for Upconversion Photoluminescence via K-Momentum-Phonon Coupling in Carbon Nanotubes", Physical Review B 110, DOI: 10.1103/PhysRevB.110.155418, Oct. 10, 2024, 8 pages.

Luan, Enxiao, et al., "Towards A High-Density Photonic Tensor Core Enabled by Intensity-Modulated Microrings and Photonic Wire Bonding", Nature; Scientific Reports, 2023, 17 pages.

Mohajan, Jewel, et al., "Fundamental Limits On Radiative x(2) Second Harmonic Generation", vol. 31, No. 26, Optics Express, Dec. 18, 2023, 12 pages.

Pokryshkin, Nikolay S., et al., "Anti-Stokes Photoluminescence in Halide Perovskite Nanocrystals: From Understanding the Mechanism Towards Application in Fully Solid-State Optical Cooling", MDPI, Nanomaterials, Jun. 9, 2023, pp. 1-19.

Openai, et al., " GPT-4 Technical Report", Mar. 4, 2024, pp. 1-100.

Stich, Simon, et al., "Inverse Design of an All-Dielectric Nonlinear Polaritonic Metasurface", pp. 1-21.

Topper, Brian, et al., " Laser Cooling Ytterbium Doped Silica by 67 K from Ambient Temperature", vol. 32, No. 3, Jan. 19, 2024, Optics Express, pp. 3660-3672.

Wang, Xiao, et al., "Integrated Photonic Encoder for Low Power and High-Speed Image Processing", Nature Communications, May 27, 2024, pp. 1-13.

Zhu, Zheyuan, et al., "A Mode-Multiplexed Photonic Integrated Vector Dot-Product Core From Inverse Design", Feb. 9, 2024, 13 pages.

Hehlen, Markus P., "Review of Condensed Matter Laser Cooling Using Electric-Dipole-Allowed Transitions", Journal of Luminescence, vol. 252, 2022, 15 pages.

Demirbas, Umit, "Cr: Colquiriite Lasers: Current Status and Challenges for Further Progress", Progress in Quantum Electronics, vol. 68, 2019, 53 pages.

Fan, Shanhui, "Thermal Photonics and Energy Applications", Joule, vol. 1, Oct. 11, 2017, pp. 264-273.

Gonzalez, Ricardo, et al., " Supply and Threshold Voltage Scaling for Low Power Cmos", IEEE Journal of Solid State Circuits, vol. 32, No. 4, 1997, pp. 1210-1216.

Jung, Seung-Ho, et al., "Short Circuit Power Estimation of Static CMOS Circuits", 5 pages.

Feofilov, S. P., et al., "Anti-Stokes Fluorescence of Cr3+ ions Doped Crystals Excited in One-phonon Vibronic Sidebands", vol. 94, Optical Materials, 2019, pp. 231-236.

Los Alamos National Laboratory, Lightslingers A Unique Type of Directional Broadband Antenna, National Nuclear Security Administration, May 17, 2022, 2 pages.

Kerim, F.M. Abdel, et al., "Infrared Absorption Spectra of Some Lanthanide Acetylacetonate Complexes", Proc. Indian Acad. Sci., vol. 85 A, No. 6, 1977, pp. 559-566.

Nemova, Galina, "Laser Cooling of Solids", 2009, 26 pages.

Mesina, Ricardo, et al., " Hyperbolic Waveguide for Long-Distance Transport of Near-Field Heat Fux", Jun. 16, 2016, pp. 1-10.

Rostami, Saeid, et al., "Observation of Optical Refrigeration in a Holmium-doped Crystal", Nov. 14, 2018, pp. 1-14.

Desutter, John, et al., " A Near-Field Radiative Heat Transfer Device", Nov. 15, 2028, 45 pages.

Mobini, Esmaeil, et al., "Laser Cooling of Silica Glass", Oct. 23, 2019, 9 pages.

Cui, Z.-F., et al., "Effective Charge from Lattice QCD", Dec. 17, 2019, pp. 1-10.

Kim, Nam Sung, et al., "Leakage Current: Moore's Law Meets Static Power", Computer, vol. 36, IEEE, Dec. 31, 2003, pp. 68-75.

IEEE, "International Roadmap for Devices and Systems Applications Benchmarking", 2023, 51 pages.

IEEE, "International Roadmap for Devices and Systems Beyond CMOS", 2023, 131 pages.

IEEE, "International Roadmap for Devices and Systems Factory Integration", 2023, 77 pages.

IEEE, "International Roadmap for Devices and Systems Lithography & Patterning", 2023, 17 pages.

Ebrahimi, Manuchehr, et al., "Laser Cooling of Germanium Semiconductor Nanocrystals", 2021, pp. 1-17.

Asheichyk, Kiryl, et al., "Long-Range Super-Planckian Heat Transfer Between Nanoemitters in a Resonant Cavity", Aug. 28, 2023, pp. 1-6.

Amaolo, Alessio, et al., "Can photonic heterostructures provably outperform single-material geometries?", Jul. 26, 2023, 12 pages.

Zhang, Zhuoming, et al., "Experimental Minimum of Condensed-Phase Optical Refrigeration", Aug. 6, 2024, pp. 1-9.

Salkeld, Alexander J., et al., "Prospects for Rapid Laser Cooling on ED-SAllowed Transitions", SPIE, vol. 10936, 2019, 8 pages.

Chapuis, Pierre-Oliver, et al., "Thermal Radiation at the Nanoscale and Applications", Applied Physics Letters, AIP Publishing, Nov. 30, 2023, 7 pages.

Feldman, Matthew A., et al., "Colossal Photon Bunching Driven by Phonon Recombination Dynamics", 2018, 2 pages.

Tanaka, Hiroki, et al., "Monte Carlo Fluorescence Ray Tracing Simulation for Laser Cooling of Solids: Supplement", Optics Express, Optica Publishing Group, Jan. 9, 2024, 6 pages.

Cerqueira, M.F., et al., "Visible and Infrared Photoluminescence from Erbium-Doped Silicon Nanocrystals Produced by Rf Sputtering", 2007, 11 pages.

Sarakovskis, Anatolijs, et al., "Up-Conversion Process in Erbium Doped Lithium Fluoride Bulk Crystal, Lithium Borate Glass and Glass Ceramics", Journal of Physics: Conference Series 93, 2007, 7 pages.

Ma, Yingjin, et al., "Preparation, Growth Mechanism and Upconversion and Near Infrared Photoluminescence Properties of Convex-Lens like NaYF4 Microcrystals Doped with Various Rare Earth Ions Excited at 808 nm", Crystal Growth & Design, Feb. 1, 2018, 30 pages.

Fiorino, Anthony, et al., "Giant Enhancement in Radiative Heat Transfer in Sub-30 nm Gaps of Plane Parallel Surfaces", Nano Letters, ACS Publications, Apr. 27, 2018, 20 pages.

Su, Liap Tat, et al., "Photon Upconversion in Hetero-Nanostructured Photoanodes for Enhanced Near-Infrared Light Harvesting", Advanced Materials, 2013, 5 pages.

Silva, Junior Reis, et al., "Observation of Laser Cooling on an Electric-Dipole-Allowed Transition in Cr3+:LiSAF Crystal", Advanced Optical Materials, 2025, 7 pages.

Sheik-Bahae, M et al., "Advances in Laser Cooling of Semiconductors", Proceedings of SPIE: The International Society for Optical Engineering, 2006, 14 pages.

Zhang, Runjie, "Pre-RTL On-Chip Power Delivery Modeling and Analysis", Dept. of Computer Engineering, University of Virginia, May 2015, 148 pages.

Berneschi, Simone, et al., "Towards a Glass New World: The Role of Ion-Exchange in Modern Technology", Applied Sciences, May 18, 2021, 34 pages.

Nemova, Galina, "Laser Cooling and Trapping of Rare-Earth-Doped Particles". Applied Sciences, April, 8, 2022, 15 pages.

Aebischer, Annina, et al., "Intrinsic Quantum Yields and Radiative Lifetimes of Lanthanide Tris (dipicolinates)", Physical Chemistry Chemical Physics, 2009, pp. 1346-1353.

Pastawski, Horacio M., "Classical and Quantum Transport from Generalized Landauer-Buttiker Equations", The American Physical Society, vol. 44, No. 12, Sep. 15, 1991, pp. 6329-6339.

ROHM Co., Ltd., "Basics of Thermal Resistance and Heat Dissipation", ROHM Semiconductor, 2021, 6 pages.

Biehs, S. A., "Near-Field Radiative Heat Transfer in Many-Body Systems", Reviews of Modern Physics, vol. 93, 2021, 51 pages.

Amiraski, Maziar, et al., "Boreas: A Cost-Effective Mitigation Method for Advanced Hotspots Using Machine Learning and Hardware Telemetry", IEEE International Symposium on Performance Analysis of Systems and Sofware, 2023, pp. 295-305.

Bunzli, Jean-Claude G., "Lanthanide Luminescence: From a Mystery to Rationalization, Understanding, and Applications", Handbook on the Physics and Chemistry of Rare Earths, 2016, 30 pages.

Yao, Y et al., "Enhancing Up-Conversion Luminescence of Er3+/Yb3+-codoped Glass by Two-Color Laser Field Excitation", RSC Advances, Dec. 18, 2015, 25 pages.

Zhu, Xingjun, et al., "Anti-Stokes Shift Luminescent Materials for Bio-Applications", Chem Soc Rev, Dec. 14, 2026, 16 pages.

(56) References Cited

OTHER PUBLICATIONS

IEEE Electronics Packaging Society, "Chapter 2: High Performance Computing and Data Centers", Heterogeneous Integration Roadmap, 2021, 47 pages.
IEEE Electronics Packaging Society,"Chapter 9: Integrated Photonics", Heterogeneous Integration Roadmap, 2023, 28 pages.
IEEE Electronics Packaging Society, "Chapter 10: Integrated Power Electronics", Heterogeneous Integration Roadmap, 2023, 100 pages.
IEEE Electronics Packaging Society, "Chapter 20: Thermal", Heterogenenous Integration Roadmap, 2023, 39 pages.
Crump, Paul, et al., "85% Power Conversion Efficiency 975-nm Broad Area Diode Lasers at - 50, 76 % at 10", IEEE, 2006, 2 pages.
Li, Zhihua, et al., "Synthesis Protocols for o-Doped NaYF4:Yb, Er", Chemistry of Materials, vol. 26, 2014, pp. 1770-1778.
Sun, Yifan, et al., "Summarizing CPU and GPU Design Trends with Product Data", Jul. 13, 2020, 5 pages.
Gai, Shili, et al., "Recent Progress in Rare Earth Micro/Nanocrystals: Soft Chemical Synthesis, Luminescent Properties, and Biomedical Applications", Chemical Reviews, 2013, 47 pages.
Eckert, Hagen, et al., "A Formula to Predict the Synthesizability of High-Entropy Materials", Nature, 2024, 2 pages.
Kanduri, Anil, et al., "A Perspective on Dark Silicon", The Dark Side of Silicon, 2017, 19 pages.
Ofori-Attah, Emmannuel, et al., "A Survey of System Level Power Management Schemes in the Dark-Silicon Era for Many-Core Architectures". EAI Endorsed Transactions on Industrial Networks and Intelligent Systems, Aug. 19, 2018, 17 pages.
Yahya, Jawad Haj, et al., "DarkGates: A Hybrid Power-Gating Architecture to Mitigate the Performance Impact of Dark-Silicon in High Performance Processors", IEEE International Symposium on High-Performance Computer Architecture, 2022, 14 pages.
Lee, C. P., et al., "Dual-wavelength Bragg Reflectors Using GaAs/AlAs Multilayers". Electronics Letters, vol. 29, No. 22, Oct. 28, 1993, pp. 1980-1981.
Cajzl, Jakub, et al., " Erbium lon Implantation Into Diamond - Measurement and Modelling of the Crystal Structure". Physical Chemistry Chemical Physics, 2017, pp. 6233-6245.
Yue, Anna, et al., "EVeREST-C: An Effective and Versatile Runtime Energy Saving Tool for CPUs", ACM, 2025, 14 pages.
Yue, Anna, et al., "EVeREST: An Effective and Versatile Runtime Energy Saving Tool for GPUs", ACM, 2025, 13 pages.
Wang, Boxiang, et al., "Micro/Nanostructures for Far-Field Thermal Emission Control: An Overview", ES Enrgy & environment, 2019, pp. 18-38.
Mehta, Sanyam, et al., "Forward to the Past: An Alternative to Hybrid CPU Design", IEEE Ispass, 2024, 14 pages.
Gallina, Mark, "Implications of Power Density on Chip Design", Intel, 16 pages.
Luca, Jacques, et al., "Glasses to See Beyond Visible", Compte Rendus Chimie, 2018, pp. 916-922.
Han, Zitong, "The Power-Delay Product and it's Implication to CMOS Inverter", Journal of Physics: Conference Series, 2021, 12 pages.
Vasileska, Dragica, et al., "Heating Effects in Nanoscale Devices", Cutting Edge Nanotechnology, 2010, pp. 33-60.
Hankin, Alexander et al., "HotGauge: A Methodology for Characterizing Advanced Hotspots in Modern and Next Generation Processors", IEEE International Symposium on Workload Characterization (IISWC), 2021, 13 pages.
Stewart, Graeme A et al., "How to Review 4 Million Lines of ATLAS Code", Journal of Physics: Conference Series 898 072013, 2017, DOI: 10.1088/1742-6596/898/7/072013, 8 pages.
Fagas, Giorgos, et al., "Energy Challengers for Ict", Ict Energy Concepts for Energy Efficiency and Sustainability, 2017, 37 pages.
Vazquez-Lozano, J. Enrique., et al., "Incandescent Temporal Metamaterials", Nature Communications, 2023, 11 pages.
Zheng, Nan, et al., "Infrared Absorption of Laser Patterned Sapphire Al2O3 for Radiative Cooling", Micromachines, 2025, 17 pages.
Dagupati, Rajesh, et al., "Er3+/Yb3+ Co- Doped Oxyfluoro Tellurite Glasses: Analysis of Optical Temperature Sensing Based on Up-Conversion Luminescence", International Journal of Applied Glass Science, 2021, pp. 462-471.
Huang, Wei, et al., "Interaction of Scaling Trends in Processor Architecture and Cooling", IEEE Semiconductor Thermal Measurement and Management Symposium, 2010, 8 pages.
Molesky, Sean, et al., "Inverse Design in Nanophotonics", Nature Photonics, vol. 12, 2018, pp. 659-670.
Townsend, P. D., "Development of lon Implantation for Optical Applications", Vacuum, vol. 51, No. 2, 1998, pp. 301-304.
Esmaeilzadeh, Hadi, et al., "Dark Silicon and the End of Multicore Scaling", IEEE 38th International Symposium on Computer Architecture (ISCA '11), 2011, 12 pages.
Volpi, A., et al., "Anti-Stokes Cooling of Yb-Doped KYF4 Single Crystals", Journal of Luminescence, 2018, 11 pages.
Dong, Hao, et al., "Upconversion Emission Studies of Single Particles", Nano Today, vol. 35, 2020, 23 pages.
Feofilov, S. P., et al., "On the Possibility of Laser Cooling of Cr3+ lons Doped Crystals", Optical Materials, vol. 75, 2017, pp. 554-560.
Feofilov, S.P., et al., "Anti-Stokes Fluorescence of Cr3+ Ions Doped Crystals Excited in One-Phonon Vibronic Sidebands", Optical Materials, vol. 94, 2019, pp. 231-236.
Chengelis, Demetra A., et al., "Incorporating Lanthanide Cations with Cadmium Selenide Nanocrystals: A Strategy to Sensitize and Protect Tb(III)", J. Am. Chem. Soc., 2005, pp. 16752-16753.
Jablonka, Kevin Maik, et al., "Making Molecules Vibrate: Interactive Web Environment for the Teaching of Infrared Spectroscopy", Journal of Chemical Education, vol. 99, 2022, pp. 561-569.
Kuriki, Ken, et al., "Spectroscopic Properties of Lanthanide Chelates in Perfluorinated Plastics for Optical Applications", Journal of Optical Society of America, vol. 19, 2002, pp. 1844-1848.
Dally, Bill, "DL Efficiency Through Technology: Hardware-Software Interactions", [PowerPoint Slides] Nasem Ai Workshop, NVIDIA Corporation, Nov. 13, 2024, 22 pages.
Andre, Laura B., "Optical Refrigeration of Crystals Doped with Yb3+ and Ti3+ IOns", 2022, 136 pages.
Chen, Guorong, "Preparation, Properties and Applications of Chalcogenide Glasses", [PowerPoint Slides] School of Materials Science and Engineering East China University of Science and Technology, 60 pages.
Leng, Jingwen, et al.," GPUVolt: Modeling and Characterizing Voltage Noise in GPU Architectures", IEEE/Acm Islped' 14, 2014, 6 pages.
Vertiv Group Corp., "Coolant Distribution Unit (CDU) - XDU 1350", 2021, 4 pages.
Lin, Wu-Xi, et al., "Anti-Stokes excitation of optically active point defects in semiconductor materials", Materials for Quantum Technology, vol. 2, 2022, 26 pages.
Dong, Chun-Hua, et al., "Low-Threshold Microlaser in Er: Yb Phosphate Glass Coated Microsphere", IEEE Photonics Technology Letters, vol. 20, No. 5, 2008, 3 pages.
Melgaard, Seth, et al., "Identification of Parasitic Losses in Yb:YLF and Prospects for Optical Refrigeration Down to 80K", Optics Express, vol. 22, No. 7, 2014, pp. 7756-7764.
Drummond, Kevin P et al., "Characterization of Hierarchical Manifold Microchannel Heat Sink Arrays Under Simultaneous Background and Hotspot Heating Conditions", International Journal of Heat and Mass Transfer, vol. 126, Part A, Nov. 2018, 53 pages.
Wulf, Ulrich, "A One-Dimensional Effective Model for Nanotransistors in Landauer-Buttiker Formalism", Micromachines 2020, 11, 359; doi: 10.3390/mi11040359, Mar. 30, 2020, 25 pages.
Bolek, Paulina et al., "Mixing Phosphors to Improve the Temperature Measuring Quality", El Sevier: Optical Materials 122, Oct. 20, 2021, 7 pages.
Soares Mendes, Francisco, "Exploiting Non-Conventional DVFS on GPUs: Application to Deep Learning", Tecnico Lisboa, Oct. 2020, 118 pages.
Venkatesan, Vivek, "Quantifying the Impact of Interblock Wire-Delays on Processor Performance", Thesis submitted to the faculty of The University of Utah, May 2008, 72 pages.
Vasileska, Dragica et al., "Heating Effects in Nanoscale Devices", InTech, May 22, 2014, 29 pages.
Bernardi, Michael P et al., "Radiative Heat Transfer Exceeding the Blackbody Limit Between Macroscale Planar Surfaces Separated by

(56) References Cited

OTHER PUBLICATIONS a Nanosize Vacuum Gap", Nature Communications, DOI: 10.1038/ncomms 12900, Sep. 29, 2016, 7 pages.
Asahi, Shigeo et al. "Two-Step Photon Up-Conversion Solar Cells", Nature Communications, DOI: 10.1038/ ncomms14962, Apr. 6, 2017, 9 pages.
Anufriev, Roman et al., "Heat Guiding and Focusing Using Ballistic Phonon Transport in Phononic Nanostructures", Nature Communication, DOI: 10.1038/ncomms 15505, May 18, 2017, 8 pages.
Khandekar, Chinmay et al., "Near-Field Refrigeration and Tunable Heat Exchange Through Four-Wave Mixing," AIP Advances 8, May 25, 2018, 9 pages, Available online <https://doi.org/10.1063/1.5018734>.
Roman, Benjamin J et al., "Optically Cooling Cesium Lead Tribromide Nanocrystals", Nano Letters, Nov. 1, 2020, 11 pages.
Assali, S. et al., "Direct Band Gap Wurtzite Gallium Phosphide Nanowires", Nano Letters, Mar. 6, 2013, 5 pages.
Hehlen, Markus P. et al., "First Demonstration of an All-Solid-State Optical Cryocooler", Light: Science & Applications, DOI: https://doi.org/10.1038/s41377-018-0028-7, Jun. 6, 2018, 10 pages.
Nvidia H100 Tensor Core GPU Architecture | Exceptional Performance, Scalability, and Security for the Data Center, Nvidia, Mar. 2022, 77 pages.
Latella, Ivan et al., Smart Thermal Management with Near-Field Thermal Radiation [Invited], Optics Express, vol. 29, No. 16, Aug. 2, 2021, 18 pages.
Tanaka, Hiroki et al., "Monte Carlo Fluorescence Ray Tracing Simulation for Laser Cooling of Solids", Optics Express, vol. 32, No. 2, Jan. 15, 2024, 15 pages.
Topper, Brian et al., "Laser Cooling Ytterbium Doped Silica by 67 K from Ambient Temperature", Optics Express, vol. 32, No. 3, Jan. 29, 2024, 13 pages.
Silva, J.R. et al., "Mode-Mismatched Dual-Beam Method to Evaluate Thermal and Electronic Laser-Induced Lensing Effects in Cr3+- and Yb3+-doped Crystals", Optics Letters, DOI: https://doi.org/10.1364/OL.510945, Dec. 12, 2023, 6 pages.
Puschel, Stefan et al., "Impact of Ho3+, Er3+, and Tm3+ on Laser Cooling of Yb:YLF", Optical Materials Express, vol. 14, No. 10, Oct. 1, 2024, 15 pages.
Zhang, Wei et al., "Optical Properties of the Yb/Er Co-Doped Silica Glass Prepared by Laser Sintering Technology", Optical Materials Express, vol. 7, No. 5, May 1, 2017, 8 pages.
Pallikara, Ioanna et al., "The Physical Significance of Imaginary Phonon Modes in Crystals", Electronic Structure, DOI: https://doi.org/10.1088/2516-1075/ac78b3, Jul. 20, 2022, 20 pages.
Fafard, Simon et al., "67.5% Efficient InP-Based Laser Power Converters at 1470 nm at 77 K", Photonics 2024, 11, 130, DOI: https://doi.org/10.3390/photonics11020130, Jan. 30, 2024, 11 pages.
Pierret, Aurélie et al., "Anti-Stokes Photoluminescence of Monolayer WS2", Physica Status Solidi B 2019, 256, DOI: https://doi.org/10.1002/pssb.201900419, Oct. 9, 2019, 5 pages.
Chao, Pengning et al., "Physical Limits in Electromagnetism", Nature Reviews | Physics, vol. 4, DOI: https://doi. org/10.1038/s42254-022-00468- w, Aug. 2022, 17 pages.
Lin, Zin et al., "Topology-Optimized Multilayered Metaoptics", Physical Review Applied 9, 044030 (2018), DOI: 10.1103/PhysRevApplied.9.044030, Apr. 20, 2018, 6 pages.
Singleton, John et al., "Information Carried by Electromagnetic Radiation Launched from Accelerated Polarization Currents", Physical Review Applied 14, 064046 (2020), DOI: 10.1103/PhysRevApplied. 14.064046, Dec. 15, 2020, 11 pages.
Kan, Y.H. et al., "Near-Field Radiative Heat Transfer in Three-Body Systems with Periodic Structures", Physical Review B 99, 035433 (2019), DOI: 10.1103/PhysRevB.99.035433, Jan. 24, 2019, 8 pages.
Molesky, Sean et al., "Fundamental Limits to Radiative Heat Transfer: Theory", Physical Review B 101, 035408 (2020), DOI: 10.1103/PhysRevB. 101.035408, Jan. 9, 2020, 12 pages.
Dyakonov, Michael et al., "Shallow Water Analogy for a Ballistic Field Effect Transistor: New Mechanism of Plasma Wave Generation by de Current", Physical Review Letters, vol. 71, No. 15, Oct. 11, 1993, 5 pages.
Fernandez, Joaquin et al., "Anti-Stokes Laser Cooling in Bulk Erbium-Doped Materials", Physical Review Letters 97, 033001 (2006), DOI: 10.1103/PhysRevLett.97.033001, Jul. 21, 2006, 4 pages.
Groot-Berning, Karin et al., "Deterministic Single-Ion Implantation of Rare-Earth Ions for Nanometer-Resolution Color-Center Generation", Physical Review Letters 123, 106802 (2019), DOI: 10.1103/PhysRevLett. 123.106802, Sep. 4, 2019, 6 pages.
Humphries, Ben S., "Phonon Signatures in Photon Correlations", Physical Review Letters 131, 143601 (2023), DOI: 10.1103/PhysRevLett. 131.143601, Oct. 2, 2023, 7 pages.
Pieper, Henrik et al., "Method of Linear Approximation of COP for Heat Pumps and Chillers based on Thermodynamic Modelling and Off-Design Operation", ElSevier | Energy 230 (2021) 120743, DOI: https://doi.org/10.1016/j.energy.2021.120743, May 5, 2021, 15 pages.
Zhang, Jinwei et al., "Accurate Power Density Map Estimation for Commercial Multi-Core Microprocessors", Proceedings of the 23rd Conference on Design, Automation and Test in Europe, Jun. 26, 2020, 6 pages.
Esmaeilzadeh, Hadi et al., "Power Limitations and Dark Silicon Challenge the Future of Multicore", Article in ACM Transactions on Computer Systems, 30, 3, Article 11, DOI: 10.1145/2324876.2324879, Aug. 2012, 28 pages.
Esmaeilzadeh, Hadi et al., "Power Limitations and Dark Silicon Challenge the Future of Multicore", Article in ACM Transactions on Computer Systems, 30, 3, Article 11, DOI = 10.1145/2324876.2324879 http://doi.acm.org/10.1145/2324876.2324879, Aug. 2012, 28 pages.
Zhang, Zhuoming et al., "Principles for Demonstrating Condensed Phase Optical Refrigeration", Nature Reviews Physics, vol. 7, Mar. 2025, pp. 149-153.
Giannini, Nathan et al., "Near-Unity External Quantum Efficiency in GaAs|AlGaAs Heterostructures Grown by Molecular Beam Epitaxy", Physica Status Solidi RRL 2021, 2100106, DOI: 10.1002/pssr.202100106, Aug. 2007, 6 pages.
Zheng, Chunqi et al., "Enabling Active Nanotechnologies by Phase Transition: From Electronics, Photonics to Thermotics", Chemical Reviews, 2022, 122, DOI: https://doi.org/10.1021/acs.chemrev.2c00171. Pages 15450-15500.
Qpedia, Localized Cooling—Using Cold Plates, Jun. 2010, 4 pages.
Zhao, Bin et al., "Radiative Cooling: A Review of Fundamentals, Materials, Applications, and Prospects", ElSevier—Applied Energy 236 (2019), DOI: https://doi.org/10.1016/j.apenergy.2018.12.018, Dec. 4, 2018, pp. 489-513.
Shalf, John, "The Future of Computing Beyond Moore's Law", Article in Philosophical Transactions A, DOI: 10.1098/rsta.2019.0061, Jan. 2020, 16 pages.
Iftikhar, K., "Hypersensitivity in the 4f-4f Absorption Spectra of Lanthanide(III) Complexes", Inorganica Chimica Acta, Oct. 2, 1986, pp. 261-264.
Zhang, Yong, "Topical Collection Upconversion Fluorescent Nanomaterials for Biodetection and Bioimaging" Microchimica Acta, Dec. 14, 2022, 2 pages.
Frigenti, Gabriele et al., "Rare Earth-Doped Glass Whispering Gallery Mode Micro-Lasers", The European Physical Journal Plus, DOI: https://doi.org/10.1140/epjp/s13360-023-04275-9, Jul. 12, 2023, 20 pages.
Zhang, Shubin et al., "Progress in Laser Cooling Semiconductor Nanocrystals and Nanostructures", NPG Asia Materials, DOI: https://doi.org/10.1038/s41427-019-0156-4, Oct. 11, 2019, 19 pages.
Mergenthaler, K. et al., "Anti-Stokes Photoluminescence Probing K-Conservation and Thermalization of Minority Carriers in Degenerately Doped Semiconductors", Nature Communications, DOI: 10.1038/s41467-017-01817-5, Nov. 21, 2017, 6 pages.
Arbabi, Ehsan et al., "MEMS-Tunable Dielectric Metasurface Lens", Nature Communications, DOI: 10.1038/ s41467-018-03155-6, Feb. 23, 2018, 9 pages.

(56) References Cited

OTHER PUBLICATIONS

Yang, Likai et al., "Controlling Single Rare Earth Ion Emission in an Electro-Optical Nanocavity", Nature Communications, DOI: https://doi.org/10.1038/s41467-023-37513-w, Mar. 28, 2023, 6 pages.

Vázquez-Lozano, J. Enrique et al., "Incandescent Temporal Metamaterials", Natures Communications, DOI: https://doi.org/10.1038/s41467-023-40281-2, Aug. 1, 2023, 11 pages.

Johnson, E.O., "Physical Limitations On Frequency And Power Parameters of Transistors", 1958, 1958 IRE International Convention Record, pp. 27-34.

Gan, et al., Photonic Glasses, 2006, World Scientific Publishing Co. Pte. Ltd., 460 pages.

Khurgin, Jacob B., "Band Gap Engineering For Laser Cooling of Semiconductors", Sep. 8, 2014, Journal of Applied Physics, 7 pages.

Paci, et al., "Exploring Temperature-Aware Design in Low-Power MPSoCs", 2006, Proceedings of the Design Automation & Test in Europe Conference, 6 pages.

Highland, M., et al., "Ballistic-Phonon Heat Conduction At The Nanoscale As Revealed by Time-Resolved X-Ray Diffraction and Time-Domain Thermoreflectance", The American Physical Society, 2007, 7 pages.

Huang, Wei, et al., "HotSpot: A Compact Thermal Modeling Methodology for Early-Stage VLSI Design", IEEE Transactions on Very Large Scale Integration (VLSI) Systems, vol. 14, No. 5, May 2006, pp. 501-513.

Sarakovskis, Anatolijs, et al., "Up-Conversion Process in Erbium Doped Lithium Fluoride Bulk Crystal, Lithium Borate Glass and Glass Ceramics", retrieved from the internet: iopscience.iop.org, May 26, 2014, Journal of Physics: Conference Series, vol. 93, 2007, 7 pages.

Joannopoulos, John. D., et al., Photonic Crystals, Second Edition, Princeton University Press, 2008, 6 pages.

Scheel, Stefan, "Sum Rule for Local Densities of States in Absorbing Dielectrics", The American Physical Society, Physical Review A 78, 2008, 4 pages.

Venkatesan, Vivek, "Quantifying the Impact of Interblock Wire-Delays on Processor Performance", School of Computing The University of Utah, 2008, 72 pages.

Vasileska, Dragica, et al., "Heating Effects in Nanoscale Devices", Cutting Edge Nanotechnology, IntechOpen, Chapter 3, pp. 32-60(?).

Esmaeilzadeh, Hadi, et al., "Dark Silicon and the End of Multicore Scaling", ISCA '11, Association for Computer Machinery, 2011, pp. 365-376.

Novotny, Lukas, et al., Principles of Nano-Optics, Second Edition, Cambridge University Press, 2012, 584 pages.

Liang, Xiangdong, et al., "Formulation for Scalable Optimization of Microcavities Via the Frequency-Averaged Local Density of States", Optical Society of America, 2013, 30 pages.

Aspelmeyer, Markus, et al., "Cavity Optomechanics", Reviews of Modern Physics, vol. 86, 2014, pp. 1391-1452.

Chen. Yin-Chung, et al., "Raman Cooling of Solids Through Photonic Density of States Engineering", Optical Society of America, vol. 2, No. 10, 2015, pp. 893-899.

Bertsekas, Dimitri P., Nonlinear Programming, Second Edition, Massachusetts Institute of Technology, 1999, 372 pages.

Sheik-Bahae, Mansoor, et al., "Laser Cooling of Solids", Laser and Photonics Rev. 3, No. 1-2, 2008, pp. 67-84.

Fagas, Giorgos, et al., "Energy Challenges for ICT", ICT—Energy Concepts for Energy Efficiency an Sustainability, retrieved from internet: http://dx.doi.org/10.5772/66678, IntechOpen, 2017, pp. 1-36.

Jin, Weiliang, et al., "Overcoming Limits to Near-Field Radiative Heat Transfer in Uniform Planar Media Through Multiplayer Optimization", Optical Society of America, 2017, 1-9 pages.

Jin, Weiliang, et al., "Overcoming Limits to Near-Field Radiative Heat Transfer in Uniform Planar Media Through Multilayer Optimization", vol. 25, No. 13, Optical Society of America, 2017, 14 pages.

Kanduri, Anil, "A Perspective on Dark Silicon", Springer International Publishing Switzerland, 2017, pp. 3-20.

Su, Logan, et al., "Inverse Design and Demonstration of a Compact On-Chip Narrowband Three-Channel Wavelength Demultiplexer", ACS Phonotics, American Chemical Society, Nov. 17, 2017, 16 pages.

Alom, Md Zahangir, et al., "The History Began from AlexNet: A Comprehensive Survery on Deep Learning Approaches", 2018,.

Khandekar, Chinmay, et al., "Near-Field Refrigeration and Tunable Heat Exchange Through Four-Wave Mixing", AIP Advances, May 25, 2018, 9 pages.

Molesky, Sean, et al., "Inverse Design in Nanophotonics", Nature Photonics, vol. 12, pp. 659-670.

Kandiah, Vijay, "Uncovering Latent Hardware/Software Parallelism", Northwestern University Computer Science Department, Technical Report, Nov. 2023, 163 pages.

Advanced Micro Devices, Inc., "Understanding Power Management and Processor Performance Determinism", AMD Embedded Solutions, 2018, 11 pages.

Wang, Fengwen, et al., "Maximizing the Quality Factor to Mode vol. Ration for Ultra-Small Photonic Crystal Cavities", Applied Physics Letters, vol. 113, 2018, 6 pages.

Mobini, Esmaeil, et al., "Spectroscopic Investigation of Yb-Doped Silica Glass for Solid-State Optical Refrigeration", Jan. 31, 2019, American Physical Society, 7 pages.

Vose, Aaron, et al., "Recombinationnn of Artificial Neural Networks", Jan. 15, 2019, pp. 1-13.

Vose, Aaron, et al., "PharML. Bind: Pharmacologic Machine Learning for Protein-Ligand Interactions", Nov. 15, 2019, pp. 1-8.

Balli, F., "A Hybrid Achromatic Metalens", Nature Communications, 2020, pp. 1-8.

Chakravarthi, Srivatssa, et al., "Inverse-Designed Photon Extractors For Optically Addressable Defect Qubits", Optica, vol. 7, No. 12, Dec. 18, 2020, pp. 1805-1811.

Chunduri, Sudheer, et al., "GPCNeT: Designing Suite for Inducing and Measuring Contention in HPC Networks", Association for Computing Machinery, SC'19, Nov. 17-22, 2019, 33 pages.

Gonzalez, Antonio, "Trends in Processor Architecture", Mar. 11, 2022, pp. 1-18.

Khandekar, Chinmay, et al., "Quantum Nonlinear Mixing of Thermal Photons to Surpass the Blackbody Limit", Optics Express, Optical Society of America, Jan. 20, 2020, pp. 2045-2059.

Mobini, Esmaeil, et al., "Laser Cooling of Ytterbium-Doped Silica Glass", Communications Physics, Aug. 5, 2020, pp. 1-6.

Shalf, John, "The Future of Computing Beyond Moore's Law", Philosophical Transactions A, The Royal Society Publishing, Jan. 20, 2020, 15 pages.

Hammond, Alec. M., et al., "Photonnic Topology Optimization with Semiconductor-Foundry Design-Rule Constraints", vol. 29, No. 15, Optics Express, Optical Society of America, Jul. 19, 2021, pp. 23916-23938.

Hankin, Alexander, et al., "HotGauge: A Methodology for Characterizing Advanced Hotspots in Modern and Next Generation Processors", 2021 IEEE International Symposium on Workload Characterization, 2021, 13 pages.

Sukumar, Screenivas R., et al., "Survival of the Fittest Amidst the Cambrian Explosion of Processor Architectures for Artificial Intelligence", 2021 IEEE.ACM Programming Environments for Heterogeneous Computing, 2021, 10 pages.

Albrechtsen, Marcus, et al., "Nanometer-Scale Photon Confinement in Topology-Optimized Dielectric Cavities", Nature Communications, Oct. 21, 2022, 8 pages.

Hobbhahn, Marius, et al., "Predicting GPU Performance", Epoch Ai, Dec. 1, 2022, 41 pages.

Kock, Jackson L., et al., "Optical Refrigeration of Payloads to T<125K", Optics Letters, Optica Publishing Group, Sep. 16, 2022, 7 pages.

Lapotin, Alina, et al., "Thermophotovoltaic Efficiency of 40%", Nature, vol. 604, Apr. 13, 2022, pp. 287-307.

Yao, Wenjie, et al., "Trace Formulation of Photonic Inverse Design with Incoherent Sources", Springer Nature, Nov. 16, 2022, pp. 1-33.

IEEE Electronics Packaging Society, "Chapter 20: Thermal" Heterogeneous Integration Roadmap, 2023, 39 pages.

(56) References Cited

OTHER PUBLICATIONS

Zhao, Bin, et al., "Radiative Cooling: A Review of Fundamentals, Materials, Applications, and Prospects", Applied Energy, vol. 236, Feb. 15, 2019, pp. 489-513.
Kumar, Vijay, et al., "Upconversion Nanoparticles (UCNPs) for Functional Applications", vol. 24, 2023, 495 pages.
International Bureau, International Search Report and Written Opinion mailed on Sep. 1, 2025, issued in connection with International Application No. PCT/US2025/030442, filed on May 21, 2025, 8 pages.

* cited by examiner

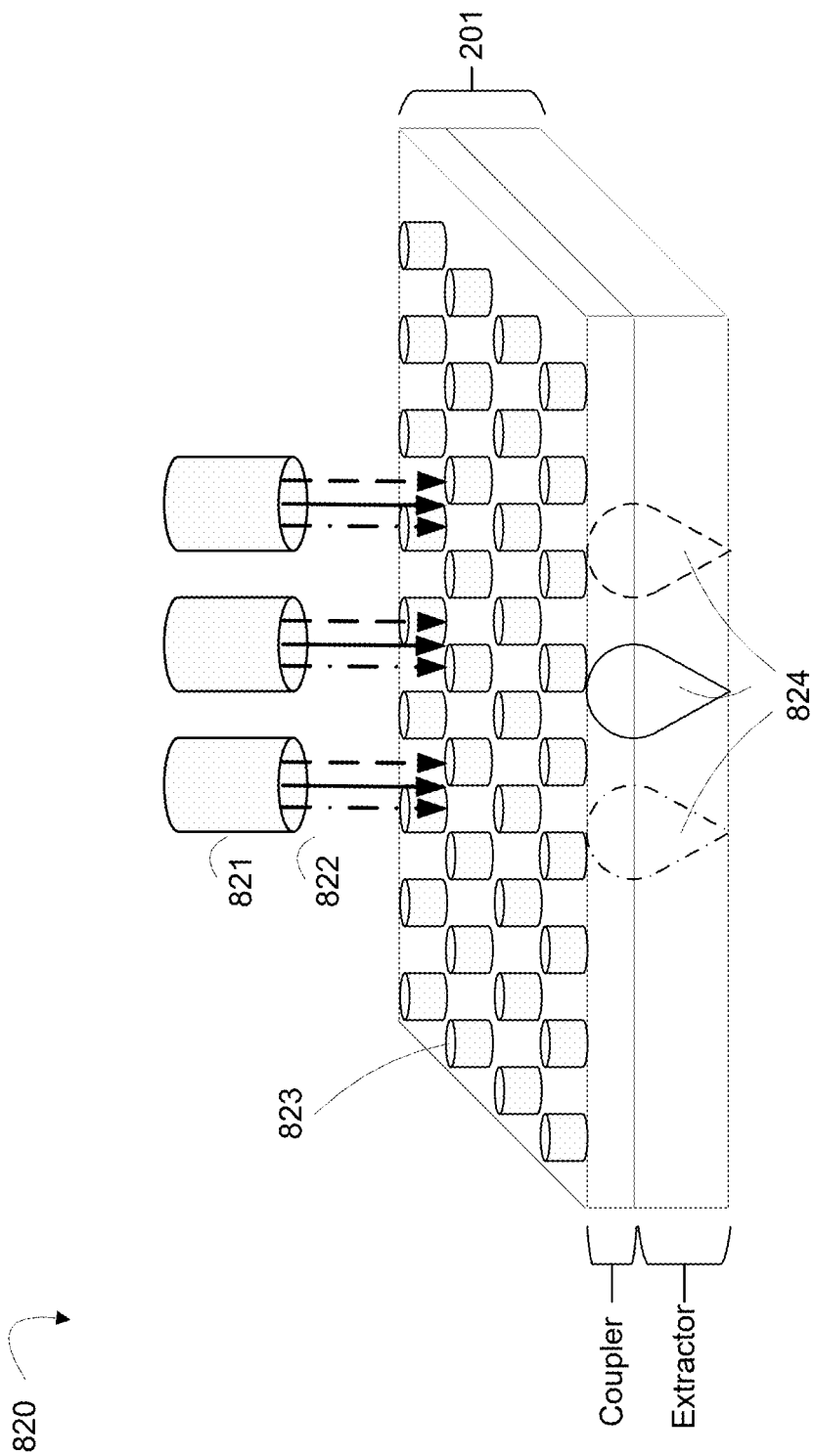

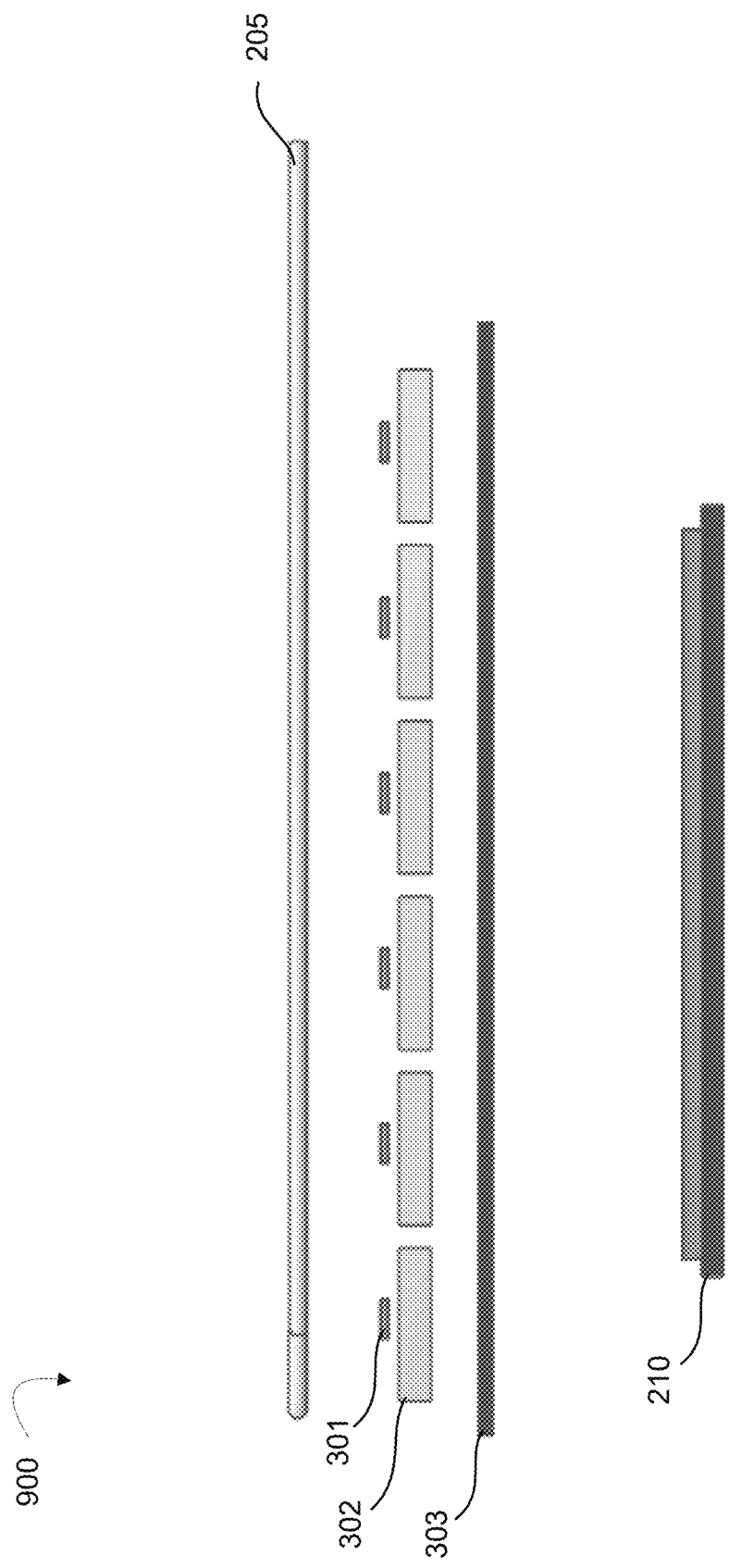

PHOTONICS-BASED COOLING OF HEAT SOURCES

CROSS-REFERENCE TO RELATED APPLICATIONS

This application claims priority under 35 U.S.C. § 119(e) to (i) U.S. Provisional Application No. 63/650,148, filed on May 21, 2024, and titled "DYNAMIC SOLID-STATE HEATSINK DEVICE FOR CONTROLLING TEMPERATURE OF HOTSPOT REGIONS IN COMPUTING DEVICES," (ii) U.S. Provisional Application No. 63/685,557, filed on Aug. 21, 2024, and titled "PHOTONICS-BASED COOLING OF HEAT SOURCES," and (iii) U.S. Provisional Application No. 63/783,448, filed on Apr. 4, 2025, and titled "DYNAMIC SOLID-STATE HEATSINK DEVICE FOR CONTROLLING TEMPERATURE OF HOTSPOT REGIONS IN COMPUTING DEVICES," each of which is incorporated by reference herein in its entirety.

BACKGROUND

High performance computing (HPC) systems are the backbone of many modern-day technologies. For instance, HPC systems enable computer simulations, numerical modeling, and artificial intelligence (AI) training and execution, among other modern-day computing technologies. At the core of HPC systems is HPC hardware, such as high-power-density microprocessors and memory systems, that performs and enables various computations necessary for such modern-day computing technologies. A byproduct of these computations is heat, which in turn can negatively affect the HPC hardware's performance and lead to device failure. Accordingly, cooling techniques have been developed to help reduce the heat generated by HPC hardware.

SUMMARY

Disclosed herein is new technology for cooling a heat source using photonics.

In one aspect, the disclosed technology may take the form of a photonic cooling device for a heat source with the photonic cooling device comprising a coupler and an extractor layer. The coupler layer is optically coupled to the extractor layer and is configured to (i) guide a first light signal into the extractor layer, (ii) guide a second light signal into the extractor layer, where the second light signal is defined based on at least one heat-source characteristic to target a given region of the extractor layer that corresponds to a hot spot region of the heat source, and (iii) guide a third light signal away from the extractor layer, thereby cooling the heat source. The extractor layer (i) comprises a luminescent medium, (ii) is optically coupled to the coupler layer, and (iii) is configured to (a) guide a fourth light signal to the coupler layer in response to the first light signal, where the fourth light signal is indicative of the at least one heat-source characteristic, (b) up-convert the second light signal via a luminescence process at the given region of the extractor layer, and (c) based on the up-conversion, output the third light signal to the coupler layer, thereby extracting heat from the hot spot region of the heat source.

The photonic cooling device may further comprise a sensor layer comprising a phase-change medium. The extractor layer is further configured to guide the first light signal to the sensor layer. The sensor layer physically couples to the heat source and is configured to output the fourth light signal to the extractor layer in response to receiving the first light signal, where the at least one heat-source characteristic is one of a spatial characteristic of the heat source or a temporal characteristic of the heat source.

The photonic cooling device may further comprise a reflector layer located between the extractor layer and the sensor layer and configured to reduce light signals from reaching the heat source.

The coupler layer may overlap with the extractor layer or be a distinct layer. The coupler layer may comprise one or more metasurface geometries.

The luminescent medium of the extractor layer may comprise a fluorescent medium, and the extractor layer being configured to up-convert the second light signal via the luminescence process may comprise the extractor layer being configured to up-convert the second light signal via a fluorescence process.

In another aspect, the disclosed technology may take the form of a method to be carried out by a photonic cooling device, the method comprising: (i) receiving, at a coupler layer of the photonic cooling device, a first light signal that causes a sensor layer of the photonic cooling device that is physically proximate to the heat source to output a second light signal that is indicative of at least one heat-source characteristic; (ii) outputting, at the coupler layer of the photonic cooling device, the second light signal; (iii) receiving, at the coupler layer of the photonic cooling device, a third light signal that is defined based on the at least one heat-source characteristic to target a given region of an extractor layer of the photonic cooling device that corresponds to a hot spot region of the heat source; (iv) up-converting, at the extractor layer of the photonic cooling device, the third light signal via a luminescence process at the given region of the extractor layer; and (v) outputting, at the coupler layer of the photonic cooling device, one or more up-converted light signals, thereby extracting heat from the hot spot region of the heat source.

In the aforementioned method, up-converting the third light signal via the luminescence process at the given region of the extractor layer may comprise up-converting the third light signal via a fluorescence process at the given region of the extractor layer.

In the aforementioned method, the fluorescence process comprises an anti-Stokes fluorescence process.

In the aforementioned method, outputting the second light signal comprises the sensor layer of the photonic cooling device (i) altering an observable state of the first light signal due to a sensed temperature characteristic of the heat source and (ii) outputting an altered version of the first light signal to the coupler layer of the photonic cooling device.

In yet another aspect, the disclosed technology may take the form of a cooling system for a heat source with the cooling system comprising (i) a photonic cooling device that physically couples to the heat source and comprises a fluorescent medium; (ii) a control system; and (iii) a sensing system. The sensing system is configured to sense an indication of at least one characteristic of the heat source based on a first light signal received at the photonic cooling device. The control system is configured to: (a) based on the at least one characteristic of the heat source, identify at least one region of the heat source for cooling and (b) based on the identification, cause a second light signal to be directed at the photonic cooling device. The photonic cooling device is configured to: (a) based on the received first light signal, output the indication of the at least one characteristic of the heat source, and (b) based on the received second light signal, output an up-converted light signal, thereby drawing heat away from the at least one region of the heat source.

The cooling system may further comprise (iv) an optical system comprising a first light source configured to direct the first light signal at the photonic cooling device and a second light source configured to direct the second light signal at the photonic cooling device; and (v) an optical network comprising an input optical channel configured to guide the first and second light signals to the photonic cooling device and an output optical channel configured to guide the up-converted light signal away from the photonic cooling device.

In the cooling system with the optical system, the control system being configured to cause the second light signal to be directed at the photonic cooling device may comprise the control system causing the optical system to direct the second light signal at the photonic cooling device in accordance with a pump plan defined by the control system.

The pump plan may be a responsive pump plan, where the at least one region of the heat source for cooling comprises a region of the heat source where a hot spot has developed. Alternatively, the pump plan may be a predictive pump plan, where the at least one region of the heat source for cooling comprises a region of the heat source where a hot spot is predicted to develop in the future. In either case, the pump plan comprises a plurality of parameters defined such that the optical system is enabled to direct the second light signal at a particular region of the photonic cooling device that corresponds to the identified at least one region of the heat source for cooling.

In the aforementioned cooling system, the at least one characteristic of the heat source comprises at least one of: a spatial characteristic of the heat source or a temporal characteristic of the heat source. The spatial characteristic of the heat source comprises one of: a spatial distribution of temperature across the heat source at a given instant in time, a spatial distribution of power across the heat source at a given instant in time, or a spatial distribution of workload across the heat source at a given instant in time. The temporal characteristic of the heat source comprises one of: temporal dynamics of temperature across the heat source over a given period of time, temporal dynamics of power across the heat source over a given period of time, or temporal dynamics of workload across the heat source over a given period of time.

The cooling system may further comprise (iv) an energy recovery system that is configured to recovery power from the up-converted light signal output by the photonic cooling device.

One of ordinary skill in the art will appreciate these, as well as numerous other aspects, in reading the following disclosure.

BRIEF DESCRIPTION OF THE DRAWINGS

FIG. 8C is a simplified block diagram of an example photonic architecture that provides mid-grained localization of light signals within the photonic cooling device.

FIG. 9B provides an exploded, side view of the example implementation of FIG. 9A.

Features, aspects, and advantages of the presently disclosed technology may be better understood with regard to the following description, appended claims, and accompanying drawings. The drawings are for the purpose of illustrating example embodiments, but one of ordinary skill in the art will understand that the technology disclosed herein is not limited to the arrangements and/or instrumentalities shown in the drawings.

DETAILED DESCRIPTION

As noted above, high performance computing (HPC) systems are the backbone of many modern-day technologies. For instance, HPC systems enable computer simulations, numerical modeling, and artificial intelligence (AI) training and execution, among other modern-day computing technologies.

To realize these technologies, HPC systems are typically housed at datacenters or the like. Within a given datacenter, there are often server rooms comprising numerous server stacks, where a respective plurality of servers is organized onto a given server stack. Each individual server contains the computer hardware, such as microprocessors and corresponding memory systems, necessary to perform the HPC operations.

Prevailing problems with these datacenters and the HPC hardware housed therein are high power consumption and high operating temperatures. In this respect, the servers often operate far above ambient temperatures at the datacenters and demand significant power to cool them so that they operate within their operating temperature specifications. If the servers (and their underlying computer hardware) are not kept at the appropriate operating temperatures, their energy efficiency, reliability, and/or time-to-solution can be greatly negatively impacted. Accordingly, techniques have been developed to help cool HPC hardware.

Existing cooling techniques typically involve air and/or liquid cooling approaches that focus on surface-level heat removal and rely on large-area conduction and/or convection. However, such techniques are inadequate to address the heat generated by HPC hardware. This is generally because these large-area cooling techniques do not target the actual source of the heat or address the non-uniform heat distribution of HPC hardware.

In this regard, focusing on a single server within a server rack, an individual server often displays non-uniform temperature distributions with the temperatures peaking at locations of microprocessors, accelerators, memory and interconnects, and power supplies. That being said, the highest temperatures within a server occur at the locations of the microprocessors-namely, the CPUs and GPUs. Yet, even at the scale of a microprocessor, there is a non-uniform temperature distribution with heat originating deep within the active layer of the microprocessor.

Figure 1A:
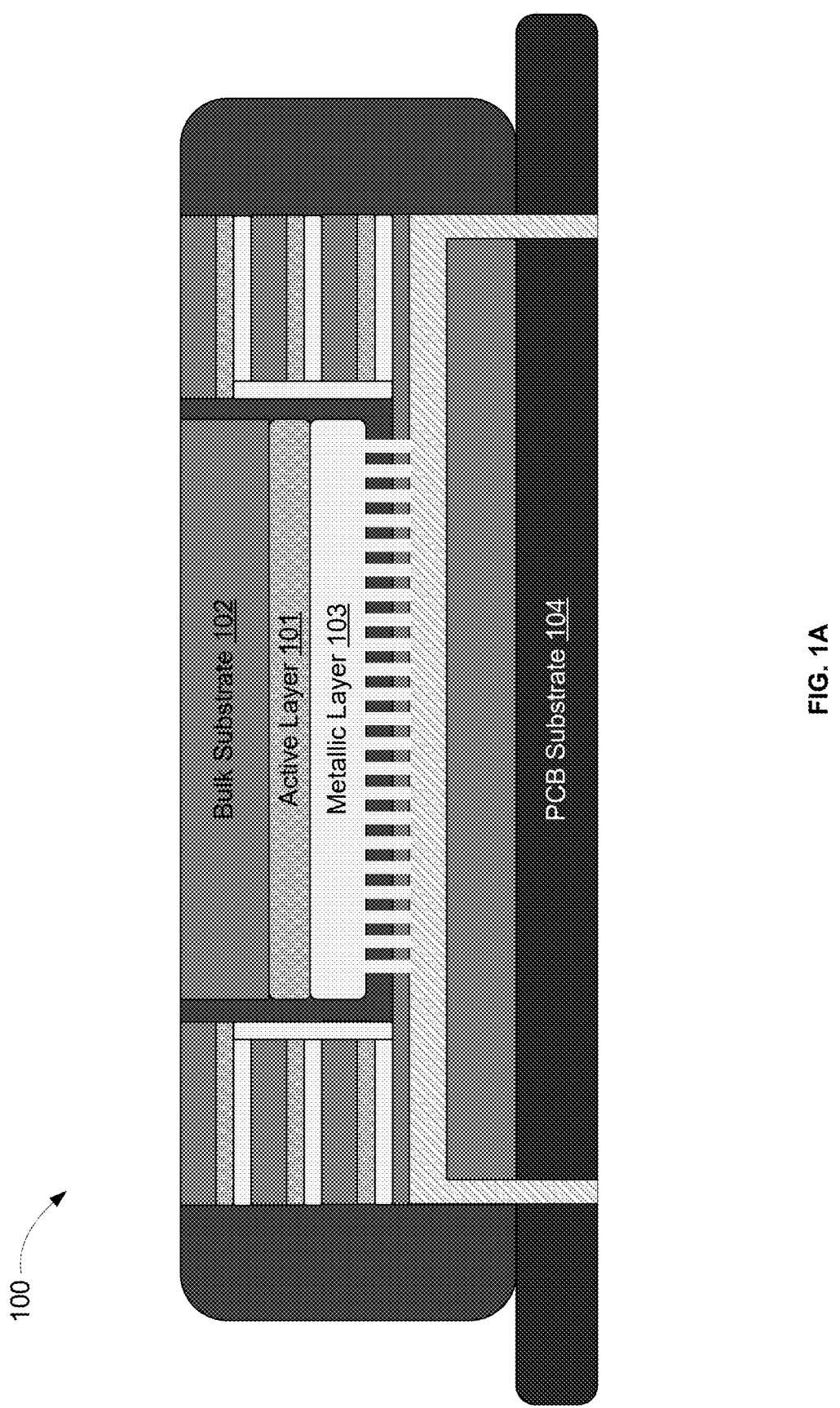
FIG. 1A is a simplified, schematic view of a flip-chip processor configuration.

To illustrate, FIG. 1A shows a simplified, schematic view of a flip-chip processor configuration 100, which is a common example of an HPC microprocessor (sometimes called a "system on a chip" (SoC)). As shown, the flip-chip processor comprises an active layer 101, a bulk substrate 102 (e.g., Silicon), and a metallic layer 103 built upon a PCB substrate 104. In practice, the active layer 101 is much thinner (e.g., on the order of 100 nm) than the bulk substrate 102 and metallic layer 103. For instance, the bulk substrate 102 is typically 1000 s of times thicker than the active layer 101, while the metallic layer 103 and accompanying insulating layers are typically in aggregate 10 s to 100 s of times thicker than the active layer 101.

Typically, the active layer 101 comprises transistors tasked with performing the various computations of the flip-chip processor. In operation, the active layer 101 is subject to electrical loads, which in turn causes heat generation. The metallic layer 103 provides the conductive branching structure necessary to provide power to the active layer 101 from the PCB 104 (e.g., via Through-Silicon-Vias (TSVs)) and logical routing to memory (e.g., high-bandwidth memory (HBM)) and/or peripheral components of the chip.

Heat from the active layer 101 is primarily dissipated upward, through the bulk substrate 102. But due to the high-power density of the active layer 101, the bulk substrate 102 is unable to dissipate heat fast enough to prevent the formation of "hot spots" in the active layer 101.

In general, a hot spot is a thermal localization within the active layer of a microprocessor. Hot spots typically interfere with electronic performance, such as by causing low-efficiency and clock and power gating, and are the primary cause of device failure. Due to the inability of existing cooling techniques to suppress hot spot formation, hot spot formation is now the primary constraint that limits microprocessor architecture design.

Figure 1B:
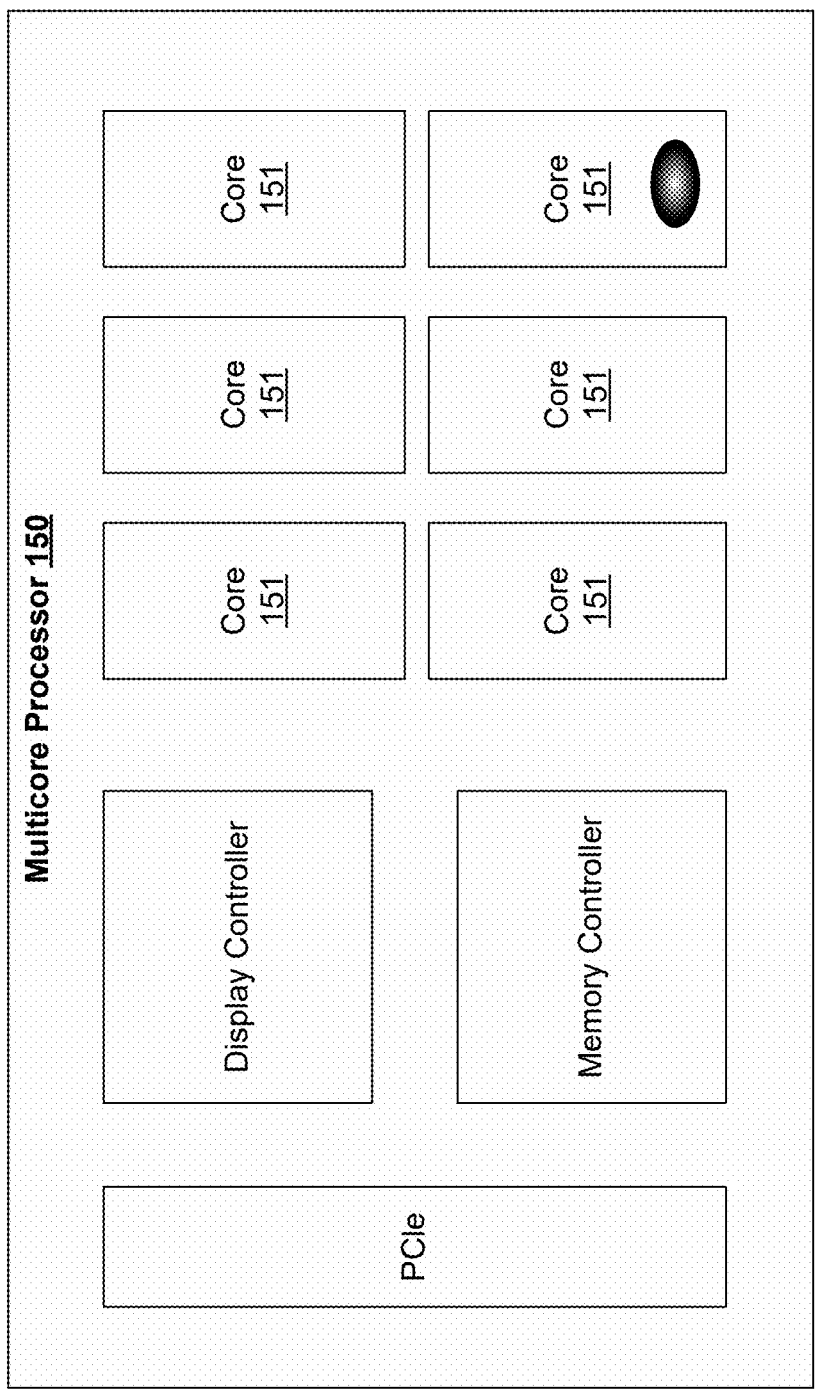
FIG. 1B is a simplified block diagram illustrating an example active layer of a modern-day microprocessor that comprises multiple cores.

Even within the active layer of a microprocessor, hot spot formation is not uniform, which is due to significant differences in power densities between active and non-active clusters of transistors within the active layer. In this respect, zooming in on a microprocessor, the active layer typically comprises a plurality of compute regions known as "cores." FIG. 1B provides a simplified block diagram illustrating an example active layer of a modern-day microprocessor 150 that comprises multiple cores 151, among other regions.

Figure 1C:
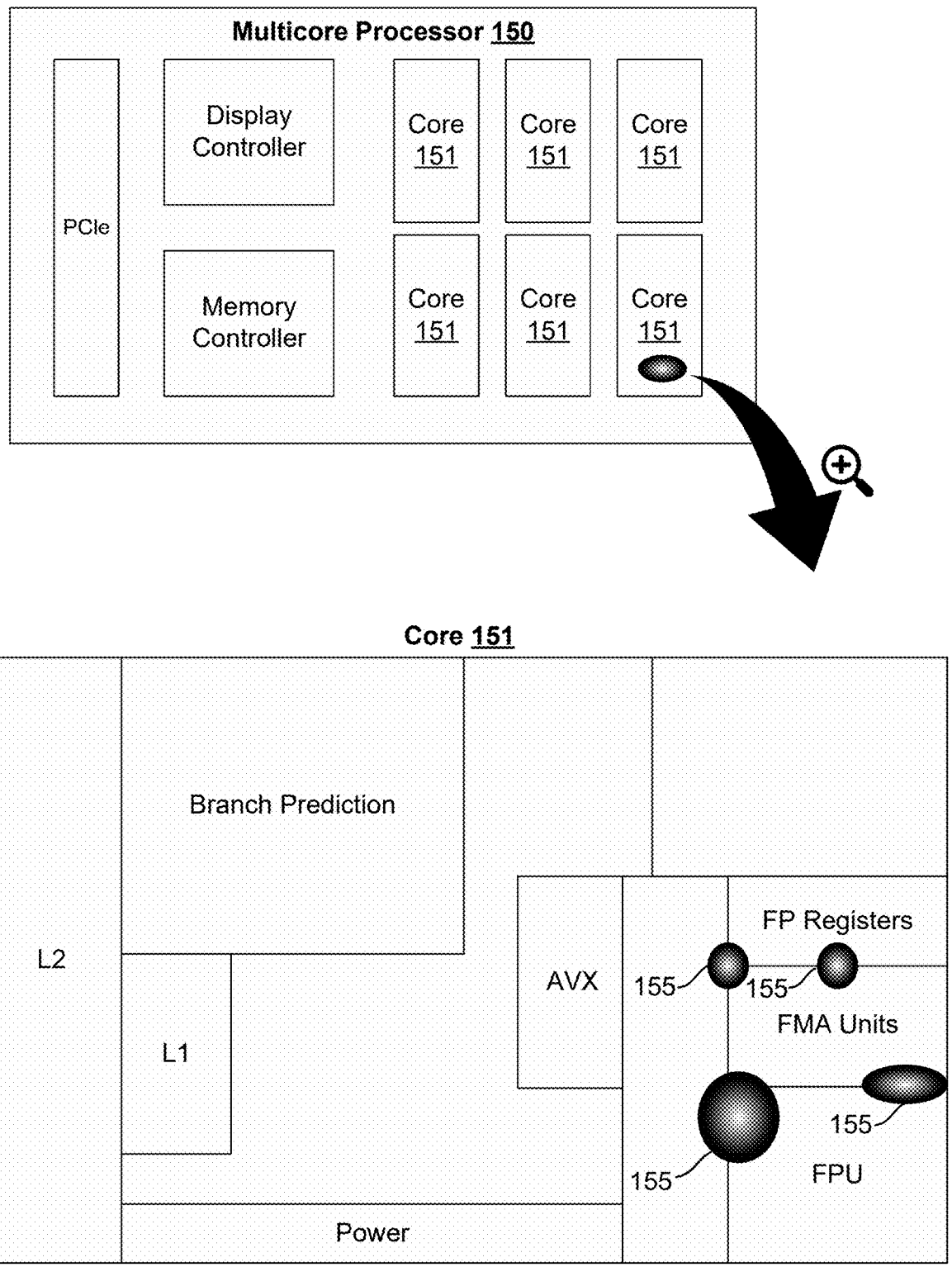
FIG. 1C is a simplified block diagram of an example magnified view of a given core from the multi-core processor of FIG. 1B.

Each core is comprised of functional units that perform various operations, such as Control Units, Arithmetic Logic Units, and I/O (input/output) units. Each of these classes of functional units breaks down further based on the data type the given functional unit (e.g., Floating Point Unit) operates on (e.g., 16-bit, 32-bit, 64-bit, etc.) which in turn determines the physical size of the register region (e.g., FPU Regs) that the given functional unit performs operations on (e.g., FMAs). FIG. 1C provides a simplified block diagram of an example magnified view of a given core 151 from the multicore processor 150 of FIG. 1B, where the given core 151 comprises functional units and registers, among other structures and components.

In operation, hot spots emerge as microscopic localizations of power within a microprocessor's cores and more specifically, within the functional units and associated registers of a given core. Example hot spots 155 are illustrated in FIG. 1C. The localized heating near the functional units and their registers results in a non-uniform temperature distribution within a given core. For instance, the hot spots 155 may be over 30° C. hotter than other regions of the core 151 that are only 100 s of µm away.

Thus, in sum, the source of the heat generated by a microprocessor occurs deep within the microprocessor's substrate and is distributed in a non-uniform manner within the microprocessor. As such, existing cooling techniques that typically focus on removing heat at the surface of a microprocessor and/or rely on large-area cooling are inadequate to address the high temperatures of HPC hardware. Accordingly, the power spent in employing existing cooling techniques is largely wasted due to the shortcomings of these techniques.

Other techniques that attempt to address hot spot formation within the active layer of a microprocessor are known as "dark silicon" techniques. Dark silicon techniques typically involve forcing certain functional units to be inactive while other functional units are active, thereby staggering thermalization across the active layer. However, such techniques are undesirable for several reasons. For instance, in practice, dark silicon techniques directly or indirectly manage the power distribution among functional units in a manner that is invisible to the application and runtime layers of the microprocessor and can operate at timescales that compete with the microprocessor's clock cycles making them difficult to characterize empirically. As such, dark silicon techniques often under-utilize the full compute power of a given core and miss-allocate the core's resources, both of which severely limit performance and energy gains.

Given the deficiencies of existing cooling techniques, the present disclosure provides cooling technology that advantageously allows for highly focused cooling within a heat source. In this respect, in one aspect, the cooling technology disclosed herein involves the use of photonics that allows for targeted cooling down to µm regions within a heat source. In particular, photons are used to interact with and draw energy from phonons near a region corresponding to a hot spot of the heat source, which results in dissipating heat from that hot spot. Such an approach advantageously incites a volumetric, as opposed to surface, phenomenon.

In another aspect of the cooling technology of the present disclosure, a photonic cooling device is provided that comprises at least a coupler layer, an extractor layer, and a sensor layer. The coupler layer serves as the interface between the photonic cooling device and other components of a cooling system and couples light (e.g., laser pulses and up-converted heat-carrying light) in and out of the photonic cooling device. The sensor layer serves as the interface between the photonic cooling device and the heat source and is designed to interact with certain input light (e.g., idler light) to output responsive light signals that provide an indication of information about the heat source, such as the heat source's instantaneous temperature and power distribution. The extractor layer is located between the coupler and sensor layers and is constructed with a luminescent medium (e.g., an anti-Stokes emitting material) that up-converts certain input light (e.g., pump light), which is transferred out of the photonic cooling device via the coupler layer, thereby drawing heat away from the heat source.

In yet another aspect of the cooling technology of the present disclosure, the photonic cooling device is one component of a cooling system that also comprises a control system, a sensing system, and an optical system and network. The control system causes the optical system to send information-gathering light (e.g., idler light) at the photonic cooling device that emits, via its sensor layer, light signals carrying information about the heat source that are sensed by the sensing system. Based on such sensed signals, the control system identifies the existence of, or predicts the future development of, one or more hot spots within the heat source and in turn defines a strategy for cooling one or more regions of the heat source that correspond to those one or more hot spots. The optical system executes the strategy by tuning one or more operating conditions of the optical system's pump light source so that heat-cooling light targeted at the photonic cooling device can cool any existing hotpots or preemptively cool any predicted-to-develop hot spots. In particular, heat-cooling light is targeted at regions of the photonic cooling device's extractor layer that correspond with the identified hot spot regions of the heat source, which invokes an up-conversion process at those targeted regions of the extractor layer. In turn, the photonic cooling device responsively outputs up-converted light, via its extractor layer, thereby drawing heat away from the heat source. Such extracted heat may be funneled to an energy recovery system where the recovered energy can be utilized for various purposes including powering the cooling system or the heat source itself, among other possibilities Various aspects of the cooling technology described herein may replace traditional cooling methodologies that require greater energy to operate HPC computing environments. As such, the cooling technology described herein may improve on energy expenditure and may reduce or eliminate greenhouse gas emissions.

Figure 2:
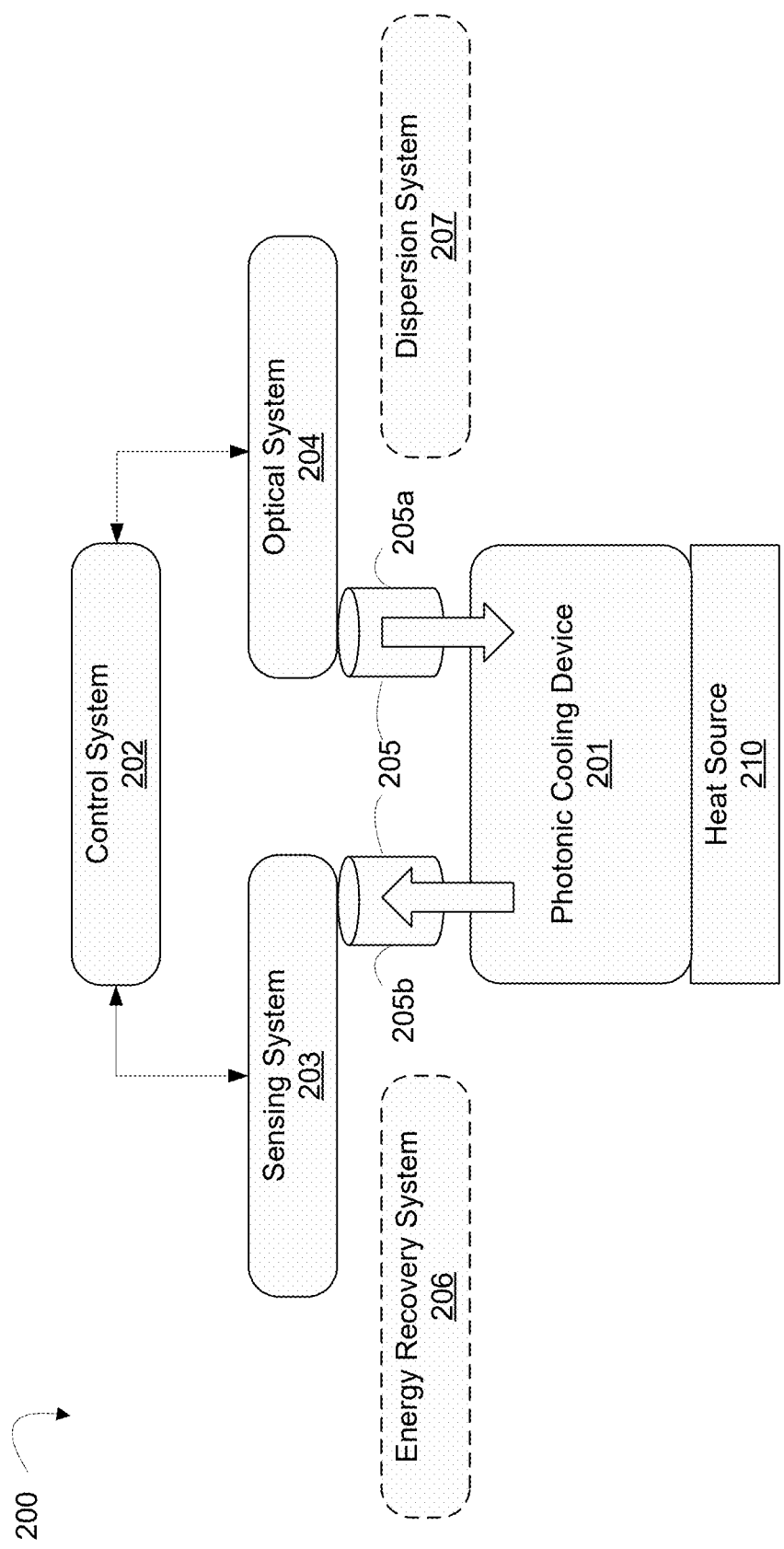
FIG. 2 is a simplified block diagram of components of a cooling system for cooling a heat source in accordance with the present disclosure.

FIG. 2 shows a simplified block diagram of components of a cooling system 200 for cooling a heat source 210 (e.g., the flip-chip processor 100 of FIG. 1A) in accordance with the present disclosure. As shown, the cooling system 200 includes a photonic cooling device 201, a control system 202, a sensing system 203, an optical system 204, and an optical network 205 comprising one or more optical channels 205a, 205b. In some embodiments, the cooling system 200 may optionally also include an energy recovery system 206 and/or a dispersion system 207.

Figure 1D:
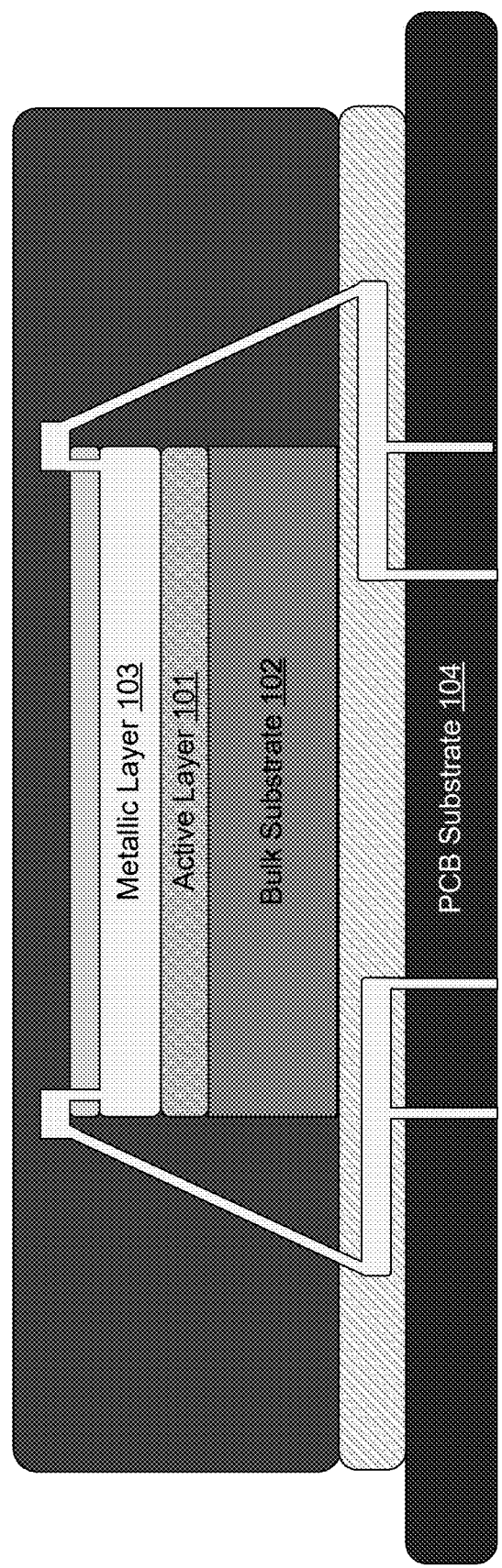
FIG. 1D is a simplified, schematic view of a wire-bonded processor configuration.

In the example of FIG. 2, the photonic cooling device 201 is in physical contact with the heat source 210. Depending on the type of heat source 210, the photonic cooling device 201 may be physically coupled with the heat source 210 in different manners. In an example where the heat source 210 takes the form of a flip-chip microprocessor (e.g., FIG. 1A), the photonic cooling device 201 may reside on top of the heat source 210 (e.g., in contact with the flip-chip microprocessor's bulk substrate). In an example where the heat source 210 takes the form of a wire-bonded microprocessor whose configuration is oriented vertically in an opposite manner than a flip-chip configuration (e.g., FIG. 1D shows a simplified, schematic view of a wire-bonded processor configuration 190), the photonic cooling device 201 may reside below the heat source 210 (perhaps along with other components of the cooling system 200). Other possibilities also exist.

In the example of FIG. 2, the photonic cooling device 201 is also optically coupled to the sensing system 203 and the optical system 204 via the optical channels 205a, 205b. In this example, the optical channel 205a is configured as an input channel to guide light signals into the photonic cooling device 201, and the optical channel 205b is configured as an output channel to guide light signals out of the photonic cooling device 201.

As shown in FIG. 2, the sensing system 203 and the optical system 204 are communicatively coupled to the control system 202, such as via a wired or wireless communication link (e.g., a system bus, a serial or Ethernet cable, a point-to-point wireless link, etc.). In general, as indicated in FIG. 2 by the double-headed arrows, the control system 202 can exchange (e.g., send and receive) information with each of the sensing system 203 and the optical system 204.

As discussed in further detail below, in example embodiments, the cooling system 200 relies on the ability of the control system 202 to cause the optical system 204 to direct pump light via the input optical channel 205a at a particular region of the photonic cooling device 201, which in turn is designed to employ a process to up-convert the pump light (e.g., long-wavelength input) into shorter wavelengths (e.g., via anti-Stokes fluorescence), thereby cooling a particular region of the heat source 210. In this respect, in example embodiments, the cooling system 200 may leverage nanophotonics to manipulate light and concentrate optical power at the sub-wavelength scale to cool HPC hardware.

As described above, there are various possible sources of heat in the computer hardware at the core of modern-day HPC systems, each of which is represented in FIG. 2 as the heat source 210. For example, a heat source could be a microprocessor (SoC), other HPC semiconductor device, or any other heat-producing hardware component of a computing or AI hardware system (e.g., memory systems like HBM systems). More specifically, a heat source could be a central processing unit (CPU), a graphical processing unit (GPU), a general-purpose GPU (GPGPU), another HPC class processor, or an application specific integrated circuit (ASIC), among other examples.

As shown in FIG. 2, the photonic cooling device 201 is physically coupled to the heat source 210. In example embodiments, the photonic cooling device 201 is separate from and abuts the heat source 210. In other embodiments, at least part of the photonic cooling device 201 is integrated within the heat source 210. In yet other embodiments, the photonic cooling device 201 is integrated entirely within the heat source 210.

Figure 3A:
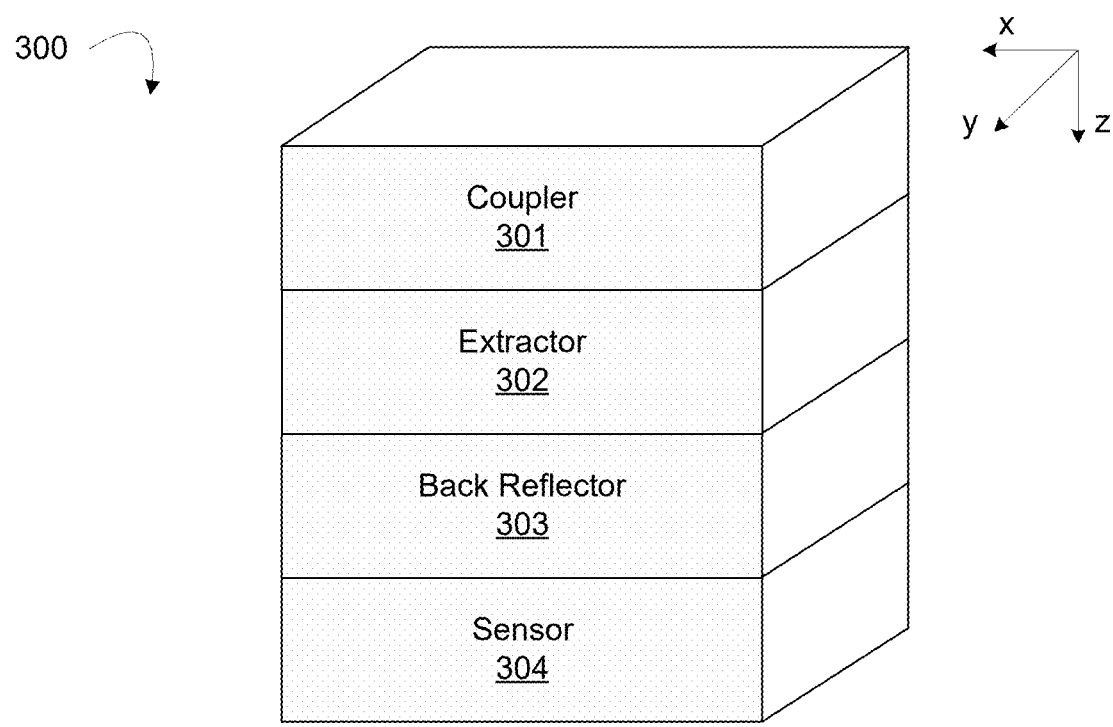
FIG. 3A is a side, perspective view of a simplified block diagram of a photonic cooling device.
Figure 3B:
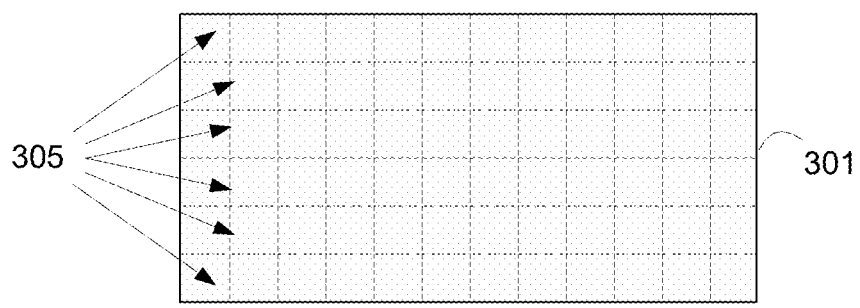
FIG. 3B is a top-down view of the simplified block diagram of the photonic cooling device of FIG. 3A.

FIGS. 3A and 3B show a simplified block diagram of components of a photonic cooling device 300, which generally represents the photonic cooling device 201 of FIG. 2. In particular, FIG. 3A shows a side, perspective view of the simplified block diagram of the photonic cooling device 300, and FIG. 3B shows a top-down view of the simplified block diagram of the photonic cooling device 300.

In general, the photonic cooling device 300 is a structure (e.g., solid-state structure) designed to extract heat from a heat source. In example implementations, the photonic cooling device 300 takes the form of a cold plate, heatsink, heat spreader, heat fin, or other structure.

The photonic cooling device 300 can take various shapes and/or have various dimensions, which may be dictated by the shape and/or dimensions of the particular heat source that the photonic cooling device 300 is designed to cool. In the example shown in FIGS. 3A-3B, the photonic cooling device 300 has a rectangular-box shape but this should not be construed as limiting.

In example embodiments, the photonic cooling device 300 can comprise various sub-components or layers, each of which is designed to perform one or more functions in connection with cooling a heat source. For instance, in the example shown in FIGS. 3A-3B, the photonic cooling device 300 comprises a "stack" of layers including a coupler layer 301, an extractor layer 302, a back-reflector layer 303, and a sensor layer 304.

In example implementations, each layer of the photonic cooling device 300 may have the same width (y) and length dimensions (x), and thus, same surface area, but may have different depth (z) dimensions. In other implementations, the width and length dimensions of some layers may differ from the width and length dimensions of other layers and/or the depth dimensions of some layers may be the same.

In general, the coupler layer 301 serves as the interface between the photonic cooling device 300 and other components of a cooling system, such as the optical system 204 of the cooling system 200, and the sensor layer 304 is physically coupled to a heat source, thereby serving as the interface between the photonic cooling device 300 and the heat source.

More specifically, the coupler layer 301 is designed to (i) couple light signals from a source external to the photonic cooling device 300 into the extractor layer 302, such as idler light signals and pump light signals from the optical system 204, and (ii) couple light signals from the extractor layer 302 out of the photonic cooling device 300, such as information-carrying light signals responsive to idler light signals and heat-carrying light signals originating in the extractor layer 302 responsive to pump light signals. At least in some implementations, the coupler layer 301 is further designed to enhance the up-conversion process originating in the extractor layer 302 that draws heat away from the heat source (e.g., via trapped ions or lattice characteristics capable of anti-Stokes fluorescence), reduce the heat source's interaction with light signals directed at the photonic cooling device 300 and light signals emitted by the photonic cooling device 300, and/or reduce the amount of non-radiative recombination in the extractor layer 302.

To these ends, the physical structure of the coupler layer 301 may take various forms and have various configurations. For instance, the coupler layer 301 may be an etched or epitaxially grown structure (e.g., an etched or epitaxially grown dielectric nanostructure).

Moreover, the coupler layer 301 may comprise one or more one-dimensional or multi-dimensional (e.g., two-dimensional or three-dimensional) structures, such as grating structures and/or photonic-crystal structures (e.g., one or more insulating or conductive grating structures, one or more stacked two-dimensional grating structures, one or more stacked three-dimensional grating structures, and/or one or more grating structures).

Further, the coupler layer 301 may be designed to comprise variations on the surface of the coupler layer 301 to achieve some or all of the above-mentioned functional characteristics. For example, the coupler layer 301 may be designed to comprise surface variations achieved using lithographic manufacturing processes. In some implementations, the coupler layer 301 may be designed to comprise surface variations using metasurface geometries that exhibit variations along one dimension (e.g., along the x- or y-dimension illustrated in FIG. 3A) or two dimensions (e.g., along the x- and y-dimensions illustrated in FIG. 3A), such as one-dimensional or two-dimensional gratings, which may have various spacings and/or heights (e.g. with 1 μm to 2 μm spacing and 1 nm to 2 μm height). In some cases, the spacing (or ruling) may correspond to the wavelength of the expected operating temperature of the heat source that the photonic cooling device 300 is intended to cool.

As one particular implementation, the coupler layer 301 may comprise one or more of: a Purcell enhancement structure, a split ring resonator, a nonlinear doubly-resonant resonator, a nano-scale cavity, a wavelength-division multiplexer, single-photon quantum extractor, or structure with multi-wavelength coupling capabilities, among other possibilities.

Further still, the coupler layer 301 typically comprises width, length, and depth (or thickness) dimensions. In example implementations, the width and length dimensions of the coupler layer 301 are selected to correspond with the width and length dimensions of the heat source or a portion thereof (e.g., the heat source's active layer). In this way, the coupler layer 301 may be dimensioned so that the surface area of the coupler layer 301 matches the surface area of the heat source or a portion thereof. In some cases, the couple layer 301 may comprise a plurality of separate segments (e.g., a plurality of coupler tiles, discs, etc.). Moreover, the coupler layer 301 may have a thickness of 0.5-2 μm, among other possible thicknesses. Further, as noted before, the coupler layer 301 may have one or more features, which in turn have a particular aspect ratio relative to the thickness (z dimension) of the coupler layer 301, such as an aspect ratio of thickness to x-y dimensions. Examples of a feature aspect ratio may be 20:1 to 5:1 (e.g., thickness between 0.5-2 μm with an x-y feature size of 100 nm), among other possibilities.

Additionally, the coupler layer 301 may comprise one or more of the following materials: Sapphire, Silicon, Silica, Gallium Phosphide, Gallium Arsenide (GaAS), Silicon Nitride, Silicon Carbide, Diamond, Gallium Nitride, Copper, or Aluminum. In some implementations, the coupler layer 301 may comprise one or more alloys or ceramics comprised of one or more of the aforementioned materials. Further still, in some cases, the coupler layer 301 may comprise one or more of the aforementioned materials along with one or more doped regions.

The coupler layer 301 of the photonic cooling device 300 provides various advantages. For example, in a typical optical-cooling configuration where the interaction of a pump light with a heat source is restricted to a single or few passes, the majority of the pump photons do not interact with active ions before passing through. In contrast, the coupler layer 301 is designed to trap photons within the extractor layer 302 (e.g., the cooling medium) for orders of magnitude longer timescales, thereby enhancing the proportion of pump photons absorbed. As another example, compared to bulky Fabry-Perot resonators, the coupler layer 301 is designed such that the confinement of pump photons within the extractor layer 302 can be localized to spatial regions that are sub-wavelength in dimension allowing for more targeted concentration of cooling power within a desired region of the extractor layer 302 that in turn is associated with a particular region of a heat source. Other advantages of the coupler layer 301 of the photonic cooling device 300 will be apparent to those of ordinary skill in the art.

As shown in FIG. 3A, the coupler layer 301 is adjacent to, and optically coupled with, the extractor layer 302. The extractor layer 302 is also optically coupled with the sensor layer 304 (e.g., via the back-reflector layer 303) and is designed to guide light signals (e.g., idler light signals) to the sensor layer 304 (e.g., via the back-reflector layer 303).

In general, the extractor layer 302 is designed to interact with an input pump signal to draw heat from the heat source, which may be accomplished in any of various manners. For instance, as one possibility, the extractor layer 30 may draw heat from the heat source by reducing the temperature of a location of, or near, a hot spot. Additionally or alternatively, the extractor layer 30 may draw heat from the heat source by enhancing the effective thermal conductivity of one or more substrates near a hot spot, temporally modulating the lattice of one or more substrates near a hot spot, and/or enabling near-field refrigeration across one or more optical paths, which expand in volumetric surface area to support an increasing number of modes as the distance from a hot spot is increased, among other possibilities.

In example implementations, the extractor layer 302 is designed to draw heat from the heat source via a luminescence process, such as a photoluminescence (e.g., fluorescence) process. For instance, in example embodiments, the extractor layer 302 is designed to extract heat from phonons in the vicinity of an active layer of a heat source via light-induced fluorescence up-conversion.

To these ends, the physical structure of the coupler layer 301 may take various forms and have various configurations. In example implementations, the extractor layer 302 may comprise a medium designed to cause a non-linear transformation to received light signals. More specifically, the extractor layer 302 may comprise a luminescent medium, a photoluminescent medium, or a fluorescent medium, among other possibilities. In some cases, the extractor layer 302 comprises a structured heterostructure (e.g., structured silicon heterostructure) that includes at least one active medium and/or at least one non-linear medium.

In some implementations, the extractor layer 302 comprises a host medium implanted with ions that exhibits luminescence (e.g., an ion-implanted host medium that exhibits fluorescence which is a form of photoluminescence). The host medium may comprise a glassy, ceramic-glass, or crystalline medium, such that phonon energy is minimized, thereby maximizing the extractor's optical cooling capacity and minimizing quenching effects. Further, the host medium may be implanted with a single dopant (e.g., Yb) or multiple dopants (e.g., Sensitizer ions and Activator ions). The quantity of ions (e.g., rare earth ions) in the host medium may have a density between $6\times10^{24}$ ions per $m^3$ to $6\times10^{25}$ ions per $m^3$ or a doping by weight of 1%-20%, among other possibilities. In a particular example implementation, the extractor layer 302 comprises a host glass lattice including implanted ions (e.g., Lanthanide ions) designed such that, when excited, heat is extracted in the form of light through a nonlinear anti-Stokes fluorescence process that achieves a net optical cooling of a target area of a heat source.

Further, as with the coupler layer 301, the extractor layer 302 typically comprises width, length, and depth (or thickness) dimensions. In some implementations, the width and length dimensions of the extractor layer 202 may be selected to correspond with the width and length dimensions of the heat source or a portion thereof (e.g., the heat source's active layer) and may have the same width and length dimensions as the coupler layer 301. In other implementations, the extractor layer 302 may comprise a plurality of separate segments (e.g., a plurality of extractor tiles, discs, etc.), where each segment has a width and/or length dimension that is smaller than the width and/or length dimension of the coupler layer 301. Moreover, the extractor layer 302 may have a thickness of 2-10 μm, among other possible thicknesses.

Additionally, the extractor layer 302 may comprise one or more of the following materials: Silicon Nitride (SiN), Silicon Dioxide ($SiO_2$), Silica, Borate, Phosphate, Silicate, Germanate, Tellurate, Fluoride, LiF, Yttrium Lithium Fluoride (YLF), $NaYF_4$, or Chalcogenide.

Further, the extractor layer 302 may comprise one or more of the following implanted ions: trivalent Ytterbium (Yb3+) (e.g., Yb3+ (10%)), Yttrium, Erbium (ER) (e.g., ER (1%)), Thulium, Holmium, or Neodymium. Further still, the extractor layer 302 may be doped with one or more infrared dyes (e.g., 808 nm or 980 nm infrared dyes comprising long organic or inorganic molecules) in addition to or as an alternative to the aforementioned ions. In some cases, organic or inorganic quantum dots and/or up-conversion nanoparticles may be used to produce a glass-ceramic or polymer composite for the extractor layer 302. In yet other cases, carbon or boron-nitride nanotubes may be utilized for the extractor layer 302.

In some implementations, the extractor layer 302 may comprise multiple sub-layers, such as an extractor bulk sub-layer and an extractor luminescent sub-layer. The extractor bulk sub-layer may comprise SiN or any bulk crystal or glass with appropriate bandgaps such that the transmission window of the extractor bulk sub-layer is tuned for minimal absorption of pump light. The extractor luminescent sub-layer may comprise SiN or any bulk crystal or glass that is implanted with up-converting ions and may comprise Yb3+ or other dopant with an ion density between $6\times10^{24}$ ions per $m^3$ to $6\times10^{25}$ ions per $m^3$ or a doping by weight of 1%-20%. Other example configurations of an extractor layer with sub-layers are also possible.

Further, in some implementations, the extractor layer 302 may be embedded into the same bulk material of the coupler layer 301 (e.g., Chalcogenide, NaLiF, LiF, Fluorozirconate (ZBLAN), YLF, $NaYF_4$, other Fluoride-, other Sulphide- (Ge—S), other Silica- (Si—O), Selenide- or Telluride-based glasses or glass ceramics) and comprise implanted ions that facilitate the heat-carrying up-conversion process. In yet other implementations, the extractor layer 302 may take the form of a dopant-free direct bandgap material, such as GaAs, GaP, GaN, etc., which could be the same or a different material than the coupler layer 301.

Further yet, the extractor layer 302 (and the photonic cooling device 300 more generally) may be constructed such that the extractor layer 302 is located within the near-field of the active layer of the heat source when the photonic cooling device 300 is utilized to cool the heat source.

Returning to FIG. 3A, as shown, the extractor layer 302 is adjacent to, and optically coupled with, the back-reflector layer 303. The back-reflector layer 303 is also adjacent to, and optically coupled with, the sensor layer 304.

In general, the back-reflector layer 303 is designed to (i) guide light signals (e.g., idler light signals) to the sensor layer 304 and (ii) minimize electromagnetic fields (e.g., pump light signals originating outside of the photonic cooling device 300 and up-converted lights signals output by the extractor layer 302) from penetrating into the heat source, which otherwise would result in undesirable heat generation at the heat source.

To these ends, the physical structure of the back-reflector layer 303 may take various forms and have various configurations. In example embodiments, the back-reflector layer 303 may be an epitaxially grown structure, such as an epitaxially grown grating structure, designed to minimize light penetration into the heat source at the wavelengths of the pump light signals directed at the photonic cooling device 300 and up-converted lights signals output by the extractor layer 302.

Moreover, the back-reflector layer 303 may be designed to comprise a stack of alternating layers of different materials (e.g., alternating silicon-on-insulator layers, alternating layers of GaAs and AlGaAs, etc.) and/or different thicknesses. For example, the alternating layers may comprise alternating silicon and glass films with each of the alternating layers ranging between 10 nm to 1 μm in thickness and building to a total back-reflector layer 303 thickness of approximately 1-3 μm.

In some cases, the back-reflector layer 303 may be designed to comprise variations within one or more of the alternating layers using metasurface geometries that exhibit variations along one dimension or two dimensions, such as one-dimensional or two-dimensional gratings. In some cases, the back-reflector layer 303 may take the form of a generalization of a distributed Bragg reflector or thin film. Additionally, in some cases, the back-reflector layer 303 may take the form of a glass back-filled grating or glass-bonded grating, among other possibilities Further, as with the coupler and extractor layers 301-302, the back-reflector layer 303 typically comprises width, length, and depth (or thickness) dimensions. In example implementations, the width and length dimensions of the back-reflector layer 303 are selected to correspond with the width and length dimensions of the heat source or a portion thereof (e.g., the heat source's active layer). Further, the back-reflector layer 303 may have a thickness of 1-3 μm, among other possible thicknesses.

Additionally, the back-reflector layer 303 may comprise one or more of the following materials: Silicon Dioxide (SiO$_2$), Silicon, Silicon Nitride (SiN), AlGaAs, or GaAs.

As shown in FIG. 3A, the back-reflector layer 303 is adjacent to, and optically coupled with, the sensor layer 304. As mentioned before, the sensor layer 304 is in physical contact with the heat source, thereby serving as the interface between the photonic cooling device 300 and the heat source.

In general, the sensor layer 304 is designed to provide feedback (and/or enhance a response output by a heat source) about one or more heat-source characteristics of interest to systems external to the photonic cooling device 300, such as the sensing system 203 of FIG. 2. For example, the sensor layer 304 may be designed to output information-carrying signals about spatial and/or temporal characteristics of the heat source based on received light signals (e.g., received idler light signals), such as the spatial distribution of the temperature, power, and/or workload of the heat source and/or the temporal dynamics of the temperature, power, and/or workload of the heat source. In general, the spatial distribution of the temperature, power, or workload of the heat source describes how the temperature, power, or workload is distributed across the heat source at a given instant in time (e.g., the location and/or density of the particular characteristic within the heat source), and the temporal dynamics of the temperature, power, or workload of the heat source describes how the temperature, power, or workload of the heat source has evolved over a given period of time.

To these ends, the physical structure of the sensor layer 304 may take various forms and configurations. In example implementations, the sensor layer 304 comprises a thermo-optic medium (e.g., thin film) or other phase-change medium that exhibits temperature or heat-flux dependent changes to an observable state (e.g., its index of refraction) at one or more wavelengths (e.g., the wavelength of idler light signals, or of up-converted signals from the extractor layer 302, or of reflected or refracted signals from the back-reflector layer 303). In this way, the sensor layer 304 is designed such that temperature or heat-flux variations in the heat source that is proximate to the sensor layer 304 change the observable state (e.g., reflection spectrum) of received light signals (e.g., received idler light signals), thereby encoding information about these variations in the responsive light signals (e.g., reflected light signals) output by the sensor layer 304.

Further, as with the other layers, the sensor layer 304 typically comprises width, length, and depth (or thickness) dimensions. In example implementations, the width and length dimensions of the sensor layer 304 are selected to correspond with the width and length dimensions of the heat source or a portion thereof (e.g., the heat source's active layer). Further, in some implementations, the sensor layer 304 has a thickness in the range of 1 nm to 100 nm, among other possible thicknesses or thickness ranges.

Additionally, the sensor layer 304 may comprise vanadium dioxide (VO$_2$), among other possible state-change materials.

As suggested above, the photonic cooling device 300 generally (or one or more of its layers) may comprise width and length dimensions that correspond with the width and length dimensions of the heat source or a portion thereof (e.g., the heat source's active layer). In this way, the photonic cooling device 300 generally (or one or more of its layers) has a surface area that is the same or substantially the same as the surface area of the heat source or a portion thereof.

As shown in FIG. 3B, the surface area of the photonic cooling device 300, and more specifically, the surface of the coupler layer 301, can be represented by a map, grid, or the like that is logically divided into various cells 305. Each other layer of the photonic cooling device 300 can be logically divided into various cells as well. In some cases, each layer has the same logical cells as the other layers, and in other cases, one or more layers have different logical cells than other layers. Further, the size of the cells 305 may vary, such as based on the size of the functional units of the heat source, but in example implementations, each cell 305 may have a surface area of approximately 100 µm², among other possibilities. Each logical cell 305 may be uniquely identifiable as compared to the other logical cells in a given surface area representation, such as via a single identifier (e.g., an ordinal number) or a set of identifiers (e.g., a row and column coordinate set).

As discussed in further detail below, dividing a photonic cooling device and/or one or more of its layers into logical cells may help to facilitate the functionality of components of the cooling system. For example, dividing the surface of the photonic cooling device into logical cells may allow the optical system 204 to focus light signals at a particular region of the photonic cooling device 201, so that the control system 202 and/or the sensing system 203 can make determinations about the temperature distribution of the heat source and/or derive a plan to cool a particular region of the heat source.

In at least some embodiments, the photonic cooling device 300 is shown to include certain of the example components implemented in the form of layers of a single, integrated structure, such as a sensor layer, a back-reflector layer, an extractor layer, and/or a coupler layer, among other possibilities. However, it should be understood that the embodiments of the photonic cooling device comprising these example layers are merely provided for purposes of illustration and that a photonic cooling device could take various other forms as well. For example, while the embodiments of the photonic cooling device are shown to include a particular arrangement of example layers, the layers of a photonic cooling device could be arranged in various other ways as well-including but not limited to the possibility that certain layers could overlap with one another rather than being stacked into discrete layers (e.g., overlapping extractor and coupler layers), certain layers could be combined together into a single layer, a certain layer could be divided into multiple, separate segments (e.g., a set of multiple extractor segments), and/or certain layers could be excluded from the photonic cooling device (e.g., the back-reflector layer). As another example, while the embodiments of the photonic cooling device are each shown to take the form of a single, integrated structure, it is possible that the components of the photonic cooling device could be physically implemented in some other way (e.g., components distributed across multiple, interconnected plates). The example components of the photonic cooling device could take other forms and be arranged in other manners as well.

Returning to FIG. 2, the control system 202 is generally configured to control the overall operation of the cooling system 200, which may involve the control system 202 (i) sending instructions to the optical system 204 and/or the sensing system 203 and (ii) receiving information from the sensing system 203 and/or the optical system 204. In at least some example embodiments that involve the energy recovery system 206 and/or the dispersion system 207, the control system 202 may send instructions to, and/or receive information from, one or more of those systems.

As described in further detail below, the control system 202 may be configured to perform a variety of functions to facilitate causing the cooling system 200 to cool the heat source 210. For example, the control system 202 may be configured to plan and execute a probing function that causes the optical system 204 to direct idler light signals at the photonic cooling device 201 that in turn outputs information-carrying response light signals to the sensing system 203. As another example, based on information-carrying response light signals detected by the sensing system 203, the control system 202 may be configured to make determinations about one or more characteristics of the heat source 210. As yet another example, based at least on one or more determined heat-source characteristics, the control system 202 may be configured to plan and execute a pumping function that causes the optical system 204 to direct pump signals (e.g., pump light signals) at the photonic cooling device 201 that in turn outputs heat-carrying response light signals, thereby actively cooling the heat source 210 (or preemptively disrupting heat from developing at the heat source 210).

Further, in at least some implementations, the control system 202 may be configured to receive information from the heat source 210. For instance, the control system 202 may be communicatively coupled to the heat source 210 and receive information about the heat source's instruction stream as it arises in the heat source's hardware. For example, in cases where the heat source 210 is a microprocessor, a hardware instruction stream (e.g., from the microprocessor's workload instruction buffer) may provide information about the active layer's present and/or scheduled workload (e.g., information about which functional units are or will be active and when). As described below, the control system 202 may be configured to utilize such information for various purposes to facilitate cooling the heat source 210.

To these ends, the control system 202 may include one or more computing units that enable the control system 202 to perform various functions described herein. Additional details regarding the one or more computing units are described below with respect to FIG. 10.

In some implementations, the control system 202 may include a communication interface that communicatively couples the control system 202 to external devices, such as user devices associated with individuals that manage the operation of a datacenter or the like. In this regard, the communication interface may take the form of a wireless and/or wired data network interface, such as a Wi-Fi, Bluetooth, and/or Ethernet interface.

In practice, the control system 202 can be physically implemented in various locations within the cooling system 200 and/or the environment containing the cooling system 200. For instance, the control system 202 may be integrated into structure and/or hardware that is physically distinct from the photonic cooling device 201 and the heat source 210. For example, in some implementations, the control system 202 may be built into a centralized control system of a datacenter that houses the heat source 210 or it may be embedded within the structure of a particular server (e.g., within the chassis of the server) within a server rack at a datacenter or the structure of a particular server rack at a datacenter, among other examples. As another example, in other implementations, the control system 202 may be embedded in the photonic cooling device 201 or the heat source 210. Other examples are also possible, some of which are described and illustrated herein.

Returning to FIG. 2, the sensing system 203 is generally configured to receive signals that are responsive to input signals (e.g., idler light signals) directed at the photonic cooling device 201. In this regard, the sensing system 203 may be configured to detect information-carrying light signals output by the photonic cooling device 201 to facilitate determining one or more characteristics of the heat source 210, such as the spatial distribution and/or temporal dynamics of the temperature, power, and/or workload of the heat source 210.

In some implementations, the sensing system 203 may be configured to make determinations about one or more characteristics of the heat source 210 based on information-carrying response signals and provide an indication of such determinations to the control system 202. In other implementations, the sensing system 203 may be configured to detect information-carrying response signals and provide those detected signals, or a representation of the signals (e.g., a processed version of raw detected signals), to the control system 202 that in turn makes the determinations about one or more characteristics of the heat source 210.

Further, in at least some cases, the sensing system 203 may be configured to receive information from the control system 202 indicating the control system's probing plan that causes the optical system 204 to direct idler light signals at the photonic cooling device 201. In this way, the sensing system 203 may be able to associate sensed information-carrying response signals with the activities of the optical system 204 and the locations of the photonic cooling device 201 (and thus, the heat source 210) where the idler light signals were directed.

To these ends, the sensing system 203 may include one or more sensors configured to detect response signals output by the photonic cooling device 201, such as one or more light, thermal, and/or temperature sensors. In example implementations, the one or more sensors may take the form of a sensor array (e.g., an IR sensor array) or the like. In some cases, the sensing system 203 may include an FTIR and/or FLIR imaging device. Moreover, the sensing system 203 may be designed to sense response signals to a signal source that emits the signal at a speed in the range of 1 Hz to 300 GHz.

Further, in some implementations, the sensing system 203 may include one or more computing units that enable the sensing system 203 to perform various functions described herein. In some cases, the sensing system 203 may share one or more computing units with the control system 202. Additional details regarding the one or more computing units are described below with respect to FIG. 10. But as noted below, each computing unit includes data storage comprising at least one non-transitory computer-readable medium.

In example implementations, data storage of the sensing system 203 may contain a representation of one or more of the layers of the photonic cooling device 201 (e.g., a map that provides the logical cells of the layers of the photonic cooling device 201 as shown in FIG. 3B) and/or a representation of the heat source 210 (e.g., a map that provides the locations of functional units). The sensing system 203 may also include one or more pre-trained models, each of which takes as input one or more information-carrying response signals and outputs one or more determinations about the heat source 210, such as a determined representation of an existing spatial characteristic of the heat source 210 or a prediction regarding a spatial or temporal characteristic of the heat source 210 in the future (e.g., 10 s to 100 s of ms in the future). In some cases, the one or more pre-trained models may be recursively updated based on the outcome of executing a pump plan derived by the control system 202 at least in part using a prior output of the one or more pre-trained models.

In some implementations, instead of or in addition to being configured to sense response signals to idler light signals directed at the photonic cooling device 201, the sensing system 203 may be configured to (i) sense reflected pump signals directed at the photonic cooling device 201 and/or up-converted signals output by the photonic cooling device 201 and (ii) base a determination about one or more characteristics of the heat source 210, such as the spatial distribution and/or temporal dynamics of the temperature, power, and/or workload of the heat source 210, at least in part on such sensed signals. Further, in some implementations, the sensor layer of the photonic cooling device 201 and/or the idler light beams that the optical system 204 (discussed in further detail below) is configured to output may constitute part of the sensing system 203. Further yet, in some implementations, the sensing system 203 may be communicatively coupled to the heat source 210 and configured to provide feedback to the heat source 210 regarding one or more characteristics of the heat source 210 that were sensed by the sensing system 203, which may allow the heat source 210 to, in real-time, optimize its workload distribution.

Returning to FIG. 2, the optical system 204 and optical network 205 are generally configured to direct light signals at the photonic cooling device 201 in accordance with instructions from the control system 202 and to guide light signals away from the photonic cooling device 201. In example implementations, the optical system 204 is configured to direct different types of light signals via the optical network 205 at the photonic cooling device 201, such as idler light signals and pump light signals.

In general, an idler light signal is a probe light signal intended to gather information about the heat source 210, such as information about the spatial distribution and/or temporal dynamics of the temperature, power, and/or workload in the active region of the heat source 210. To this end, an idler light signal may be tuned (e.g., via selection of wavelength) to be transmitted through the bulk material of the photonic cooling device 201 (e.g., Silicon) and/or the bulk material of the heat source 210 (e.g., semiconductor substrate) and to interact with the temperature distribution of the heat source 210 directly or via the sensor layer of the photonic cooling device 201. In turn, by virtue of thermal localizations in the heat source 210 generating localized changes to an observable state (e.g., the index of refraction) of the sensor layer of the photonic cooling device 201, the idler light signal can generate an information-carrying response signal (e.g., a reflected signal) indicative of spatial and/or temporal characteristics of the thermal localizations as they form. In at least some cases, an idler light signal may be a low power signal (e.g., in the u Watt to low milli-Watt range).

A pump light signal generally is a light signal intended to invoke up-conversion within the photonic cooling device 201 to draw heat away from the heat source 210. To this end, a pump light signal may be tuned to be transmitted through the bulk material of the photonic cooling device 201 (e.g., Silicon) and to invoke up-conversion within the extractor layer of the photonic cooling device 201. As discussed in further detail below, the optical system 204 may be configured to tune the pump light signal by adjusting one or more operating conditions related to the pump light signal based on an information-carrying response signal about the heat source 210. In turn, by virtue of up-conversion within the photonic cooling device 201, the pump light signal can generate a heat-carrying response signal that is expelled by the photonic cooling device 201. In some cases, the heat-carrying response signal can also be utilized as an information-carrying response signal that can be used to infer spatial and/or temporal temperature characteristics of the heat source 210.

To these ends, the optical system 204 may include one or more sources of light signals, such as one or more laser devices or other light sources. Each laser device may be a vertical cavity surface-emitting laser (VCSEL), a semiconductor (diode) laser, a solid-state laser, a fiber laser, a gas-based laser, or a quantum-cascade laser, among other possible laser types. A Q-switched laser is one specific laser that might be used. Further, each laser device may be configured to output light at one or more predefined wavelengths or wavelength ranges, such as near-infrared wavelengths (e.g., 0.7 to 5 µm), mid-infrared wavelengths (e.g., 8 to 14 µm), or infrared wavelengths (e.g., 20 to 100 µm), among other possibilities.

In example implementations, the optical system 204 may include a first light source (e.g., a first laser device) configured to output idler light signals and a second light source (e.g., a second laser device) configured to output pump light signals. In other implementations, the optical system 204 may include a single light source configured to output both idler and pump light signals.

Moreover, in example implementations, the optical system 204 may include one or more computing units that enable the optical system 204 to perform various functions described herein. In some cases, the optical system 204 may share one or more computing units with the control system 202 and/or the sensing system 203. Additional details regarding the one or more computing units are described below with respect to FIG. 10.

Further still, in example implementations, the optical system 204 may include one or more beam steering devices that generally enable the optical system 204 to direct light signals at a particular region of the heat source 210 (via the photonic cooling device 201), which may involve directing light signals to a particular optical channel of the optical network 205. In some cases, a beam steering device may take the form of an optical phased array, other photonic-beam-steering device, or a mechanical-beam-steering device, among other possibilities.

In general, the optical network 205 comprises one or more optical channels, such as the input and output optical channels 205a, 205b, that are configured to guide light signals from one location in the cooling system 200 to another location. In some cases, a single optical channel may be configured to handle both input and output light signals simultaneously.

In practice, an optical channel can take various forms, such as one or more optical fibers, waveguides, and/or line-of-sight optics, among other possibilities. Further, one optical channel of the optical system 204 may take a different form (e.g., bundle of fibers) than the form of another optical channel of the optical system 204 (e.g., waveguide).

For example, the input optical channel 205a may comprise (i) one or more waveguides for guiding idler light signals to the photonic cooling device 201, (ii) one or more optical fibers for guiding pump light signals to the photonic cooling device 201, and/or (iii) one or more waveguides on the photonic cooling device 201 to guide pump light signals to particular regions corresponding to hot spots. Moreover, as an example, the output optical channel 205b may comprise (i) one or more waveguides for guiding information-carrying light signals and/or up-converted and reflected pump lights signals out of the photonic cooling device 201 and/or (ii) one or more optical fibers to guide up-converted pump lights signals out of the photonic cooling device 201 to the energy recovery system 206 and/or the dispersion system 207.

In some cases, the photonic cooling device 201 may be optically coupled to the optical network 205 according to a given coupling scheme, such as a far-field (e.g., far-field fiber), near-field (e.g., near-filed waveguide), or integrated channel (e.g., integrated waveguide) coupling scheme, among other possibilities.

Further, each optical channel may comprise a diameter dimension. In example implementations, an optical channel may have a diameter in the range of 20 µm to 1 mm, among other possibilities. Further still, in example implementations, each optical channel may support a particular optical-power range, such as 1 kW to 100 KW per photonic cooling device, among other possibilities.

Additionally, in example implementations, an optical channel may comprise Silicon Dioxide ($SiO_2$) and/or other glass host, such as Borate, Silicate, Phosphate, Germinate, Tellurate, Fluoride, and Chalcogenide, among other possibilities.

In some cases, one or more lights sources of the optical system 204 and/or one or more optical channels of the optical network 205 may be built into the photonic cooling device 201. For example, an array of surface-emitting lasers may be directly integrated into the photonic cooling device 201. As another example, the coupler layer of the photonic cooling device 201 may be integrated into one or more of the optical channels of the optical network 205.

Further, in some cases, the optical network 205 may comprise one or more optical switches, each being configured to open and close a respective one or more optical channels. In this way, the optical network 205 may be configured to utilize optical switching to localize light signals (e.g., pump light signals) from one or more light sources (e.g., a single pump light source) to a particular region of the photonic cooling device 201 (e.g., a region corresponding to a hot spot). Other possibilities also exist.

Returning to FIG. 2, the cooling system 200 may optionally comprise the energy recovery system 206 that is generally configured to capture up-converted light signals output by the photonic cooling device 201 and thereby recover power from the heat dissipated from the heat source 210. In example implementations, the energy recovery system 206 may be configured to perform one or more light processing functions to facilitate this functionality, such as aggregating, collimating, and/or focusing the up-converted light signals output by the photonic cooling device 201.

To these ends, the energy recovery system 206 may comprise one or more energy cells, such as one or more photovoltaic, thermophotovoltaic, or thermoelectric cells, and/or may comprise one or more fluid-flow based energy systems (e.g., boiler or generator systems).

Moreover, in example implementations, the energy recovery system 206 may be configured to provide recovered power to one or more consumers and include the necessary electrical connections to such consumers. For example, the energy recovery system 206 may be configured to feedback the recovered power to one or more systems of the cooling system 200, such as the optical system 204 or the control system 202. As another example, the energy recovery system 206 may be configured to provide recovered power to the heat source 210 (e.g., to power microprocessors) or the photonic cooling device 201 or a component associated thereto (e.g., an auxiliary fan, chiller, working-fluid pump, or the like). As yet another example, the energy recovery system 206 may be configured to provide recovered power to a consumer external to the cooling system 200, such as the power system of the datacenter housing the heat source 210 or the main electrical grid, among other possibilities. Other consumers of power recovered by the energy recovery system 206 are also possible.

Returning to FIG. 2, the cooling system 200 may optionally comprise the dispersion system 207 that is generally configured to direct up-converted light signals output by the photonic cooling device 201 away from the server, rack, room, and/or datacenter where the heat source 210 is located, such as to the outside environment or outer space. In example implementations, the dispersion system 207 may be configured to perform one or more light processing functions to facilitate this functionality, such as aggregating and/or collimating the up-converted light signals output by the photonic cooling device 201.

To these ends, the dispersion system 207 may include one or more lenses (e.g., an array of lenses with diameters in the range of 0.1 to 1 m) and utilize free-space or line-of-sight optics to direct up-converted and/or waste light away from the cooling system 200 (e.g., at a cold point in the sky).

Figure 4:
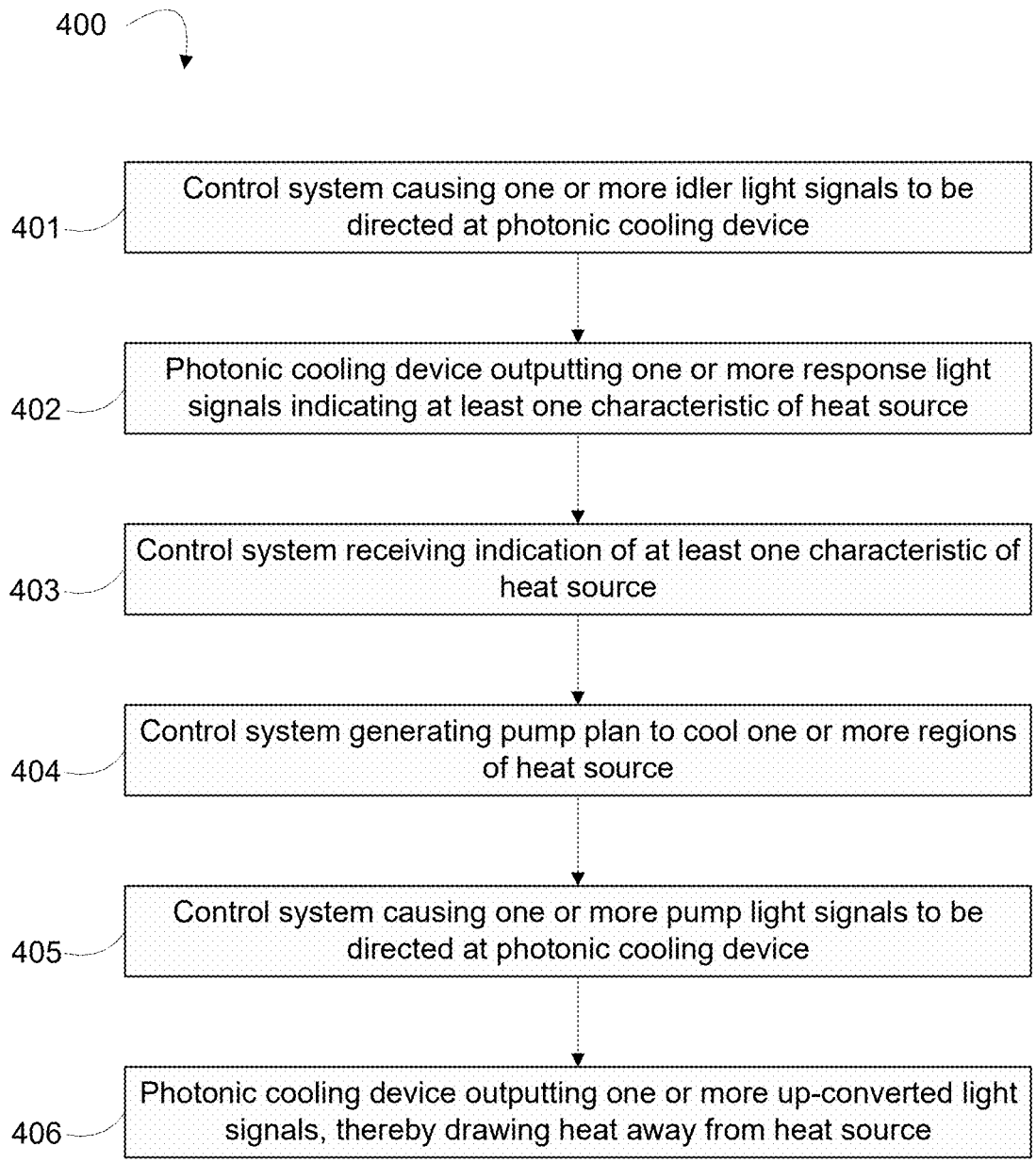
FIG. 4 is a flow diagram comprising an example set of functions to be performed to facilitate cooling a heat source.
Figure 5A:
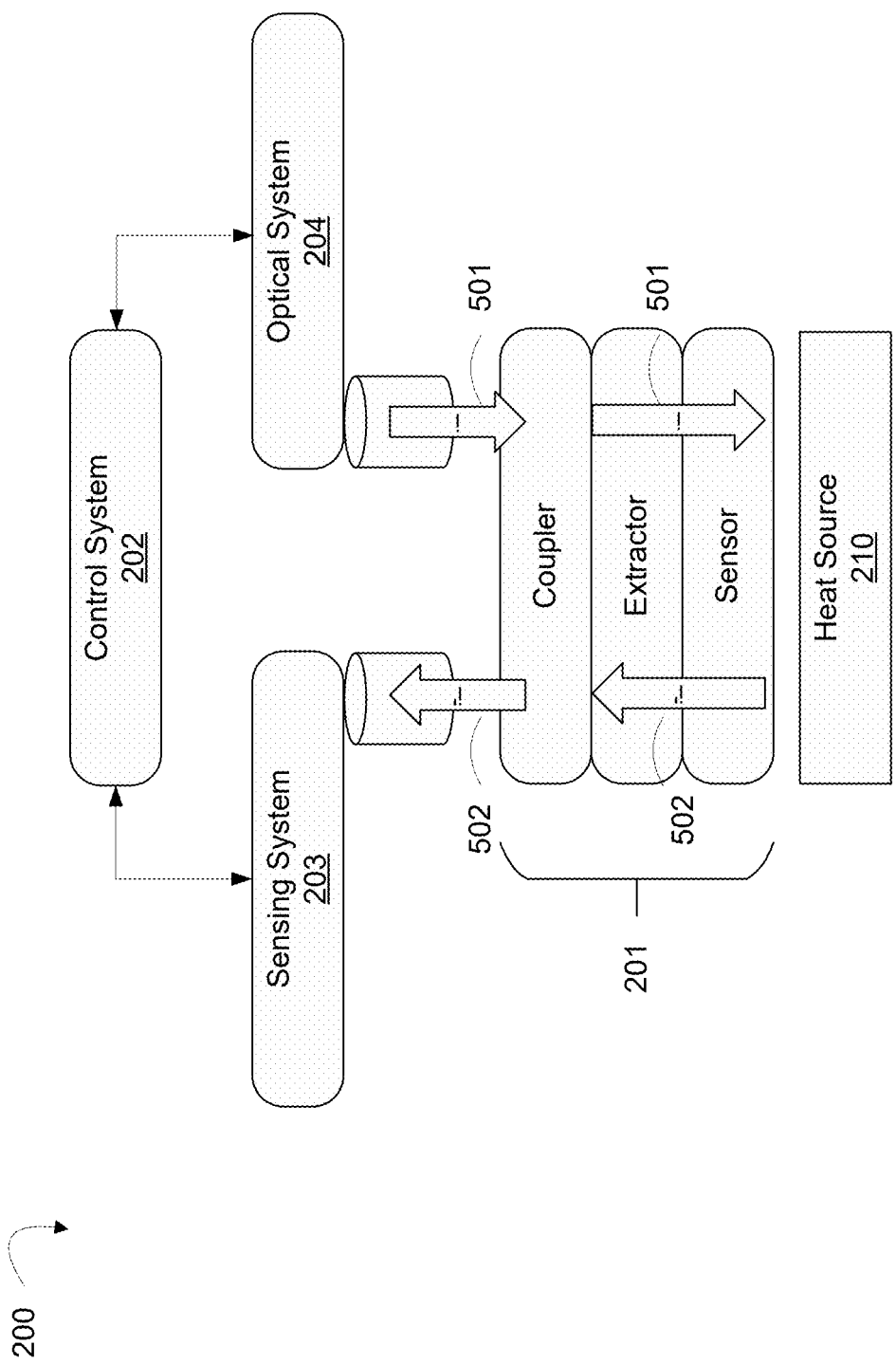
FIG. 5A shows the cooling system of FIG. 2 as some of the functions of FIG. 4 are performed.
Figure 5B:
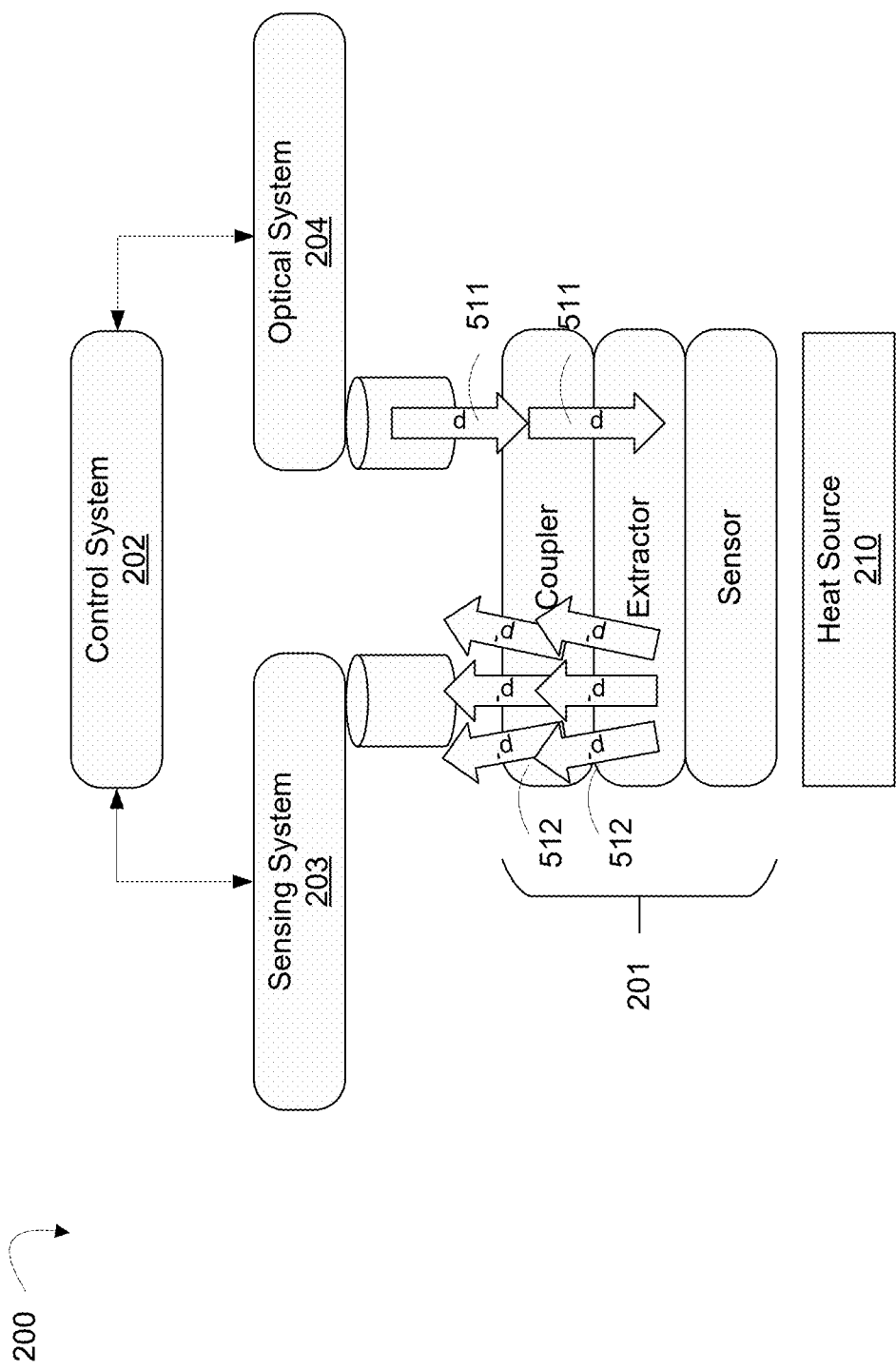
FIG. 5B shows the cooling system of FIG. 2 as other of the functions of FIG. 4 are performed.

Turning now to FIG. 4, depicted is a flow diagram 400 comprising an example set of functions that may be performed to facilitate cooling a heat source. To help illustrate these functions, FIGS. 5A and 5B depict the cooling system 200 of FIG. 2 as certain of the functions of FIG. 4 are performed.

For purposes of illustration, the example functions of the flow diagram 400 are described as being carried out by the control system 202 and photonic cooling device 201 disclosed herein, but it should be understood that the example functions may be carried out by other systems and/or devices capable of carrying out the disclosed cooling technologies. Further, it should be understood that the example functions of the flow diagram 400 are merely described in this manner for the sake of clarity and explanation and that the example functions may be implemented in various other manners, including the possibility that functions may be added, removed, rearranged into different orders, combined into fewer blocks, and/or separated into additional blocks depending upon the particular example.

At block 401 of FIG. 4, the control system 202 causes one or more idler light signals to be directed at the photonic cooling device 201. For instance, as shown in FIG. 5A, the control system 202 causes the optical system 204 to send one or more idler light signals 501 to the photonic cooling device 201 that then pass through the coupler and extractor layers of the photonic cooling device 201 and reach its sensor layer.

In example implementations, the control system 202 causes the optical system 204 to direct one or more idler light signals at the photonic cooling device 201 in accordance with a probing plan defined by the control system 202 to identify one or more characteristics of the heat source 210, such as the spatial distribution and/or temporal dynamics of the temperature, power, and/or workload of the heat source 210.

In general, a probing plan is a defined strategy for gathering information about the heat source 210, which the control system 202 can deploy to the optical system 204 to execute via one or more instructions. In example implementations, a probing plan may comprise one or more probing parameters including (i) one or more idler wavelengths, (ii) an idler path, and/or (iii) one or more idler times, among other example probing parameters.

An idler wavelength specifies a wavelength of an idler light signal that is to be directed at the photonic cooling device 201. In example implementations, an idler wavelength may be selected so that an idler light signal can pass through the bulk material of the photonic cooling device 201 and/or the bulk material of the heat source 210 and interact with the temperature distribution of the heat source 210 directly or via the sensor layer of the photonic cooling device 201.

Figure 3C:
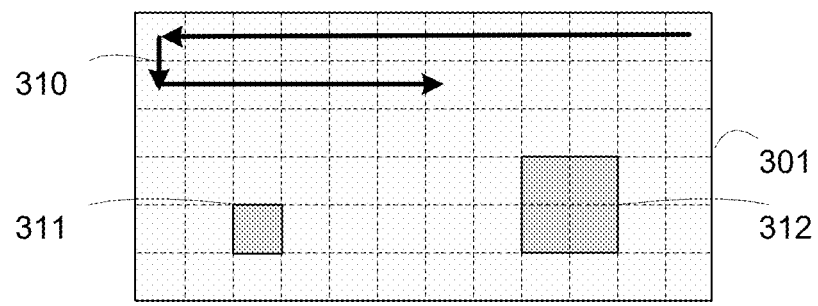
FIG. 3C provides a conceptual illustration of example aspects of a probing plan and a pump plan.

An idler path identifies how idler light is to traverse the photonic cooling device 201 or a portion thereof. In example implementations, an idler path may be defined by a sequence of logical cells that correspond to the surface area of the photonic cooling device 201 and/or its layers, such as the logical cells shown in FIG. 3B. FIG. 3C provides a conceptual illustration of at least the start of an idler path (represented by path arrows 310) across the logical cells from FIG. 3B. In this example, the idler path 310 would cause the optical system 204 to start directing idler light at the upper right cell and then traverse idler light over to the upper left cell and then downward to the next row of cells in an S-shape until each cell has been traversed. Numerous other example idler paths are also possible.

An idler time specifies how long idler light is to be directed at a particular region of the photonic cooling device 201. In example implementations involving an idler path, each logical cell of the idler path may have an associated idler time, where each associated idler time could be the same or some associated idler times may differ from other associated idler times. An idler time may be on the order of milliseconds or microseconds, among other possibilities.

Various other probing parameters may be included as part of a probing plan.

In general, the optical system 204 executes a probing plan received from the control system 202 by adjusting one or more operating conditions of a source of idler light (e.g., an idler laser) in accordance with the probing parameters of the probing plan, which results in one or more idler light signals being directed at the photonic cooling device 201.

Returning to FIG. 4, at block 402, based on receiving one or more idler light signals, the photonic cooling device 201 outputs one or more response light signals indicating at least one characteristic of the heat source 210. For instance, as shown in FIG. 5A, in response to one or more idler light signals 501 interacting with the sensor layer of the photonic cooling device 201 that serves as the interface to the heat source 210, the sensor layer emits one or more information-carrying light signals 502 that are guided out through the extractor and coupler layers of the photonic cooling device 201 for receipt by the sensing system 203. As described before, due to the sensor layer's phase-change medium, temperature variations in the heat source 210 alter one or more observable qualities (e.g., the reflection spectrum) of the received idler light signals, thereby encoding information in the responsive light signals about one or more characteristics of the heat source 210.

Back at FIG. 4, at block 403, the control system 202 receives an indication of at least one characteristic of the heat source 210 that is physically coupled to the photonic cooling device 201. The control system 202 receiving such information helps identify the existence of, or predict the future development of, one or more hot spots within the heat source 210. In practice, this functionality may be performed in various manners.

As a first possible manner, the sensing system 203 may be configured to (i) determine one or more characteristics of the heat source 210 and then (ii) provide the control system 202 an indication of those one or more determined characteristics. In some cases, the sensing system 203 bases such determinations on some or all of (i) information-carrying response signals from the photonic cooling device 201 that the sensing system 203 detects, (ii) the probing plan defined by the control system 202 and executed by the optical system 204, (iii) a representation of the surface area of the photonic cooling device 201 and/or some of its layers (e.g., a map of the sensor layer), and/or (iv) a representation of the heat source 210 that identifies the locations of its heat producing components, among other possibilities.

In example implementations, a determined characteristic of the heat source 210 can take various forms, such as a determined spatial distribution of temperature, power, or workload of the heat source 210 or determined temporal dynamics of temperature, power, or workload of the heat source 210, among other possibilities.

In general, a determined spatial distribution of a particular characteristic of the heat source 210 (e.g., temperature, power, or workload) may take any form that provides an identification of how the particular characteristic is distributed across the heat source 210 at a given instant in time. As one example, a determined spatial distribution may take the form of a distribution map or the like that corresponds to the surface area of the heat source 210, or an aspect thereof (e.g., the active layer), along with a respective indication of the respective value of the particular characteristic at the various positions within the map at a given instant in time. As particular examples, a determined spatial distribution may take the form of an instantaneous temperature (or heat) map, an instantaneous power-density map, or an instantaneous workload map across the heat source 210, among other possibilities.

In turn, determined temporal dynamics of a particular characteristic of the heat source 210 (e.g., temperature, power, or workload) may take any form that provides an identification of how the particular characteristic of the heat source 210 has evolved over a given period of time (e.g., the past 10 ms or 100 ms). In some cases, determined temporal dynamics of a particular characteristic of the heat source 210 may take any form that provides an identification of how the distribution of the particular characteristic across the heat source 210 has evolved over a given period of time. For instance, determined temporal dynamics may take the form of, or be derived from, a sequence of distribution maps, each corresponding to a particular point in time over a given period of time, among other possibilities.

In example implementations, the sensing system 203 may be configured to determine a characteristic of the heat source 210 in various manners.

As a first possibility, the sensing system 203 may be configured to decode information-carrying response signals into a characteristic of the heat source 210. For instance, an information-carrying response signal may be a reflected version of an idler light signal that has one or more observable qualities that each differs as compared to the original idler light signal that in turn can be translated into a temperature, power, and/or workload reading for the heat source 210. Examples of an observable quality of a response signal that may be utilized to determine a characteristic of the heat source 210 include (i) the manner by which the original idler light signal has been reflected (e.g., due to the index of refraction of the sensor layer of the photonic cooling device 201 changing because of the heat source's temperature variation), (ii) a change in intensity of the original idler light signal, (iii) a change in the wavelength of the original idler light signal, and/or (iv) a change in the polarization of the original idler light signal, among other possibilities. In practice, the sensing system 203 may be configured to determine such a translation based on the received reflected idler light signal and the probing plan that provides information regarding one or more parameters of the original idler light signal. The sensing system 203 may then aggregate determined translations for a plurality of information-carrying response signals into a spatial and/or temporal characteristic of the heat source 210. Similarly, information-carrying response signals may take the form of infrared response signals, and the sensing system 203 may be configured to employ one or more spectrometry processes to translate the infrared response signals into a temperature distribution of the heat source 210.

As a second possibility, the sensing system 203 may comprise one or more pre-trained models, each of which takes as input one or more information-carrying response signals and outputs a determination related to a characteristic of the heat source 210. For instance, the sensing system 203 may have a respective pre-trained model for each spatial distribution characteristic of the heat source (e.g., temperature, power, or workload) that takes as input one or more information-carrying response signals and outputs a respective determined spatial distribution of the heat source 210 (e.g., outputs an instantaneous heat map, an instantaneous power-density map, or an instantaneous workload map across the heat source 210). Likewise, the sensing system 203 may have a respective pre-trained model for each temporal dynamics characteristic of the heat source (e.g., temperature, power, or workload) that takes as input one or more information-carrying response signals from a present point in time along with one or more information-carrying response signals from one or more past points in time and outputs a respective determined temporal dynamics of the heat source 210.

Depending on the implementation, some characteristics of the heat source 210 may be directly determined by signals sensed by the sensing system 203 (e.g., the spatial distribution of temperature) and/or by the information of the heat source's hardware instruction stream (e.g., the spatial distribution of workload). Further, on the other hand, some characteristics of the heat source 210 may be indirectly determined by signals sensed by the sensing system 203 and/or by the information of the heat source's hardware instruction stream, such that the control system 202 or sensing system 203 infers such characteristics. For example, in some cases, the spatial distribution of power of the heat source and/or of workload of the heat source 210 may be inferred, based at least in part on, signals sensed by the sensing system 203 that directly indicate the spatial distribution of temperature of the heat source 210. As another example, in some cases, the spatial distribution of power of the heat source and/or of temperature of the heat source 210 may be inferred, based at least in part on, information of the heat source's hardware instruction stream that directly indicates the spatial distribution of workload of the heat source 210. Other possibilities also exist.

Returning to block 403, as another possible manner by which the control system 202 receives an indication of at least one characteristic of the heat source 210, the sensing system 203 may detect information-carrying response signals from the photonic cooling device 201 and provide those signals to the control system 202 that reflect one or more characteristics of the heat source 210 for the control system 202 to determine.

The control system 202 may determine the one or more characteristics of the heat source 210 in the same manner as described above for the sensing system 203. However, in some cases, the control system 202 may base its determination of the one or more characteristics of the heat source 210 on information that may not be available to the sensing system 203. For example, such additional information may come from a workload instruction buffer of the heat source 210 and take the form of a hardware instruction stream that provides information about the heat source's active layer's present and/or scheduled workload (e.g., information about which functional units are or will be active and when). This information, independent of, or in addition to, any detected information-carrying response signals from the photonic cooling device 201, may allow the control system 202 to infer one or more present or future characteristics of the heat source 210, such as the spatial distribution and/or temporal dynamics of the temperature, power, and/or workload of the heat source 210. For example, in some cases, the control system 202 may comprise one or more pre-trained models that take as input information of the heat source's hardware instruction stream and output a determination related to a characteristic of the heat source 210.

Returning to FIG. 4, at block 404, based at least on the indication received at block 403, the control system 202 generates a pump plan to cool one or more regions of the heat source 210. In this respect, whether the control system 202 itself determines one or more characteristics about the heat source 210 or receives an indication of such a determination made by the sensing system 203, the control system 202 is configured to identify one or more regions of the heat source 210 for cooling (e.g., one or more regions corresponding to hot spots) and define a pump plan to cool those identified regions.

In practice, the control system 202 may identify one or more regions of the heat source 210 for cooling in various manners.

As one example, this function may involve the control system 202 evaluating the determined one or more characteristics of the heat source 210 and designating any region of the heat source 210 as a region for cooling whose respective value for the determined one or more characteristics satisfies one or more designating conditions.

In example implementations, a designating condition may be a temperature threshold, a power threshold, a workload threshold, a temperature rate of change threshold over a predefined duration of time, a power rate of change threshold over a predefined duration of time, or a workload rate of change threshold over a predefined duration of time, among other possible designating conditions. As one illustrative example, the determined one or more characteristics may comprise the spatial distribution of the temperature at the heat source 210, and the control system 202 may identify one or more regions of the heat source 210 whose temperature is above a given temperature threshold. Additionally or alternatively, as another illustrative example, the determined one or more characteristics may comprise the temporal dynamics of the temperature at the heat source 210, and the control system 202 may identify one or more regions of the heat source 210 whose temperature has increased at or above a predefined number of degrees (e.g., 10 degrees) over a predefined duration of time (e.g., the last 10 ms). In practice, the control system 202 may perform a similar identification of regions for cooling when the determined one or more characteristics comprise the spatial distribution and/or temporal dynamics of power and/or workload of the heat source 210.

Further yet, in example implementations, a designating condition may correspond to an existing condition or a predicted condition. In this regard, as an example, the control system 202 may designate any region of the heat source 210 whose value for the determined one or more characteristics of the heat source 210 (i) presently exceeds a predetermined threshold or (ii) is anticipated to exceed a predetermined threshold in the future (e.g., 10 s to 100 s of ms in the future).

In practice, in cases where a single characteristic of the heat source 210 is determined (e.g., temporal dynamics of power), the control system 202 may designate a region of the heat source 210 as a region for cooling when that region satisfies a single designating condition. In cases where multiple characteristics of the heat source 210 are determined, the control system 202 may designate a region of the heat source 210 as a region for cooling when that region satisfies multiple designating conditions (e.g., an individual designating condition for each of the multiple determined characteristics of the heat source 210) or at least one designating conditions, among other possibilities.

As noted above, after identifying one or more regions of the heat source 210 for cooling, the control system 202 may then define a pump plan that facilitates reactively or proactively cooling those identified regions.

In general, a pump plan is a defined strategy for directing one or more pump light signals at one or more regions of the heat source 210 for cooling, which the control system 202 can deploy to the optical system 204 to execute via one or more instructions. In some instances, a pump plan may be a targeted pump plan that focuses on one or more specific regions of the heat source 210 for cooling. In other instances, a pump plan may be a bulk pump plan that generally covers the entirety (or a large portion) of the heat source 210 for cooling. Yet in other instances, a pump plan may involve a combination of both a targeted pump plan and a bulk pump plan.

In example embodiments, a pump plan may comprise one or more pump parameters that facilitate cooling (e.g., reactively or proactively) the one or more regions of the heat source 210 identified by the control system 202. In practice, the one or more pump parameters may take various forms, including (i) one or more pump wavelengths, (ii) a pump path, (iii) one or more pump times, (iv) one or more pump repetition rates, and (v) one or more pump power parameters, among other example pump parameters.

A pump wavelength specifies a wavelength of a pump light signal that is to be directed at the photonic cooling device 201. In example implementations, a pump wavelength may be selected so that a pump light signal can pass through the bulk material of the photonic cooling device 201 and invoke up-conversion within the extractor layer of the photonic cooling device 201. In some cases, a pump wavelength is on the order of 1 μm, among other possibilities. Further, in example implementations, a pump wavelength may be selected to route a pump light signal to a particular region of the photonic cooling device 201 that corresponds to a region of the heat source 210 that is to be cooled (e.g., in connection with an angle-tunable meta-lens network architecture).

A pump path identifies how pump light is to be directed at one or more regions of the photonic cooling device 201 that correspond to one or more regions of the heat source 210 that are to be cooled. In some instances, a pump path may be defined by an identification of a single logical cell from a plurality of logical cells that corresponds to the surface area of the photonic cooling device 201 and/or its layers, such as the logical cells shown in FIG. 3B. FIG. 3C provides a conceptual illustration of a pump path comprising a single cell 311. In other instances, a pump plan may be defined by an identification of a plurality of logical cells and may also include sequencing by which these cells are targeted. As a more specific example, a pump plan may comprise a grid or other map associated with the heat source 210 made up of a plurality of cells and respective indications of which cells are to be targeted. FIG. 3C provides a conceptual illustration of a pump path comprising a plurality of cells 312.

A pump time specifies how long pump light is to be directed at a particular region of the photonic cooling device 201 that corresponds to a region of the heat source 210 that is to be cooled. In examples where a pump plan includes a multi-cell pump path, the pump plan may also include a pump time per cell or a single pump time applicable to all cells in the pump plan, among other possibilities.

A pump repetition rate identifies how frequently pump light is to be directed at a particular region of the photonic cooling device 201 that corresponds to a region of the heat source 210 that is to be cooled. In examples where a pump plan includes a multi-cell pump path, the pump plan may also include a pump repetition rate per cell or a single repetition rate applicable to all cells in the pump plan, among other possibilities. A pump repetition rate may be on the order of Hz to kHz or kHz to MHz, among other possibilities.

A pump power parameter generally specifies an amount of energy that is to be directed at the photonic cooling device 201. In some instances, a pump power parameter may specify an amount of energy in a single instantaneous pulse of pump light (e.g., an instantaneous peak power) at a given repetition rate. In other instances, a pump power parameter may specify an average amount of energy over a certain amount of time at a given repetition rate. Other pump power parameters are also possible.

Various other pump parameters may be included as part of a pump plan, such as one or more pump bandwidths, one or more pump incident angles, one or more pump focal points, and/or one or more pump polarizations, among other possibilities.

In example implementations, a pump plan may be responsive or predictive, and in other implementations, a pump plan may be partially responsive and partially predictive.

In general, a responsive pump plan is a defined strategy for reactively cooling one or more regions of the heat source 210, where each of the one or more regions corresponds to an already-formed hot spot. In practice, a responsive pump plan may be defined in various manners.

For instance, a responsive pump plan may be defined by the control system 202 based on the determined one or more characteristics of the heat source 210 (e.g., the spatial distribution and/or temporal dynamics of the temperature, power, and/or workload of the heat source 210) and corresponding one or more predetermined steady-state target values for those characteristics (e.g., a steady-state target temperature, power, or workload distribution). Based on the determined characteristics and steady-state target values, the control system 202 may identify a pump plan that cools one or more regions of the heat source 210, each of which presently exhibits at least one determined characteristic value that deviates from the corresponding steady-state target value, to align with the one or more steady-state targets.

Other manners by which a responsive pump plan may be defined are also possible.

On the other hand, in general, a predictive pump plan is a defined strategy for proactively cooling one or more regions of the heat source 210, where each of the one or more regions corresponds to a location where a respective hot spot is expected to form in the future (e.g., 10 s to 100 s of ms in the future). In other words, a predictive pump plan seeks to disrupt a hot spot from forming in the heat source 210 in the first place. In practice, a predictive pump plan may be defined in various manners.

As a first possibility, a predictive pump plan may be defined based on a pre-trained model that takes as input one or more determined characteristics of the heat source 210 (e.g., the spatial distribution and/or temporal dynamics of temperature of the heat source 210) and outputs information regarding the predicted location and/or timing of future formation of one or more hot spots at the heat source 210. From the model's output, the control system 202 may identify a pump plan that pre-cools regions of the heat source 210 that are predicted to develop a hot spot within a particular amount of time in the future.

As a second possibility, a predictive pump plan may be defined based on one or more determined characteristics of the heat source 210 (e.g., the spatial distribution and/or temporal dynamics of temperature of the heat source 210) and corresponding one or more predetermined steady-state target values for those characteristics (e.g., a steady-state target temperature distribution). Based on the determined characteristics and steady-state target values, the control system 202 may identify a pump plan that cools one or more regions of the heat source 210, each of which is expected in the near future to exhibit at least one determined characteristic value that deviates from the corresponding steady-state target value, to preemptively keep alignment with the one or more steady-state targets. In some cases, rather than focus on a specific region, the control system 202 may instead identify a pump plan that cools the heat source 210 in a bulk manner that keeps the determined one or more characteristics within their respective predetermined steady-state targets. In these cases, the pump plan may be agnostic to specific regions where hot spots may develop.

As a third possibility, a predictive pump plan may be defined based at least in part on user-driven feedback. For instance, the control system 202 may receive information from the heat source 210 as a result of user-specified cooling directives defined in the software running on the heat source 210. For example, as computations are performed by the heat source 210, cooling directives defined in the software of the heat source 210 may output an identification of a location of a functional unit or the like that will be used for the computation and/or an indication of an expected amount of power that will be required for the computation to be performed, among other possibilities. In some cases, such user-specified cooling directives may be in accordance with an API. From this information (and perhaps also in view of one or more determined characteristics of the heat source 210), the control system 202 may identify a pump plan that pre-cools regions of the heat source 210 where hot spots are expected to form.

As a fourth possibility, a predictive pump plan may be defined based at least in part on a workload instruction buffer of the heat source 210 that identifies upcoming tasks (e.g., computations), the components of the heat source 210 that are assigned to perform the tasks (e.g., functional units), and/or the timing of when these tasks are scheduled to be performed. Such information may allow the control system 202 to derive a current and/or predicted workload and/or power distribution representation across the heat source 210. From this information (and perhaps also in view of one or more determined characteristics of the heat source 210), the control system 202 may identify a pump plan that pre-cools regions of the heat source 210 where upcoming tasks are expected to be performed (and thus, where hot spots are expected to form).

Other manners by which a predictive pump plan may be defined are also possible, including but not limited to the possibility that a predictive pump plan may be defined based on a combination of one or more of the above-referenced possibilities.

Back at FIG. 4, at block 405, the control system 202 causes one or more pump light signals to be directed at the photonic cooling device 201 in accordance with a pump plan. For instance, as shown in FIG. 5B, the control system 202 causes the optical system 204 to send one or more pump light signals 511 to the photonic cooling device 201 that then pass through the coupler layer and reach the extractor layer of the photonic cooling device 201.

In general, the optical system 204 executes a pump plan received from the control system 202 by adjusting one or more operating conditions of a source of pump light (e.g., a pump laser) in accordance with the pump parameters of the pump plan, which results in one or more pump light signals being directed at the photonic cooling device 201.

Then, at block 406 of FIG. 4, based on receiving one or more pump light signals, the photonic cooling device 201 outputs one or more up-converted light signals, thereby drawing heat away from the heat source 210. For instance, as shown in FIG. 5B, in response to one or more pump light signals 511 interacting with the extractor layer of the photonic cooling device 201 (e.g., that comprises a fluorescent medium), the extractor layer up-converts the one or more pump light signals 511 (e.g., via a fluorescence process) and emits one or more heat-carrying light signals 512 that are guided out through the coupler layer of the photonic cooling device 201.

Although not shown in FIG. 4, one or more additional functions may optionally be performed in connection with cooling a heat source after block 406.

For example, the outcome of executing a pump plan may be used as feedback in various manners to update or refine one or more aspects of the cooling system 200. As a first possibility, the effectiveness or ineffectiveness of a given pump plan in reactively or proactively cooling hot spots in the heat source 210 may result in the control system 202 updating one or more pump parameters in the given pump plan. As another possibility, in implementations that involve a pre-trained model, the effectiveness or ineffectiveness of a given pump plan in reactively or proactively cooling hot spots in the heat source 210 may result in the control system 202 refining a pre-trained model used to derive a predictive pump plan and/or the sensing system 203 refining a pre-trained model that operates on one or more information-carrying response signals sensed by the sensing system 203. Other possibilities also exist.

Figure 5C:
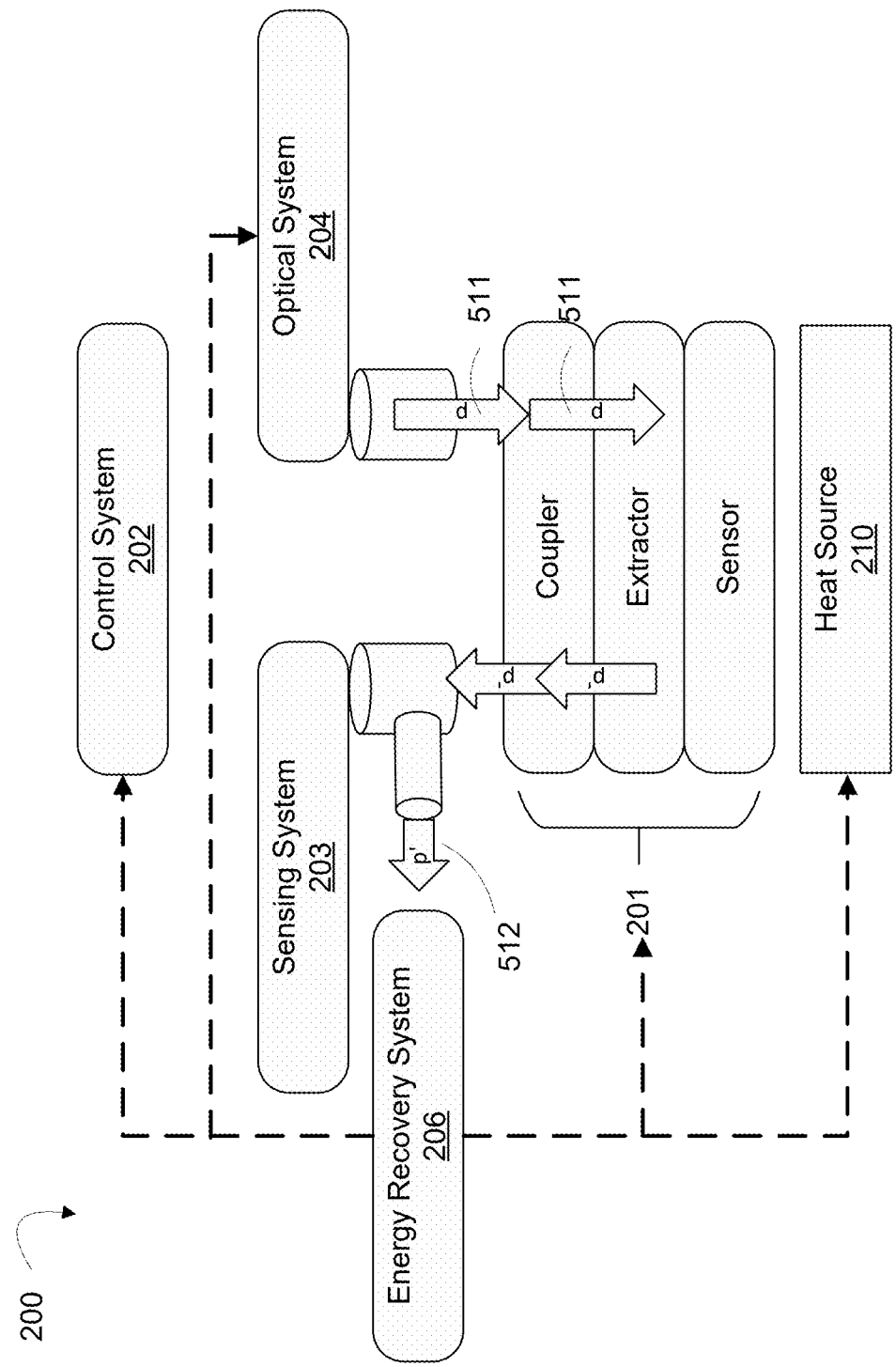
FIG. 5C shows the cooling system of FIG. 2 as optional functions of FIG. 4 are performed.

As other examples of possible functions that may be performed after block 406, some or all of the heat-carrying light signals 512 output by the photonic cooling device 201 may be guided to an energy recovery system and/or dispersion system. In some implementations, the control system 202 may be configured to cause an energy recovery system to route recovered power to one or more consumers, such as the control system 202 itself, the optical system 204 (e.g., to power a pump light source), and/or the heat source 210 (e.g., to power one or more microprocessors), among other possibilities. For example, as shown in FIG. 5C, the energy recovery system 206 receives heat-carrying light signals 512 from the photonic cooling device 201, recovers power from those signals, and then routes that recovered power to one or more consumers. Further, the control system 202 may be configured to cause a dispersion system to direct heat-carrying light signals 512 output by the photonic cooling device 201 away from the cooling system 200.

Other additional functions that may be performed after block 406 are possible as well.

The example components of the cooling system 200 may take various forms and be arranged in various ways. In practice, the form and/or arrangement of the various example components of the cooling system 200 may depend on the application for which the cooling system 200 is designed.

Figure 6A:
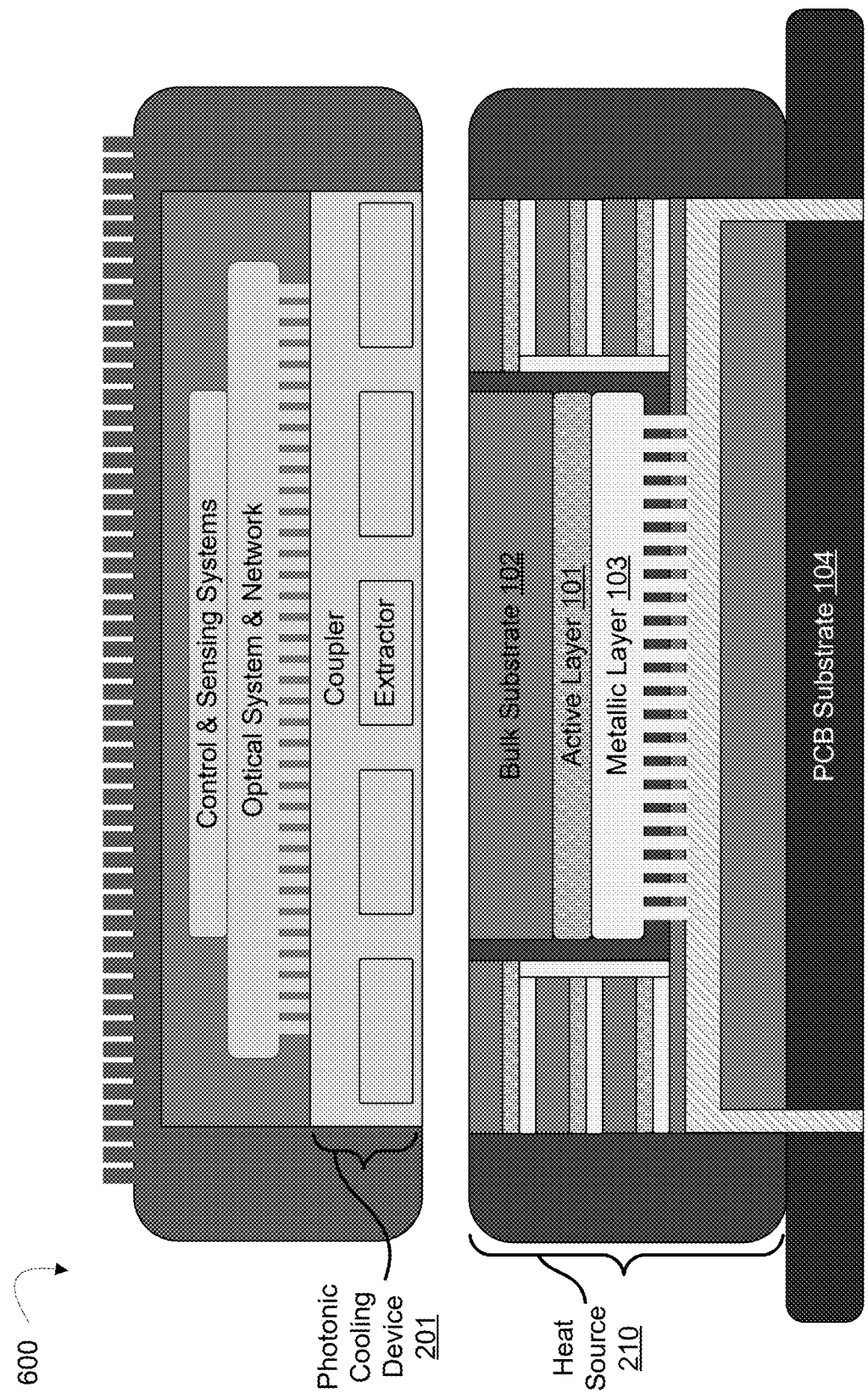
FIG. 6A is a simplified block diagram of an example fully-segregated configuration.

For example, the photonic cooling device 201 (and the other components of the cooling system 200) may be physically separate from the heat source 210. FIG. 6A provides a simplified block diagram of an example fully-segregated configuration 600 in which the photonic cooling device 201, control system 202, sensing system 203, and optical system 204 and optical network 205 are all separate from and external to the heat source 210. It should be noted that the depicted gap between the heat source 210 and components of the cooling system 200 is not to scale and shown merely for purposes of highlighting the distinction between the components of the cooling system 200 and the heat source 210. As a variation to the example configuration 600 shown in FIG. 6A, (i) the pump light source of the optical system 204 could be separate from and external to the photonic cooling device 201, control system 202, sensing system 203, remainder of the optical system 204, optical network 205, and heat source 210, and/or (ii) the photonic cooling device 210 could be separate from and external to the control system 202, sensing system 203, optical system 204, optical network 205, and heat source 210, among other possible variations.

Figure 6B:
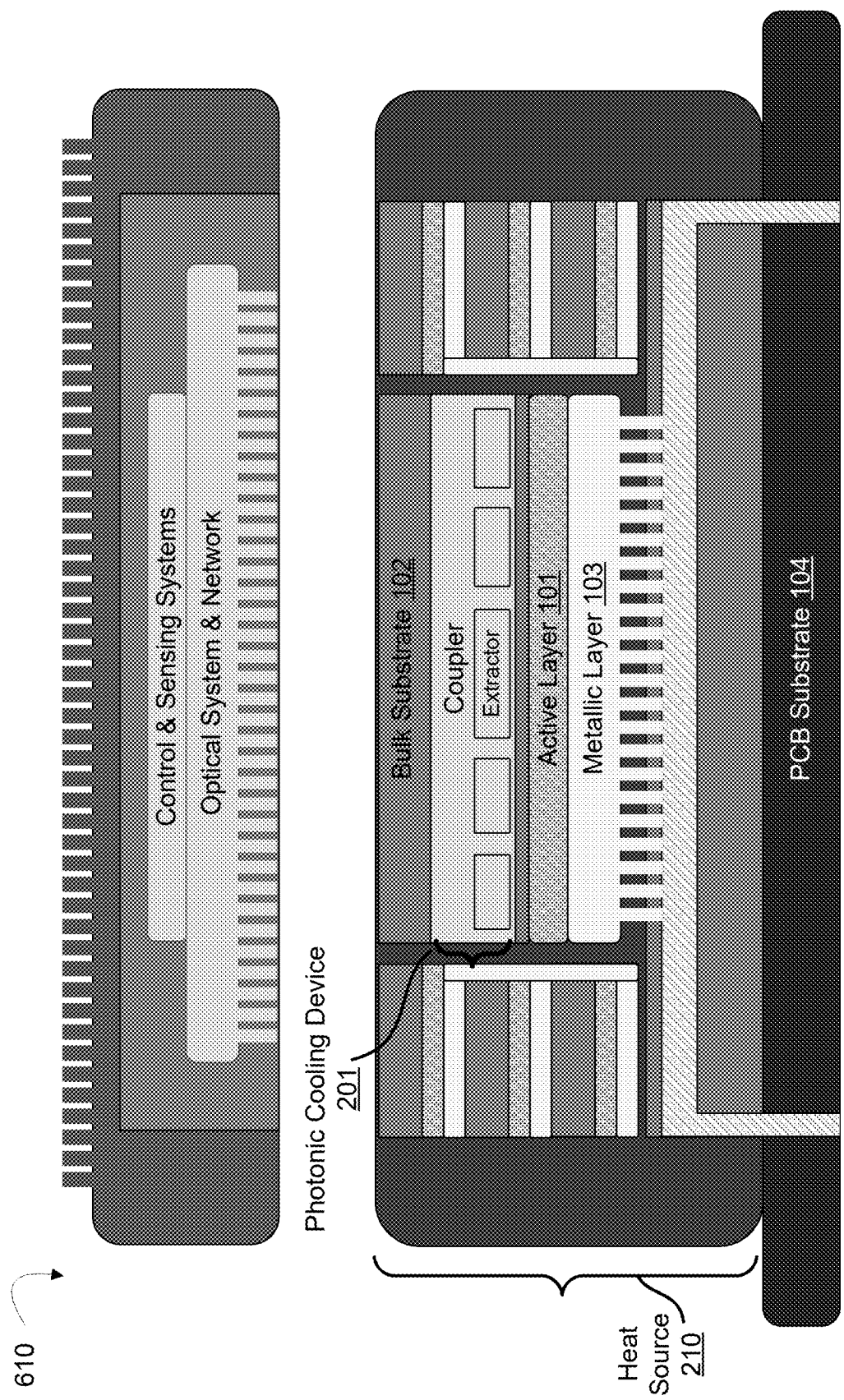
FIG. 6B is a simplified block diagram of an example partially-integrated configuration.
Figure 6C:
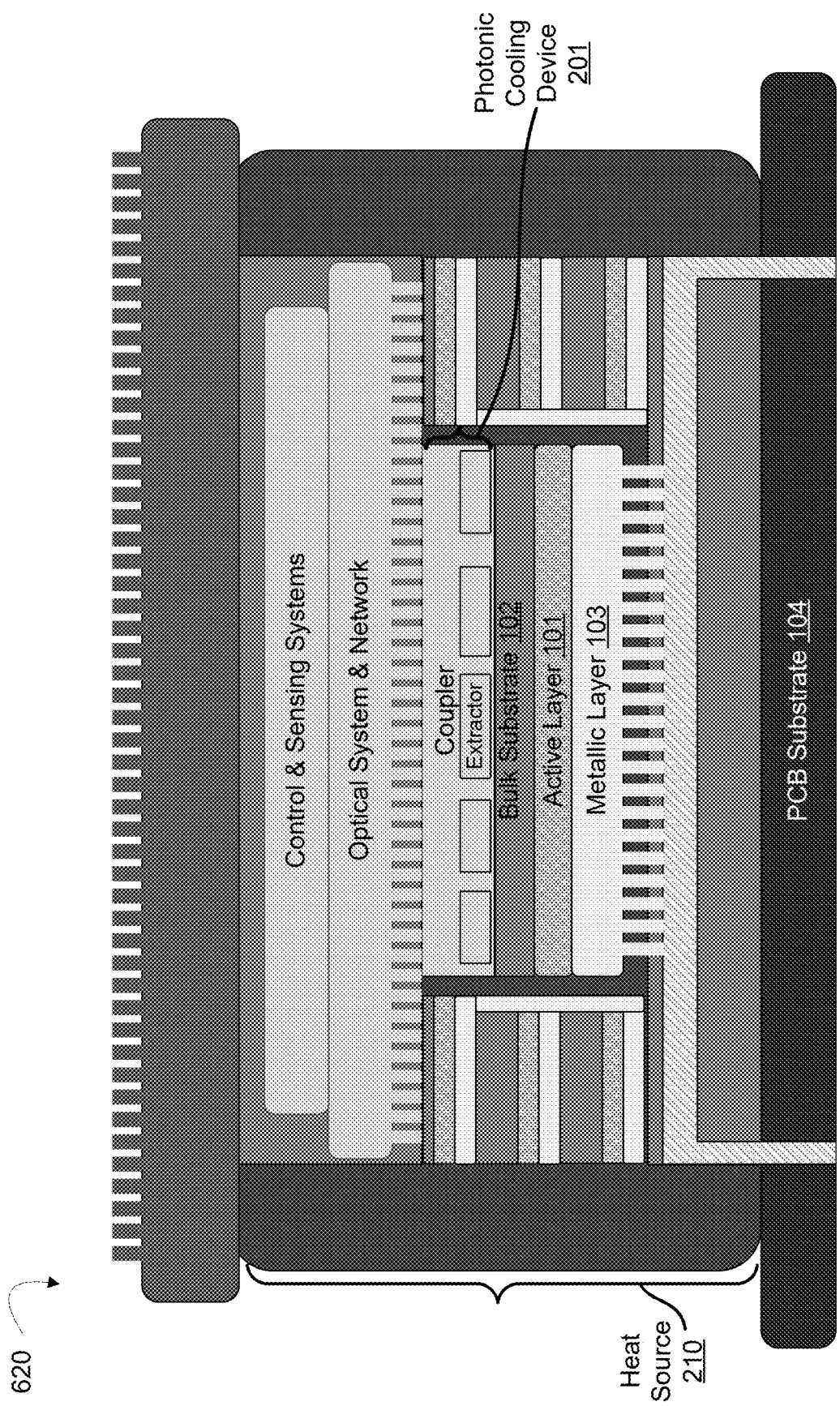
FIG. 6C is a simplified block diagram of an example fully-integrated configuration.

As another example, the photonic cooling device 201 (and/or other components of the cooling system 200) may be fully- or partially-integrated into the heat source 210. FIG. 6B provides a simplified block diagram of an example partially-integrated configuration 610 in which the photonic cooling device 201 is integrated into the heat source 210 while other components of the cooling system 200 (e.g., control system 202, sensing system 203, and optical system 204) are separate from the heat source 210. FIG. 6C provides a simplified block diagram of an example fully-integrated configuration 620 in which the components of the cooling system 200 are all integrated into the heat source 210.

As another example of the different forms and/or arrangements that the cooling system 200 may take, the cooling system 200 may be integrated at various scales into the infrastructure of a datacenter or the like that hosts the heat source for which the cooling system 200 is designed to cool. In this regard, in example implementations, the integration of the cooling system 200 may be at a heat-source scale (e.g., "chip scale"), a server scale, or a server-rack scale, among other possibilities.

Figure 7A:
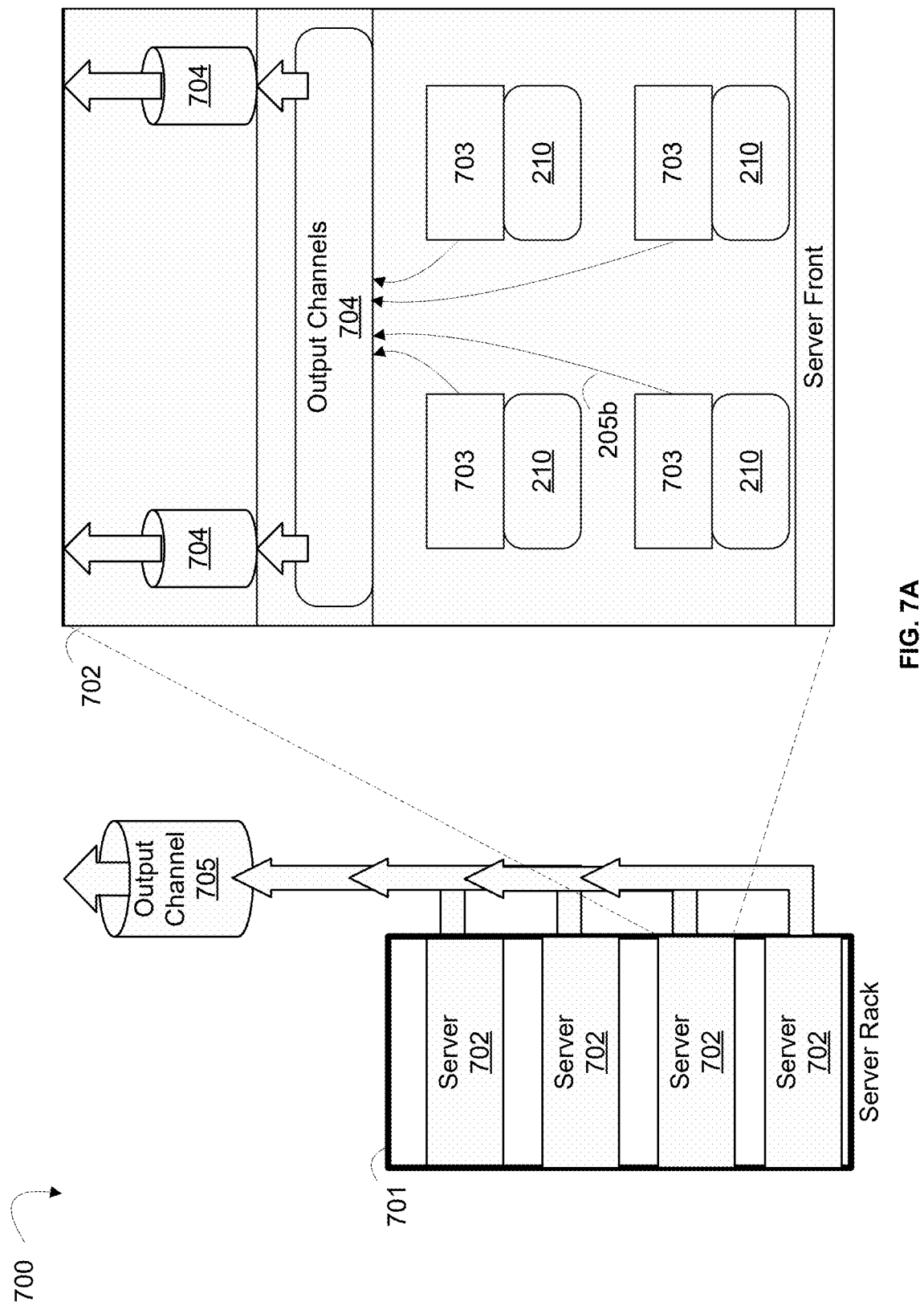
FIG. 7A is a simplified block diagram of an example configuration of a heat-source-scale integration of the cooling system.

FIG. 7A provides a simplified block diagram of an example configuration 700 of a heat-source-scale integration of the cooling system 200. As shown, a server rack 701 contains a plurality of servers 702, each of which contains a plurality of heat sources 210 (e.g., GPUs and CPUs), and each heat source 210 has a corresponding set of components 703 of the cooling system 200. In this example, each set of cooling system components 703 includes the photonic cooling device 201, the control system 202, the sensing system 203, the optical system 204, and the optical channels 205a, 205b. The respective output optical channel 205b of each set of cooling system components 703 interfaces with one or more server-output optical channels 704 that in turn feeds into one or more rack-output optical channels 705.

Figure 7B:
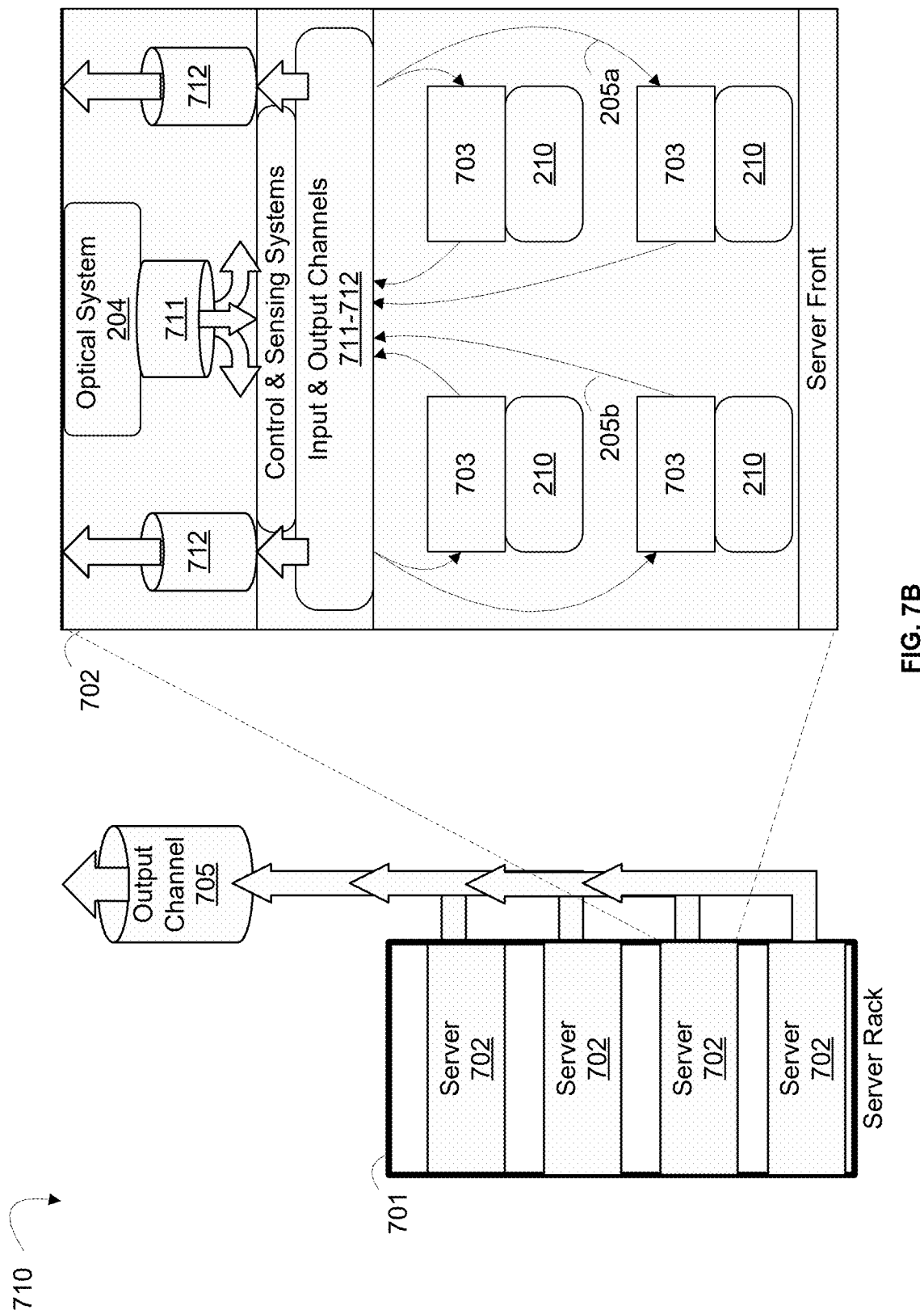
FIG. 7B is a simplified block diagram of an example configuration of a server-scale integration of the cooling system.

FIG. 7B provides a simplified block diagram of an example configuration 710 of a server-scale integration of the cooling system 200. As shown, the server rack 701 comprising the plurality of servers 702 and expanded view of the server 702 from FIG. 7A is reproduced. Further, in this example, at least a pump light source of the optical system 204 is integrated into each server 702 (e.g., the chassis of the given server 702), where that pump light source directs pump light signals at the heat sources 210 of the given server 702 via one or more server-input optical channels 711. In turn, the set of cooling system components 703 for each heat source 210 includes at least the photonic cooling device 201 and the optical channels 205a, 205b. The respective input optical channel 205a of each set of cooling system components 703 interfaces with the one or more server-input optical channels 711. The respective output optical channel 205b of each set of cooling system components 703 interfaces with one or more server-output optical channels 712 that in turn feeds into one or more rack-output optical channels 705.

In some instances, a respective control system 202 and sensing system 203 may be integrated into each set of cooling system components 703, where the respective control system 202 and sensing system 203 are responsible for a respective heat source 210. In other instances, a single control system 202 and sensing system 203 may be integrated into the given server 702, where the single control system 202 and sensing system 203 are responsible for all heat sources 210 within the given server 702. While in further instances, the control system 202 and the sensing system 203 may be integrated in a distributed manner across each set of cooling system components 703 and/or the infrastructure of the given server 702.

Figure 7C:
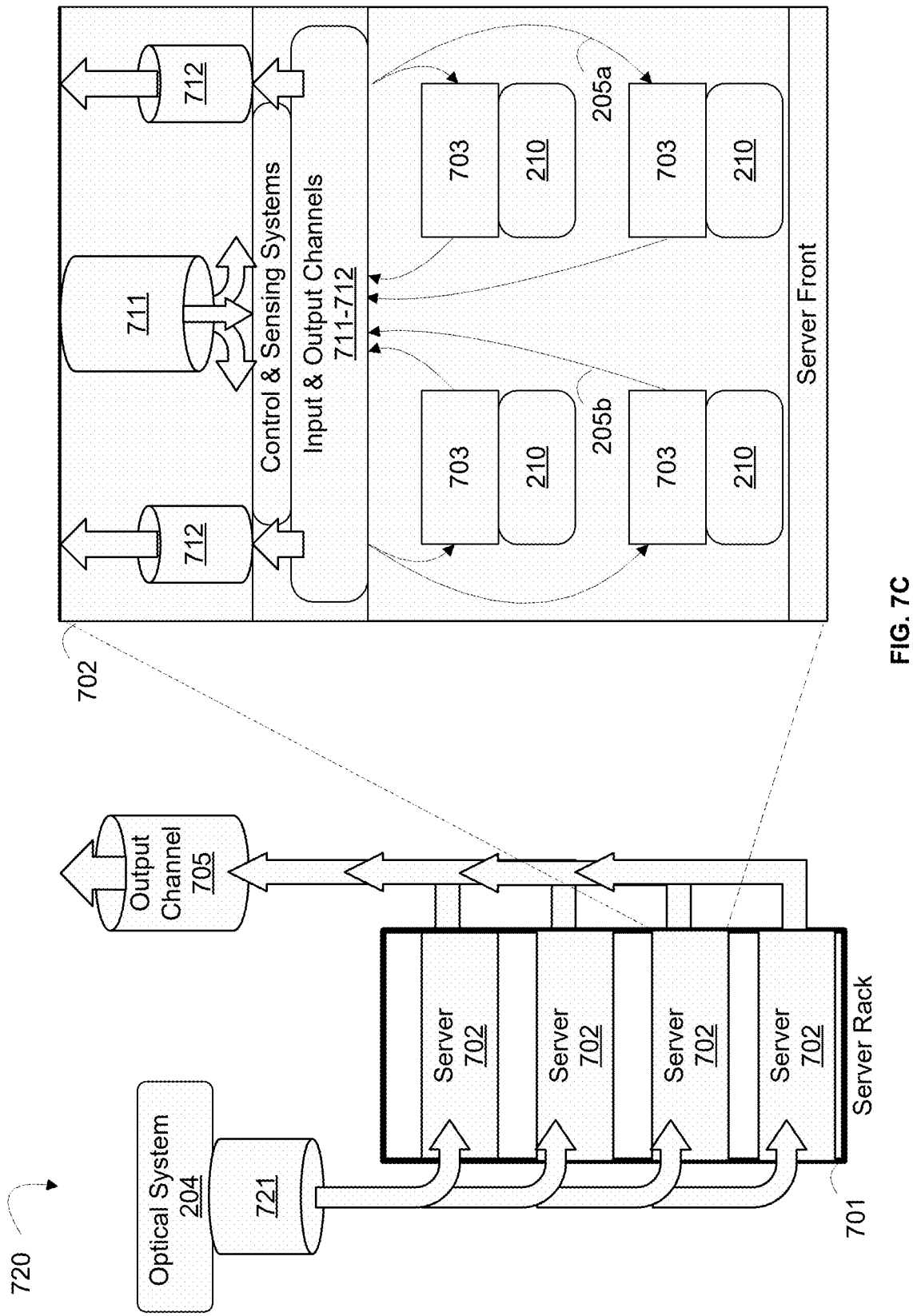
FIG. 7C is a simplified block diagram of an example configuration of a server-rack-scale integration of the cooling system.

FIG. 7C provides a simplified block diagram of an example configuration 720 of a server-rack-scale integration of the cooling system 200. As shown, the example configuration 720 is similar in several respects to the example configuration 710 of FIG. 7B. However, in this example, at least the pump light source of the optical system 204 is integrated into the server rack 701, where that pump light source distributes pump light signals to the various servers 702 via one or more rack-input optical channels 721 that feed pump light signals to the heat sources 210 of each server 702 via a respective one or more server-input optical channels 711.

Further, as with the example configuration 710 of FIG. 7B, the control system 202 and sensing system 203 of the example configuration 720 may be integrated in various manners. In some instances, a respective control system 202 and sensing system 203 may be integrated into each set of cooling system components 703, where the respective control system 202 and sensing system 203 are responsible for a respective heat source 210. In other instances, a single control system 202 and sensing system 203 may be integrated into each server 702, where the single control system 202 and sensing system 203 are responsible for all heat sources 210 within the given server 702. In further instances, a single control system 202 and sensing system 203 may be integrated into the server rack 701, where the single control system 202 and sensing system 203 are responsible for all heat sources 210 within the server rack 701. While in yet further instances, the control system 202 and the sensing system 203 may be integrated in a distributed manner across each set of cooling system components 703, the infrastructure of the server rack 701, and/or the infrastructure of one or more servers 702.

Other example configurations for integrating the cooling system 200 into a datacenter are also possible. In this respect, at least the control system 201 and sensing system 203 may be integrated in various manners into the infrastructure of the datacenter.

As yet another example of the different forms and/or arrangements that the cooling system 200 may take, the optical system 204 and optical network 205 can take various forms and be arranged in various manners.

Figure 8A:
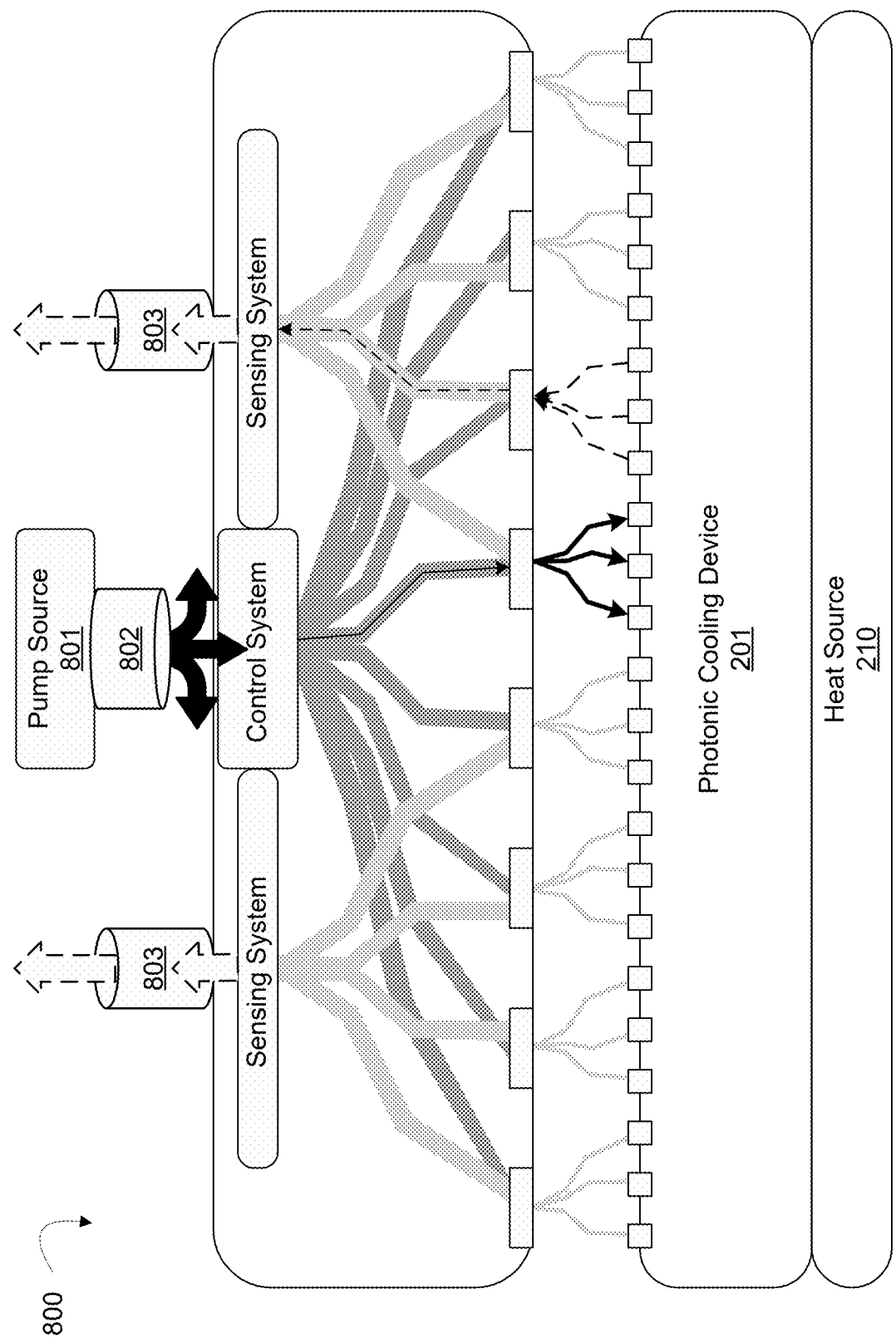
FIG. 8A is a simplified block diagram of an example configuration of a server-scale integration of the cooling system where the optical network comprises a fan-in/fan-out architecture.

For example, the optical network 205 may comprise a fan-in, fan-out photonic architecture, among other possibilities. FIG. 8A provides a simplified block diagram of an example configuration 800 of a server-scale integration of the cooling system 200 where the optical network 205 comprises a fan-in/fan-out architecture. In this example, at least a pump light source 801 of the optical system 204 is external to the server where the photonic cooling device 201 and heat source 210 are located. Pump light signals (illustrated by solid, black arrows) from the pump light source 801 are fed through an input optical channel 802 (e.g., a fiber bundle) that delivers pump light signals to the control system. In this example, the control system is configured to cause pump light signals to be directed at specific regions of the heat source 210 where hot spots exist or are predicted to form, such as by invoking a beam-steering device or the like that may be part of the optical system. Consistent with the discussion above, the pump light signals result in the photonic cooling device 201 outputting heat-carrying signals (illustrated by dashed, black arrows in FIG. 8A) that are fed away from the photonic cooling device 201 via one or more output optical channels 803. In other implementations, the pump light source of the optical system 204 may be implemented at different levels within a datacenter other than the depicted server-level, such as at an individual rack level or subset of racks level or a datacenter level, among other possibilities.

Figure 8B:
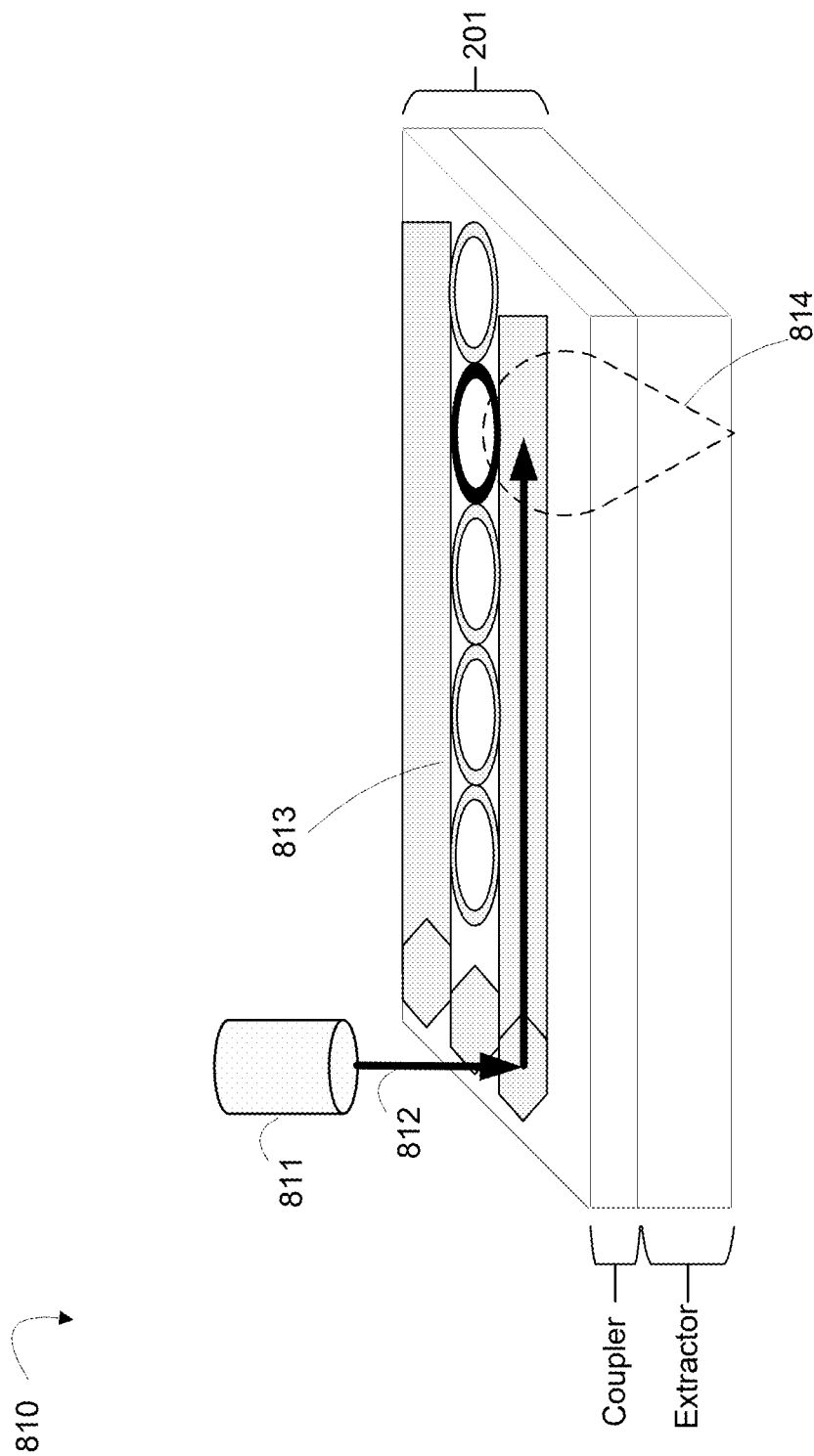
FIG. 8B is a simplified block diagram of an example photonic architecture that provides fine-grained localization of light signals within the photonic cooling device.

As another example, the optics of the cooling system 200 may be implemented with different levels of complexity and different capabilities for localizing light signals. FIG. 8B provides a simplified block diagram of an example photonic architecture 800 that provides fine-grained localization of light signals within the photonic cooling device 201 (and thus, within the heat source 210). As shown, the photonic architecture 810 includes an input optical channel 811 (e.g., one or more fibers) that directs light signals 812 (e.g., pump light signals) at a waveguide network 813 (e.g., an electrically-gated waveguide resonator network) that is designed to enable granular concentration of the light signals 812 at a particular region 814 of the photonic cooling device 201 via the endpoints of the waveguide network 813. In this example, the waveguide network 813 may be integrated into the photonic cooling device 201 that in turn may be integrated into the heat source 210. In some implementations of this example, a near-field coupling scheme may be utilized and back-reflector layer of the photonic cooling device 201 may be omitted.

FIG. 8C provides a simplified block diagram of an example photonic architecture 820 that provides mid-grained localization of light signals within the photonic cooling device 201 (and thus, within the heat source 210). As shown, the photonic architecture 820 includes a set of input optical channels 821 (e.g., a set of fibers) that directs light signals 822 (e.g., each of different wavelengths as indicated by the solid, dashed, and dot-dashed arrows) at a meta-lens network 823 (e.g., an angle-tunable meta-lens network) that is designed to enable focusing of the light signals 822 within defined angular and spatial resolutions to thereby target a particular region or regions 824 of the photonic cooling device 201 (e.g., the respective region 824 targeted by the light signal 822 of a given wavelength is identified by the solid, dashed, or dot-dashed lines).

Although not depicted, another example photonic architecture may comprise an input optical channel (e.g., a millimeter-scale fiber) in close proximity to the photonic cooling device 201 that provides broad-area localization of light signals within the photonic cooling device 201 (and thus, within the heat source 210). This architecture may utilize a collimated light signal to achieve bulk cooling of the heat source 210. Such an architecture is simpler than the architectures shown in FIGS. 8B and 8C and highly scalable from a manufacturing standpoint.

Figure 9A:
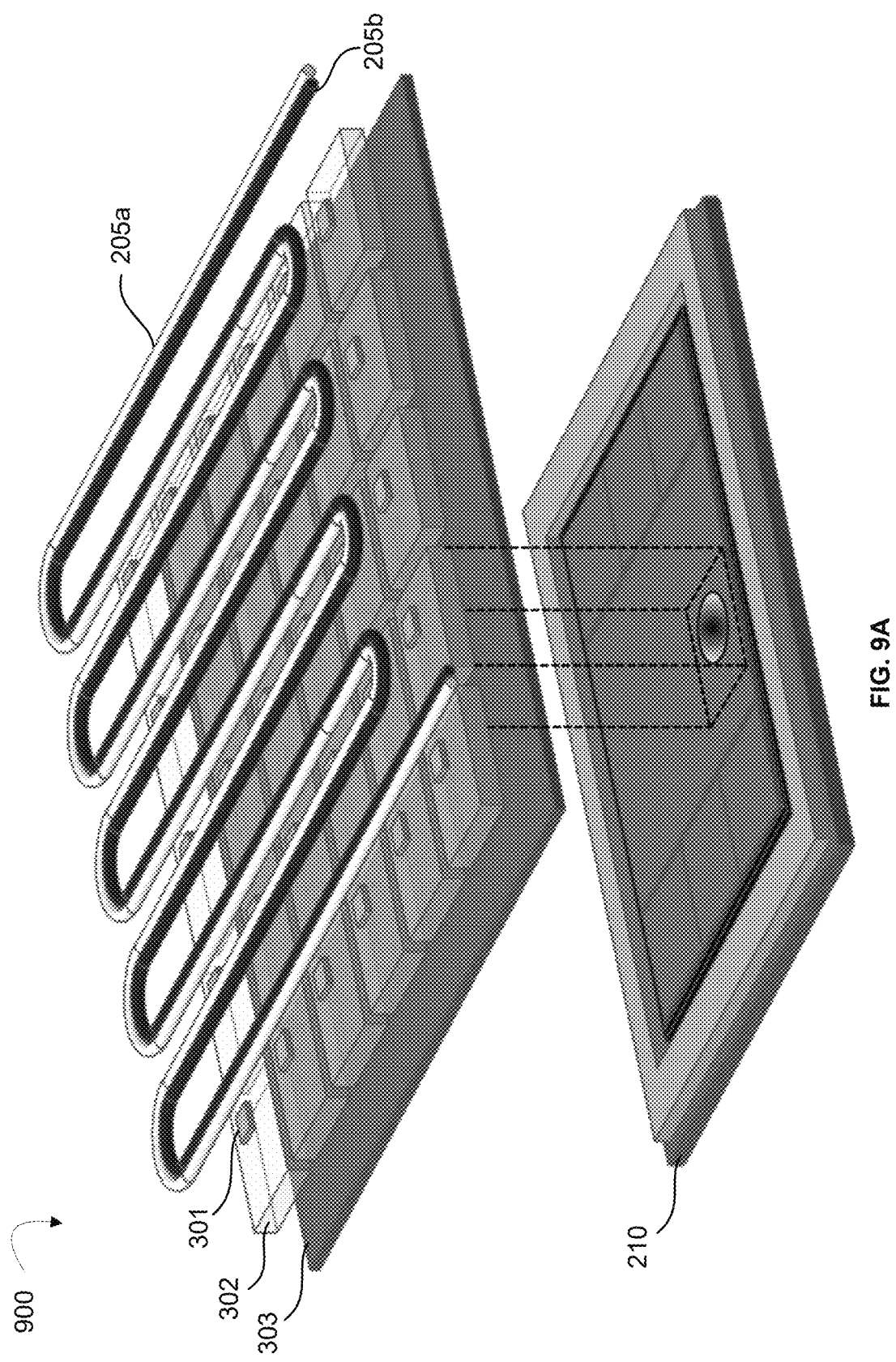
FIG. 9A provides an exploded, isometric view of an example implementation of aspects of a cooling system in accordance with the present disclosure.
Figure 9C:
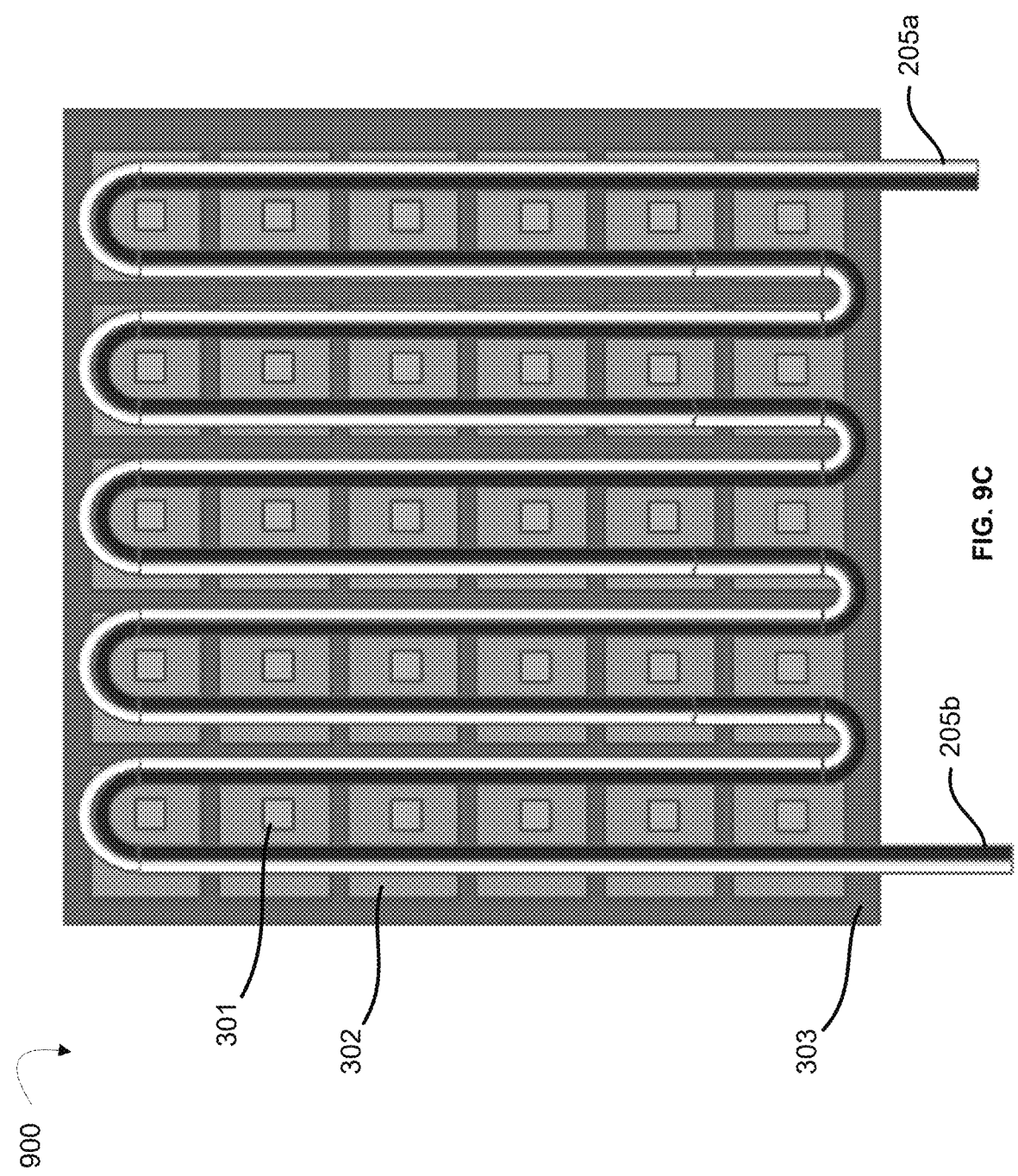
FIG. 9C provides a top-down view of the example implementation of FIG. 9A.

FIGS. 9A, 9B, and 9C depict one example implementation 900 of aspects of the cooling system 200 of FIG. 2. In particular, FIG. 9A provides an exploded, isometric view of the example implementation 900, FIG. 9B provides an exploded, side view of the example implementation 900, and FIG. 9C provides a top-down view of the example implementation 900.

As shown in FIGS. 9A-9C, the input and output optical channels 205a, 205b of the optical network 205 are illustrated as being implemented as two optical waveguides. As also shown, the extractor layer 302 is illustrated as being implemented as an array of extractor tiles, where each extractor tile has a corresponding portion of the coupler layer 301.

Figure 9D:
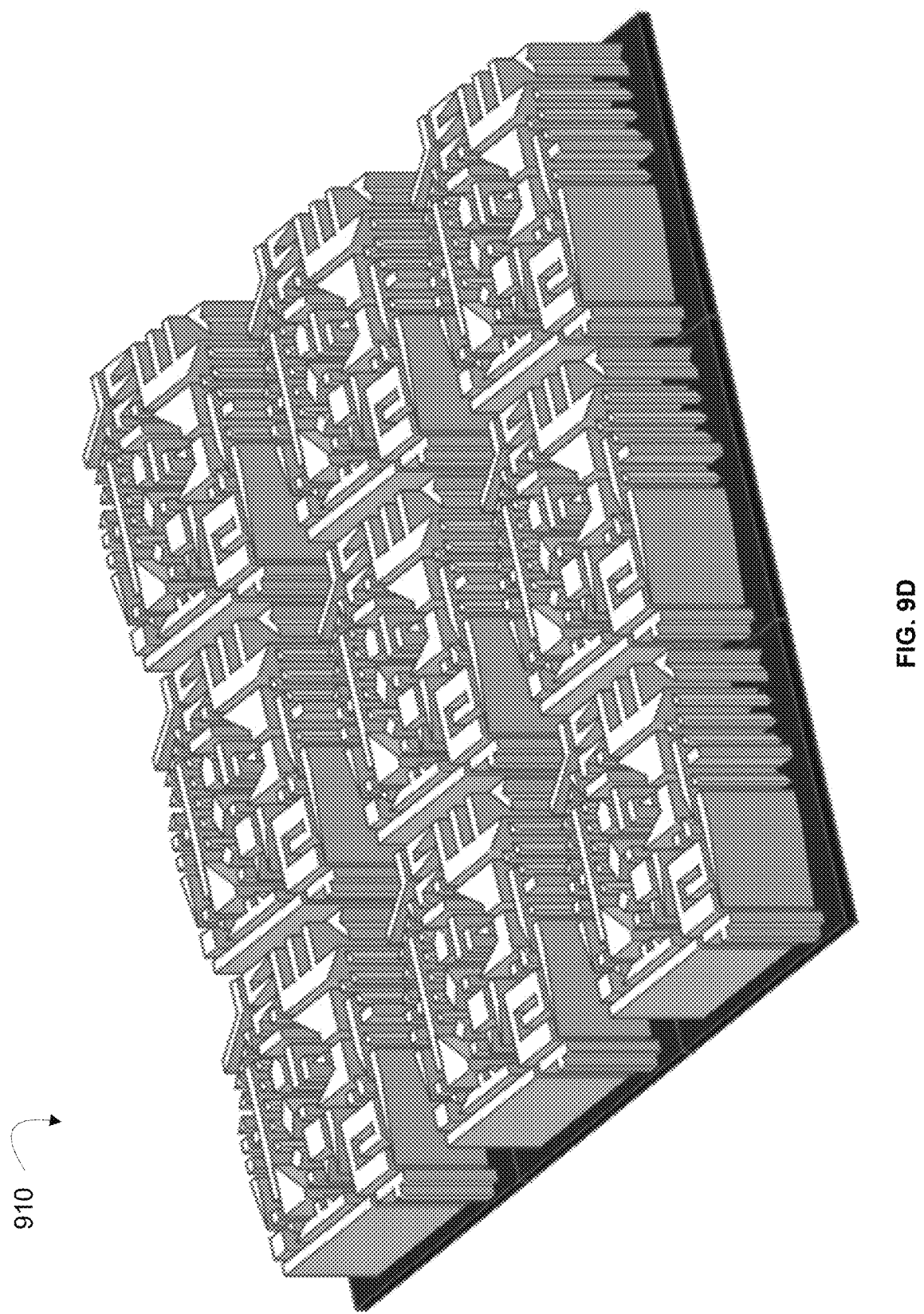
FIG. 9D provides an isometric view of an example implementation of an array of coupler tiles.
Figure 9E:
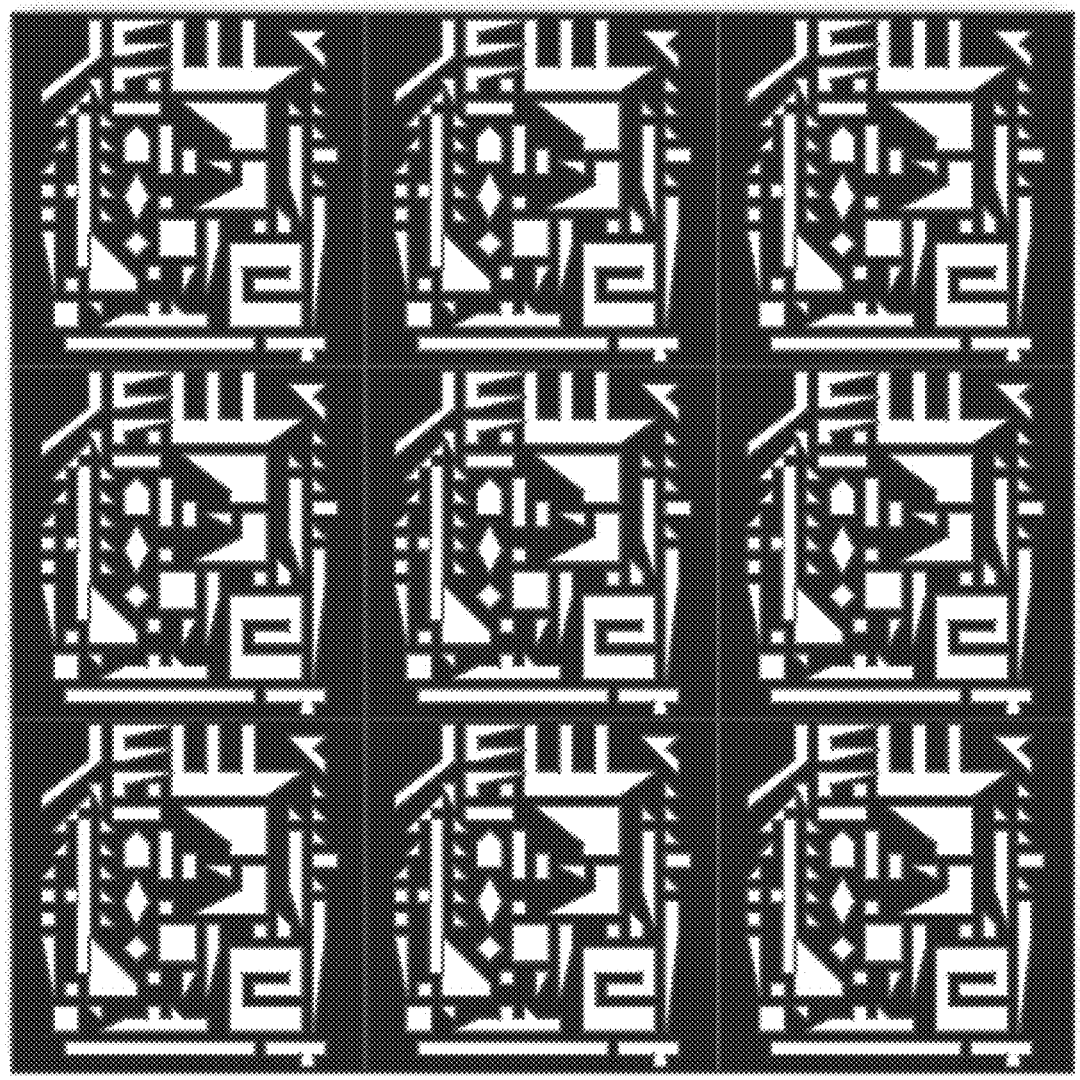
FIG. 9E provides a top-down view of the example array of coupler tiles of FIG. 9D.

More specifically, although FIGS. 9A-9C only depict a single coupler tile, each extractor tile in the example implementation 900 comprises an array of coupler tiles that covers the given extractor tile's surface area. In this regard, FIGS. 9D and 9E depict one example implementation of an array of coupler tiles 910 that corresponds to a given extractor tile. In particular, FIG. 9D provides an isometric view of the example array of coupler tiles 910, and FIG. 9E provides a top-down view of the example array of coupler tiles 910.

Figure 9F:
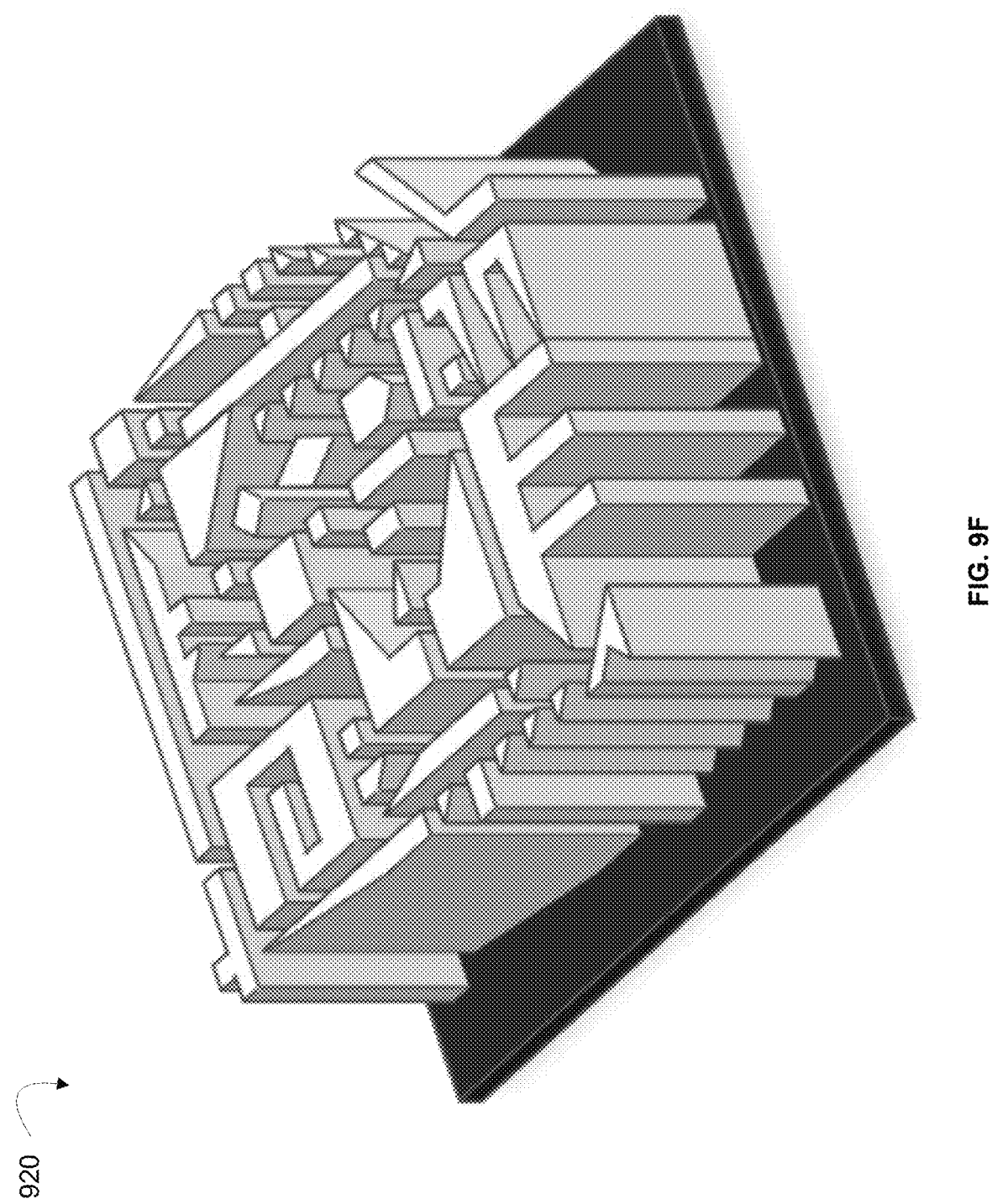
FIG. 9F provides an isometric view of an example individual coupler tile.
Figure 9G:
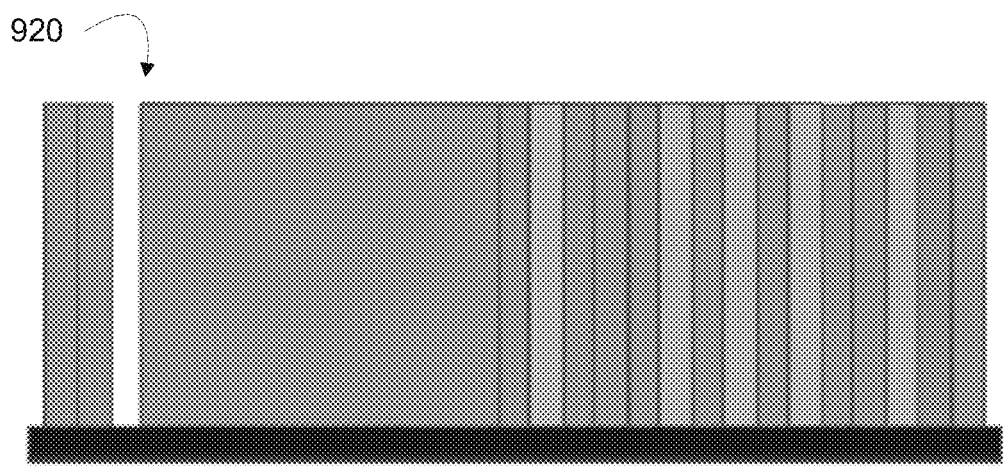
FIG. 9G provides a side view of the example individual coupler tile of FIG. 9F.
Figure 9H:
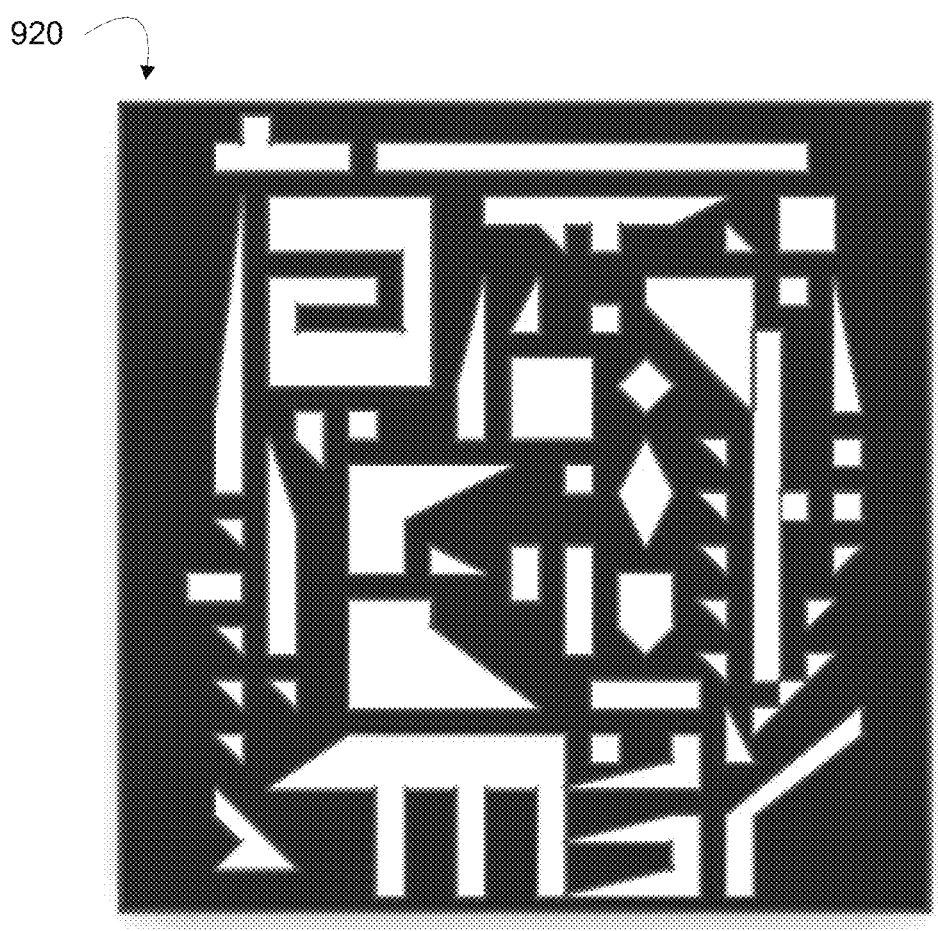
FIG. 9H provides a top-down view of the example individual coupler tile of FIG. 9F.

In turn, FIGS. 9F, 9G, and 9H focus on and depict an example individual coupler tile 920 of the example array of coupler tiles 910. In particular, FIG. 9F provides an isometric view of the example coupler tile 920 and shows example features of the coupler layer, FIG. 9G provides a side view of the example coupler tile 920, and FIG. 9H provides a top-down view of the example coupler tile 920.

Returning to FIG. 9A, the figure includes an example illustration of how the input optical waveguide and a given extractor tile and corresponding array of coupler tiles can be utilized to target a particular region of the heat source 210 where a hotspot has already formed or is predicted to form in the future.

In example implementations, one or more of the structures and/or functionalities of the cooling system 200 may be modified as compared to the above discussion to be implemented in a different manner.

For example, in some implementations, the cooling system 200 may rely on "passive" sensing that does not require the use of idler light to identify the location of a hot spot. In this respect, the sensor layer of the photonic cooling device 201 may comprise a phase-change material designed such that it exhibits one or more observable physical qualities that change strongly after the material has reached a critical temperature threshold. Accordingly, a hot spot in the heat source 210 in proximity to the sensor layer would cause the corresponding area in the sensor layer above the hot spot to exhibit the strong change in the observable physical quality (e.g., the phase-change material "opens up"). In turn, pump light would be directed at the photonic cooling device 201 in a manner that targets the hot spot until the hot spot has been cooled below the critical temperature threshold (e.g., the phase-change material "closes").

As another example of a modification to one or more of the structures and/or functionalities of the cooling system 200, the cooling system 200 may be designed to utilize electrical pumping instead of optical pumping to trigger emission of light signals within the photonic cooling device 201, thereby cooling the heat source 210.

In this respect, the extractor layer of the photonic cooling device 201 may be designed to exhibit electroluminescence, which may be triggered based on electrical actuation or biasing. In practice, the extractor layer may be designed to be triggered based on different forms of electrical biasing, such as thermo-electrically driven biasing or thermophotovoltaic driven biasing, among other possibilities.

To these ends, the physical structure of the electroluminescent extractor layer may take various forms and have various configurations. In some cases, the electroluminescent extractor layer may comprise one or more diodes (e.g., one or more light emitting diodes (LEDs) and/or photodiodes), which may be designed to exhibit a charge avalanche phenomenon. Further, the electroluminescent extractor layer may comprise an emitter array capable of electroluminescence, such as an array of diodes (e.g., array of LEDs), a quantum dot embedded matrix, or a continuous matrix of electroluminescent coating, among other possibilities.

In turn, the control system 202 may be configured to define a pump plan based on electroluminescence to achieve desired cooling at the heat source 210. In this respect, such a pump plan may include one or more parameters that each relates to a respective characteristic of an electrical pump signal that is to be applied to the photonic cooling device 201, such as (i) a pump bias voltage, (ii) a pump current level, and (iii) one or more pump temporal-modulation properties that indicate how an electrical signal changes over time, among other example electrical pump parameters.

To execute a defined electroluminescence pump plan, the cooling system 200 may include an electrical pump system that includes an electrical power source and electrical connectivity (e.g., wiring, circuitry, leads, and the like) that connects the electrical power source to the photonic cooling device 201 and specifically, that connects the electrical power source to the electroluminescent extractor layer of the photonic cooling device 201.

In general, the electrical pump system executes an electroluminescence pump plan received from the control system 202 by adjusting one or more operating conditions of the electrical power source in accordance with the electrical pump parameters of the electroluminescence pump plan, which results in one or more signals being directed at the photonic cooling device 201 to trigger electroluminescence. In some cases, the pump light source of the optical system 204 may additionally or alternatively be utilized to generate the necessary triggering electrical phenomenon through photovoltaics.

In one particular example implementation, the electroluminescent extractor layer may take the form of an emitter array comprising at least one array element for each component of the heat source 210 that may develop a hot spot (e.g., for each functional unit within the active layer of the heat source 210). The emitter array may be separate from or integrated into the heat source 210 and located adjacent to the components of the heat source 210 that may develop a hot spot (e.g., above the functional units in the active layer). The electrical connectivity for the emitter array may mirror the conductive branching structure of the heat source 210 (e.g., the TSVs that provide power to the functional units). Such electrical connectivity and emitter array provides a straightforward masking architecture that matches at least one emitter array element to each component of the heat source 210 (e.g., functional unit) that may develop a hot spot, where each such at least one emitter array element can have targeted electrical pump signals delivered to it to trigger focused electroluminescence to cool the associated heat-source component (e.g., functional unit). In some cases, such an implementation may further include a network of sensors comprising at least one sensor for each component of the heat source 210 that may develop a hot spot and each at least one sensor may be associated with the mirrored conductive branching structure of the heat source 210.

As yet another example of a modification to one or more of the structures and/or functionalities of the cooling system 200, the sensing system 203 may additionally or alternatively be configured to receive electrical and/or thermal signals that in turn may facilitate a determination (e.g., by the sensing system 203 and/or the control system 202) about one or more characteristics of the heat source 210, such as the spatial distribution and/or temporal dynamics of the temperature, power, and/or workload of the heat source 210. In this respect, these electrical and/or thermal signals may or may not be responsive to a signal targeted at the heat source 210 by the cooling system 200.

In practice, the electrical signals that the sensing system 203 may receive can take various forms. For example, some components of the heat source 210 (e.g., functional units) may generate radio frequency emissions while operating that the sensing system 203 may be configured to sense. As another example, at least some heat sources (e.g., microprocessors) contain embedded temperature sensors that attempt to monitor temperature and throttle the heat source's clock speed when the monitored temperature exceeds a specified operating temperature. In some cases, the sensing system 203 may be configured to receive electrical signals from the embedded temperature sensors reflecting the monitored temperature. As yet another example, the sensing system 203 may be configured to receive electrical signals corresponding to a heat source's hardware instruction stream (e.g., from the microprocessor's workload instruction buffer) that provides information about the heat source's present and/or scheduled workload (e.g., information about which functional units are or will be active and when). The electrical signals that the sensing system 203 may receive can take various other forms as well.

Likewise, in practice, the thermal signals that the sensing system 203 may receive can take various forms, such as an absolute temperature signal, a temperature gradient signal, or an infrared emission.

To these ends, the sensing system 203 may include one or more electrical sensors (e.g., a radio frequency emission sensor), one or more electrical communication interfaces, and/or one or more thermal sensors (e.g., a resistive temperature sensor, a thermoelectric sensor, an FLIR camera, etc.), among other possibilities.

In turn, the sensing system 203 can determine one or more characteristics of the heat source 210 based on the electrical and/or thermal signals that the sensing system 203 receives independent of any signal targeted at the heat source 210 by the cooling system 200 to gather information about the heat source 210 (e.g., independent of any idler signal).

While the cooling technology of the present disclosure has been described above in the context of cooling HPC hardware, it should be understood that the cooling technology can find applicability in other contexts with other heat sources as well. In this respect, hot spot formation limits performance of many power electronics and energy conversion systems, examples of which are described below.

As a first example, the diodes that generate radio-frequency pulses for use in radar systems are limited in range, resolution, and sensitivity by heat. The size of these systems is also influenced by heat. Removing or managing hot spot formation in these systems, such as at the diodes, would allow certain of their components (e.g., antennas and transmitters) to be miniaturized and/or allow them to operate at higher frequencies and greater bandwidth. This in turn would enhance portability, resolution, and range of radar systems.

As a second example, the amplifier fibers used in fiber laser systems can be negatively impacted by heat. Removing or managing hot spot formation in these systems can lead to higher power thresholds for such systems (e.g., used in military contexts, industrial cutting and welding contexts, etc.) and/or can result in thermal signature suppression or camouflage.

As a third example, qubits or substrates of quantum-computing or superconducting systems can be negatively impacted by heat. Removing or managing hot spot formation in these systems can help maintain a required working state for energy and information transport. Relatedly, other cooling applications in SoC and server components might include inter-layer cooling in 3D stacked dies.

As a fourth example, in space systems (e.g., satellites and space vehicles), the cooling technology of the present disclosure could be utilized to enable new technologies to be deployed in sealed enclosures and environments with no other means of heat dissipation available (such as vacuum). Further, heat shields for reentry systems and supersonic vehicles experience highly-nonuniform heating. Utilizing the cooling technology of the present disclosure to maintain lower surface temperatures and/or control thermally-induced structural stresses in such systems can lead to enhanced longevity and reusability of heat tiles and the like used on such systems.

As a fifth example, pixel arrays used in imaging systems (e.g., infrared sensor systems, spectrometers, and night-vision systems) are limited in sensitivity by heat. Removing or managing hot spot formation in these systems can enhance their sensitivity and overall performance.

The cooling technology of the present disclosure can find applicability in other contexts as well.

Figure 10:
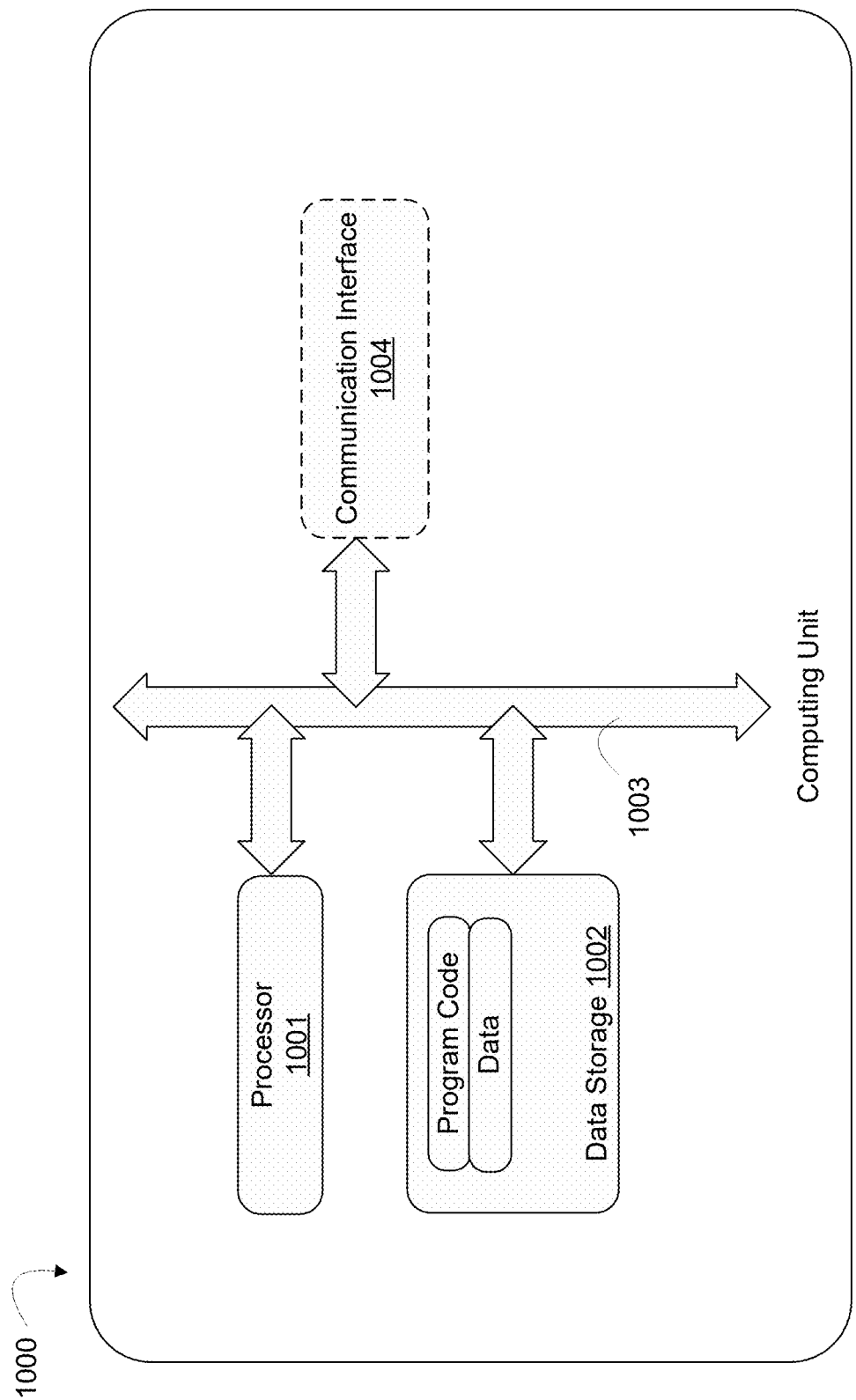
FIG. 10 is a simplified block diagram of example components of a computing unit.

Turning now to FIG. 10, a simplified block diagram is provided to illustrate some components that may be included in an example computing unit 1000 that may serve as one or more computing units of the disclosed cooling system (e.g., one or more computing units of the control system 202, the sensing system 203, and/or the optical system 204).

Structurally speaking, the computing unit 1000 may generally comprise (i) at least one processor 1001, (ii) data storage 1002, and (iii) program code stored in the data storage 1002 that is executable by the at least one processor 1001 to cause the computing unit 1000 to perform computer-based functions disclosed herein, each of which may be communicatively linked by a communication link 1003 that may take the form of a system bus, a communication network such as a public, private, or hybrid cloud, or some other connection mechanism. In some implementations, the computing unit 1000 may also include at least one communication interface 1004 that facilitates communication between the computing unit 1000 and (i) other systems (and/or sub-components) of the cooling system 200, (ii) other devices that are external to the cooling system 200, and/or (iii) an input/output (I/O) interface of the cooling system 200. Each of these components of the computing unit 1000 may take various forms.

For instance, the at least one processor 1001 may comprise one or more processor components, such as one or more microcontrollers, one or more central processing units (CPUs), application-specific integrated circuits (ASICs), digital signal processor (DSPs), and/or programmable logic devices such as field programmable gate arrays (FPGAs), among other possible types of processing components.

In turn, the data storage 1002 may comprise one or more non-transitory computer-readable storage mediums, examples of which may include volatile storage mediums such as random-access memory, registers, cache, etc. and non-volatile storage mediums such as read-only memory, a hard-disk drive, a solid-state drive, flash memory, an optical-storage device, etc.

As shown in FIG. 10, the data storage 1002 may be capable of storing both (i) program instructions that are executable by the at least one processor 1001 such that the computing unit 1000 is configured to perform any of the various computer-based functions disclosed herein and (ii) data that may be received, derived, or otherwise stored by the computing unit 1000, such as data models, maps of photonic cooling devices, maps of heat sources, and heat, power-density, and/or workload distribution maps, among other examples of data.

The optional at least one communication interface 1004 may comprise one or more interfaces that facilitate communication between the computing unit 1000 and other systems or devices (e.g., other computing unit(s) 1000), where each such interface may be wired and/or wireless and may communicate according to any of various communication protocols. As examples, the at least one communication interface 1004 may take include an Ethernet interface, a serial bus interface (e.g., Firewire, USB 3.0, etc.), a chipset and antenna adapted to facilitate any of various types of wireless communication (e.g., Wi-Fi communication, cellular communication, Bluetooth® communication, etc.), and/or any other interface that provides for wireless or wired communication. Other configurations are possible as well.

Although not shown, the computing unit 1000 may additionally have an I/O interface that includes or provides connectivity to I/O components that facilitate user interaction with the computing unit 1000, such as a keyboard, a mouse, a trackpad, a display screen, a touch-sensitive interface, a stylus, a virtual-reality headset, and/or one or more speaker components, among other possibilities.

It should be understood that the computing unit 1000 is one example of a computing unit that may be used with the cooling systems disclosed herein. Numerous other arrangements are possible and contemplated herein. For instance, in other examples, the computing unit 900 may include additional components not pictured and/or more or less of the pictured components.

CONCLUSION

This disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners without departing from the true scope and spirit of the present invention, which will be defined by the claims.

Further, to the extent that examples described herein involve operations performed or initiated by actors, such as "humans," "users," or other entities, this is for purposes of example and explanation only. The claims should not be construed as requiring action by such actors unless explicitly recited in the claim language.

We claim:

1. A photonic cooling device for a heat source, the photonic cooling device comprising:
  a coupler layer and an extractor layer;
  wherein the coupler layer is optically coupled to the extractor layer and is configured to (i) guide a first light signal into the extractor layer, (ii) guide a second light signal into the extractor layer, wherein the second light signal is defined based on at least one heat-source characteristic to target a given region of the extractor layer that corresponds to a hot spot region of the heat source, and (iii) guide a third light signal away from the extractor layer, thereby cooling the heat source; and
  wherein the extractor layer (i) comprises a luminescent medium, (ii) is optically coupled to the coupler layer, and (iii) is configured to (a) guide a fourth light signal to the coupler layer in response to the first light signal, wherein the fourth light signal is indicative of the at least one heat-source characteristic, (b) up-convert the second light signal via a luminescence process at the given region of the extractor layer, and (c) based on the up-conversion, output the third light signal to the coupler layer, thereby extracting heat from the hot spot region of the heat source.

2. The photonic cooling device of claim 1, further comprising a sensor layer comprising a phase-change medium;
  wherein the extractor layer is configured to guide the first light signal to the sensor layer; and
  wherein the sensor layer physically couples to the heat source and is configured to output the fourth light signal to the extractor layer in response to receiving the first light signal, wherein the at least one heat-source characteristic is one of a spatial characteristic of the heat source or a temporal characteristic of the heat source.

3. The photonic cooling device of claim 2, further comprising a reflector layer, wherein the reflector layer is located between the extractor layer and the sensor layer and is configured to reduce light signals from reaching the heat source.

4. The photonic cooling device of claim 1, wherein the coupler layer overlaps with the extractor layer.

5. The photonic cooling device of claim 1, wherein the coupler layer comprises one or more metasurface geometries.

6. The photonic cooling device of claim 1, wherein the luminescent medium of the extractor layer comprises a fluorescent medium, and wherein the extractor layer being configured to up-convert the second light signal via the luminescence process comprises the extractor layer being configured to up-convert the second light signal via a fluorescence process.

7. A method performed by a photonic cooling device to cool a heat source, the method comprising:
  receiving, at a coupler layer of the photonic cooling device, a first light signal that causes a sensor layer of the photonic cooling device that is physically proximate to the heat source to output a second light signal that is indicative of at least one heat-source characteristic;

outputting, at the coupler layer of the photonic cooling device, the second light signal;

receiving, at the coupler layer of the photonic cooling device, a third light signal that is defined based on the at least one heat-source characteristic to target a given region of an extractor layer of the photonic cooling device that corresponds to a hot spot region of the heat source;

up-converting, at the extractor layer of the photonic cooling device, the third light signal via a luminescence process at the given region of the extractor layer; and outputting, at the coupler layer of the photonic cooling device, one or more up-converted light signals, thereby extracting heat from the hot spot region of the heat source.

8. The method of claim 7, wherein up-converting the third light signal via the luminescence process at the given region of the extractor layer comprises up-converting the third light signal via a fluorescence process at the given region of the extractor layer.

9. The method of claim 8, wherein the fluorescence process comprises an anti-Stokes fluorescence process.

10. The method of claim 7, wherein outputting the second light signal comprises the sensor layer of the photonic cooling device (i) altering an observable state of the first light signal due to a sensed temperature characteristic of the heat source and (ii) outputting an altered version of the first light signal to the coupler layer of the photonic cooling device.

11. A cooling system for a heat source, the cooling system comprising:
   a photonic cooling device that physically couples to the heat source and comprises a fluorescent medium;
   a control system; and
   a sensing system;
   wherein the sensing system is configured to sense an indication of at least one characteristic of the heat source based on a first light signal received at the photonic cooling device;
   wherein the control system is configured to: (i) based on the at least one characteristic of the heat source, identify at least one region of the heat source for cooling and (ii) based on the identification, cause a second light signal to be directed at the photonic cooling device; and
   wherein the photonic cooling device is configured to: (i) based on the received first light signal, output the indication of the at least one characteristic of the heat source, and (ii) based on the second light signal, output an up-converted light signal, thereby drawing heat away from the at least one region of the heat source.

12. The cooling system of claim 11, further comprising:
   an optical system comprising a first light source configured to direct the first light signal at the photonic cooling device and a second light source configured to direct the second light signal at the photonic cooling device; and
   an optical network comprising an input optical channel configured to guide the first and second light signals to the photonic cooling device and an output optical channel configured to guide the up-converted light signal away from the photonic cooling device.

13. The cooling system of claim 11, wherein the cooling system further comprises an optical system, and
   wherein the control system being configured to cause the second light signal to be directed at the photonic cooling device comprises the control system causing the optical system to direct the second light signal at the photonic cooling device in accordance with a pump plan defined by the control system.

14. The cooling system of claim 13, wherein the pump plan is a responsive pump plan, and wherein the at least one region of the heat source for cooling comprises a region of the heat source where a hot spot has developed.

15. The cooling system of claim 13, wherein the pump plan is a predictive pump plan, and wherein the at least one region of the heat source for cooling comprises a region of the heat source where a hot spot is predicted to develop in the future.

16. The cooling system of claim 13, wherein the pump plan comprises a plurality of parameters defined such that the optical system is enabled to direct the second light signal at a particular region of the photonic cooling device that corresponds to the identified at least one region of the heat source for cooling.

17. The cooling system of claim 11, wherein the at least one characteristic of the heat source comprises at least one of: a spatial characteristic of the heat source or a temporal characteristic of the heat source.

18. The cooling system of claim 17, wherein the spatial characteristic of the heat source comprises one of: a spatial distribution of temperature across the heat source at a given instant in time, a spatial distribution of power across the heat source at a given instant in time, or a spatial distribution of workload across the heat source at a given instant in time.

19. The cooling system of claim 17, wherein the temporal characteristic of the heat source comprises one of: temporal dynamics of temperature across the heat source over a given period of time, temporal dynamics of power across the heat source over a given period of time, or temporal dynamics of workload across the heat source over a given period of time.

20. The cooling system of claim 11, further comprising an energy recovery system that is configured to recover power from the up-converted light signal output by the photonic cooling device.

* * * * *